US012626667B2

(12) United States Patent
Zhou et al.

(10) Patent No.: US 12,626,667 B2
(45) Date of Patent: May 12, 2026

(54) DISPLAY PANEL, REPAIRING METHOD AND DISPLAY DEVICE

(71) Applicants: HEFEI BOE DISPLAY TECHNOLOGY CO., LTD., Hefei (CN); BOE TECHNOLOGY GROUP CO., LTD., Beijing (CN)

(72) Inventors: Maoxiu Zhou, Beijing (CN); Yanping Liao, Beijing (CN); Ke Dai, Beijing (CN); Haipeng Yang, Beijing (CN); Chunxu Zhang, Beijing (CN); Min Cheng, Beijing (CN); Xiaoting Jiang, Beijing (CN); Yue Yang, Beijing (CN)

(73) Assignees: HEFEI BOE DISPLAY TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 2 days.

(21) Appl. No.: 18/704,827

(22) PCT Filed: Mar. 29, 2023

(86) PCT No.: PCT/CN2023/084627
§ 371 (c)(1),
(2) Date: Apr. 25, 2024

(87) PCT Pub. No.: WO2024/197628
PCT Pub. Date: Oct. 3, 2024

(65) Prior Publication Data
US 2025/0259580 A1 Aug. 14, 2025

(51) Int. Cl.
| G09G 3/3266 | (2016.01) |
| G09G 3/20 | (2006.01) |
| H10D 86/40 | (2025.01) |

(52) U.S. Cl.
CPC ............. *G09G 3/3266* (2013.01); *G09G 3/20* (2013.01); *G09G 2300/0426* (2013.01);
(Continued)

(58) Field of Classification Search
CPC ............. G09G 3/20; G09G 2300/0426; G09G 2310/0286; G09G 2330/08; G09G 3/3266; H10D 86/441
See application file for complete search history.

(56) References Cited

U.S. PATENT DOCUMENTS

| 2009/0296011 A1 | 12/2009 | Yoon | |
| 2025/0029543 A1* | 1/2025 | Kwak | ...................... G09G 3/32 |

FOREIGN PATENT DOCUMENTS

| CN | 202736457 U | 2/2013 |
| CN | 106297639 A | 1/2017 |
(Continued)

*Primary Examiner* — Julie Anne Watko
(74) *Attorney, Agent, or Firm* — BROOKS KUSHMAN P.C.

(57) ABSTRACT

A display substrate, a repair method and a display device are provided. The display substrate includes a base substrate and a driving module arranged on the base substrate; the driving module includes a control switch and a driving circuit; an input terminal of an nth stage of driving circuit included in the driving module is electrically connected to an output terminal of an (n–m)th stage of driving circuit included in the driving module through an input cascade line; n and m are positive integers, and m is less than n; the driving module further includes at least one connection line, the connection line extends along a first direction. The repairing method includes: when previous c stages of driving circuits included in the driving module in the display substrate are cut off, controlling, by the control switch, to connect the connection line and the input cascade line.

20 Claims, 50 Drawing Sheets

(52) U.S. Cl.
    CPC . *G09G 2310/0286* (2013.01); *G09G 2330/08*
                (2013.01); *H10D 86/441* (2025.01)

(56)                        References Cited

FOREIGN PATENT DOCUMENTS

| CN | 106448605 | A | 2/2017 |
| CN | 107991816 | A | 5/2018 |
| CN | 109064961 | A | 12/2018 |
| CN | 115561942 | A | 1/2023 |

* cited by examiner

STV CLK2 CLK5 CLK7 CLK9 CLK11 VDDO

CLK1 CLK3 CLK4 CLK6 CLK8 CLK10 CLK12 VDDE

DL

A21

A22

DISPLAY PANEL, REPAIRING METHOD AND DISPLAY DEVICE

CROSS-REFERENCE TO RELATED APPLICATION

This application is the U.S. national phase of PCT Application No. PCT/CN2023/084627 filed on Mar. 29, 2023, which is incorporated herein by reference in its entirety.

TECHNICAL FIELD

The present disclosure relates to the field of display technology, in particular to a display panel, a repairing method and a display device.

BACKGROUND

In the related art, when a large-sized display substrate needs to be cut to form a small-sized display substrate, the start voltage is output by the timing controller (TCON) and then output to the level shifter. The start voltage line is used to provide an start signal to the gate driving circuit of the display panel. TCON is set in the driving integrated circuit (IC). The start voltage line extends from the side of the driving IC to the side away from the driving IC, then if horizontal cutting is performed (the horizontal direction is the extension direction of the gate lines), the start voltage line will be cut off, so that the display substrate obtained after cutting cannot work properly.

SUMMARY

In one aspect, the present disclosure provides in some embodiments a display substrate, including a base substrate and a driving module arranged on the base substrate; wherein the driving module includes a control switch and N cascaded driving circuits; the driving circuit includes an input terminal; N is a positive integer; input terminals of previous a stages of driving circuits included in the driving module is electrically connected to a start voltage line; a is a positive integer; an input terminal of an nth stage of driving circuit included in the driving module is electrically connected to an output terminal of an (n–m)th stage of driving circuit included in the driving module through an input cascade line; n and m are positive integers, and m is less than n; the driving module further includes at least one connection line, the connection line extends along a first direction; there is an overlapping area between an orthographic projection of the connection line on the base substrate and an orthographic projection of the start voltage line on the base substrate; and/or, there is an overlapping area between the orthographic projection of the connection line on the base substrate and an orthographic projection of the input cascade line on the base substrate; the control switch is electrically connected to the connection line.

Optionally, at least part of the connection line and the start voltage line are located on different layers, and at least part of the connection line and the input cascade line are located on different layers.

Optionally, the connection line is provided between two adjacent driving circuits; or the connection line penetrates at least part of the driving circuit.

Optionally, the driving module includes a plurality of clock signal lines, a plurality of stages of driving circuits and a line collection portion; the driving circuit includes a first driving circuit portion and a second driving circuit portion;

the plurality of clock signal lines, the first driving circuit portion, the line collection portion and the second driving circuit portion are arranged in sequence along a direction close to a display area; the input cascade line is provided in the line collection portion; the driving circuit includes the first driving circuit portion and the second driving circuit portion.

Optionally, the control switch includes a control line and a control module; the control module is electrically connected to the control line, the start voltage line, the connection line and the line collection portion respectively, and is configured to control to connect or disconnect the connection line and the line collection portion under the control of a control signal provided by the control line; there is an overlapping area between the orthographic projection of the connection line on the base substrate and the orthographic projection of the line collection portion on the base substrate.

Optionally, the control module is electrically connected to the input cascade line in the line collection portion; the control module includes at least one control sub-module; a control sub-module corresponding to the nth stage of driving circuit included in the driving module is electrically connected to an input terminal of the (n+j)th stage of driving circuit through the input cascade line; j is a positive integer.

Optionally, the control line includes a first control line and a second control line, and the control sub-module includes a first control circuit and a second control circuit; the first control circuit is electrically connected to the first control line, the start voltage line and the connection line respectively, and is configured to control to connect or disconnect the start voltage line and the connection line under the control of a first control signal provided by the first control line; the second control circuit is electrically connected to the second control line, the connection line and the input cascade line respectively, and is configured to control to connect or disconnect the connection line and the input cascade line under the control of a second control signal provided by the second control line.

Optionally, the driving module includes a plurality of connection lines; the connection lines are provided between adjacent two stage of driving circuits; a first terminal of the connection line is electrically connected to the first control circuit, and a second terminal of the connection line is electrically connected to the second control circuit; the first terminal and the second terminal are opposite terminals.

Optionally, the first control circuit includes a first control transistor, and the second control circuit includes a second control transistor; a gate electrode of the first control transistor is electrically connected to a first electrode of the first control transistor, the gate electrode of the first control transistor is electrically connected to the first control line, and the first electrode of the first control transistor is electrically connected to the first terminal of the connection line, and a second electrode of the first control transistor is electrically connected to the start voltage line; a gate electrode of the second control transistor is electrically connected to the second control line, a first electrode of the second control transistor is electrically connected to the second terminal of the connection line, and a second electrode of the second control transistor is electrically connected to the input cascade line.

Optionally, the first control circuit includes a first control transistor, and the second control circuit includes a second control transistor; a gate electrode of the first control transistor is electrically connected to the first control line, a first electrode of the first control transistor is electrically connected to the first terminal of the connection line, and a second electrode of the first control transistor is electrically connected to the start voltage line; a gate electrode of the second control transistor is electrically connected to the second control line, a first electrode of the second control transistor is electrically connected to the second terminal of the connection line, and a second electrode of the second control transistor is electrically connected to the input cascade line.

Optionally, the control line includes a second control line, and the control sub-module includes a second control circuit; the connection line is electrically connected to the start voltage line; the second control circuit is electrically connected to the second control line, the connection line and the input cascade line respectively, and is configured to control to connect or disconnect the connection line and the input cascade line under the control of the second control signal provided by the second control line.

Optionally, the driving module includes a plurality of connection lines; the plurality of connection lines are arranged between adjacent two stage of driving circuits; a first terminal of the connection line is electrically connected to the start voltage line, and a second terminal of the connection line is electrically connected to the second control circuit; the first terminal and the second terminal are opposite terminals.

Optionally, the second control circuit includes a second control transistor; a gate electrode of the second control transistor is electrically connected to the second control line, a first electrode of the second control transistor is electrically connected to the second terminal of the connection line, and a second electrode of the second control transistor is electrically connected to the input cascade line.

Optionally, the control line includes a first control line, and the control sub-module includes a first control circuit; the first control circuit is electrically connected to the first control line, the start voltage line and the connection line respectively, and is configured to control to connect or disconnect the connection line and the start voltage line under the control of the first control signal provided by the first control line; the connection line is electrically connected to the input cascade line.

Optionally, the driving module includes a plurality of connection lines; the plurality of connection lines are arranged between adjacent two stage of driving circuits; the first terminal of the connection line is electrically connected to the first control circuit, and the second terminal of the connection line is electrically connected to the input cascade line; the first terminal and the second terminal are opposite terminals.

Optionally, the first control circuit includes a first control transistor; a gate electrode of the first control transistor is electrically connected to the first control line, a first electrode of the first control transistor is electrically connected to the start voltage line, and a second electrode of the first control transistor is electrically connected to the first terminal of the connection line.

Optionally, the connection line included in the driving module penetrates the clock signal line included in the driving circuit, the first driving circuit portion and the line collection portion in a direction from away from the display area to close to the display area.

Optionally, the display substrate includes a first metal layer and an electrode layer sequentially arranged in a direction away from the base substrate; the connection line includes a first line portion formed on the electrode layer and a second line portion formed on the first metal layer; the first line portion and the second line portion are electrically connected; at least part of the first line portion is provided in a clock signal line area, the first driving circuit portion and the line collection portion; the clock signal line area is an area where the plurality of clock signal lines are provided; at least part of the second line portion is provided on the line collection portion.

Optionally, the driving circuit includes an input circuit; the input circuit includes a control terminal, a first terminal and a second terminal; the control terminal of the input circuit is electrically connected to the input terminal, and the second terminal of the input circuit is electrically connected to a pull-up node; the input circuit is configured to control a potential of the pull-up node under the control of an input signal provided by the input terminal.

Optionally, the input circuit includes a first transistor; a gate electrode of the first transistor is electrically connected to the first input terminal, a first electrode of the first transistor is electrically connected to the second input terminal, and a second electrode of the first transistor is electrically connected to the pull-up node; the first input terminal and the second input terminal are electrically connected or not electrically connected.

Optionally, the gate electrode of the first transistor is formed on the second metal layer, and the first electrode of the first transistor is formed on the first metal layer; the gate electrode of the first transistor is electrically connected to the first connection line portion formed on the second metal layer; the first electrode of the first transistor is electrically connected to the second connection line portion formed in the second metal layer through a via hole; the connection line includes a third connection line portion formed on the electrode layer and a fourth connection line portion formed on the first metal layer; the third connection line portion and the fourth connection line portion are electrically connected; there is an overlapping area between an orthographic projection of the third connection line portion on the base substrate and an orthographic projection of the first connection line portion on the base substrate; there is an overlapping area between an orthographic projection of the fourth connection line portion on the base substrate and an orthographic projection of the second connection line portion on the base substrate.

Optionally, the display substrate further includes a fifth connection line portion and a sixth connection line portion; the fifth connection line portion is formed on the electrode layer, and the fifth connection line portion is connected to the third connection line portion; the sixth connection line portion is formed on the first metal layer, and the sixth connection line portion is connected to the fourth connection line portion; the fifth connection line portion and the sixth connection line portion are electrically connected.

Optionally, the driving circuit includes a first driving circuit portion; the first driving circuit portion includes an input circuit, a pull-up node control circuit, a first pull-down node control circuit, a second pull-down node control circuit and a reset circuit; the input circuit is configured to control a potential of the pull-up node under the control of an input signal provided by the input terminal; the pull-up node control circuit is configured to control the potential of the pull-up node; the first pull-down node control circuit is configured to control a potential of the first pull-down node; the second pull-down node control circuit is configured to control a potential of the second pull-down node; the reset circuit is configured to reset the driving signal provided by the driving signal output terminal of the current stage under the control of the potential of the first pull-down node and the potential of the second pull-down node.

In a second aspect, an embodiment of the present disclosure provides a display substrate, including a base substrate and a driving module arranged on the base substrate; wherein the driving module includes N cascaded driving circuits; the driving circuit includes an input terminal; N is a positive integer; input terminals of previous a stages of driving circuits included in the driving module are electrically connected to a start voltage line; a is a positive integer; an input terminal of an nth stage of driving circuit included in the driving module is electrically connected to an output terminal of the (n−m)th stage of driving circuit included in the driving module through an input cascade line; n and m are positive integers, and m is less than n; the driving module also includes at least one connection line, the connection line extends along a first direction; there is an overlapping area between an orthographic projection of the connection line on the base substrate and an orthographic projection of the start voltage line on the base substrate; there is an overlap area between the orthographic projection of the connection line on the base substrate and an orthographic projection of the input cascade line on the base substrate.

In a third aspect, an embodiment of the present disclosure provides a repairing method, applied to the display substrate and includes: when previous c stages of driving circuits included in the driving module in the display substrate are cut off, controlling, by the control switch, to connect the connection line and the input cascade line; the input cascade line being electrically connected to an input terminal of a (c+k)th stage of driving circuit; both c and k are positive integers.

Optionally, the control switch includes a control module and a control line; the control line includes a first control line and the second control line, the control module includes at least one control sub-module, the control sub-module includes a first control circuit and a second control circuit; the repairing method includes: when the first c stages of driving circuits included in the driving module in the display substrate are cut off, a connection line close to the (c+p)th stage of driving circuit being used to transmit the start voltage signal; disconnecting a first control line between a first control circuit corresponding to a (c+p)th stage of driving circuit from a first control circuit corresponding to a (c+p+1)th stage of driving circuit; disconnecting the second control line between the second control circuit corresponding to the (c+p)th stage of driving circuit from the second control circuit corresponding to the (c+p+1)th stage of driving circuit; p is a positive integer greater than or equal to 1.

Optionally, the control switch includes a control module and a control line; the control line includes a second control line, and the control module includes at least one control sub-module, the control sub-module includes a second control circuit; the repair method includes: when the first c stages of driving circuits included in the driving module in the display substrate are cut off, the connection line close to the (c+p)th stage of driving circuit being used to transmit the start voltage signal; disconnecting the second control line between the second control circuit corresponding to the (c+p)th stage of driving circuit and the second control circuit corresponding to the (c+p+1)th stage of driving circuit; p is a positive integer greater than or equal to 1.

Optionally, the control switch includes a control module and a control line; the control line includes a first control line, and the control module includes at least one control sub-module, the control sub-module includes a first control circuit; the repair method includes: when the first c stages of driving circuits included in the driving module in the display substrate are cut off, the connection line close to the (c+p)th stage of driving circuit being used to transmit the start voltage signal; disconnecting the first control line between the first control circuit corresponding to the (c+p)th stage of driving circuit and the first control circuit corresponding to the (c+p+1)th stage of driving circuit; p is a positive integer greater than or equal to 1.

In a fourth aspect, an embodiment of the present disclosure provides a display device, including the display substrate.

BRIEF DESCRIPTION OF THE DRAWINGS

FIG. 44 is a layout diagram of the electrode layer in FIG. 40;

DETAILED DESCRIPTION

Figure 1:
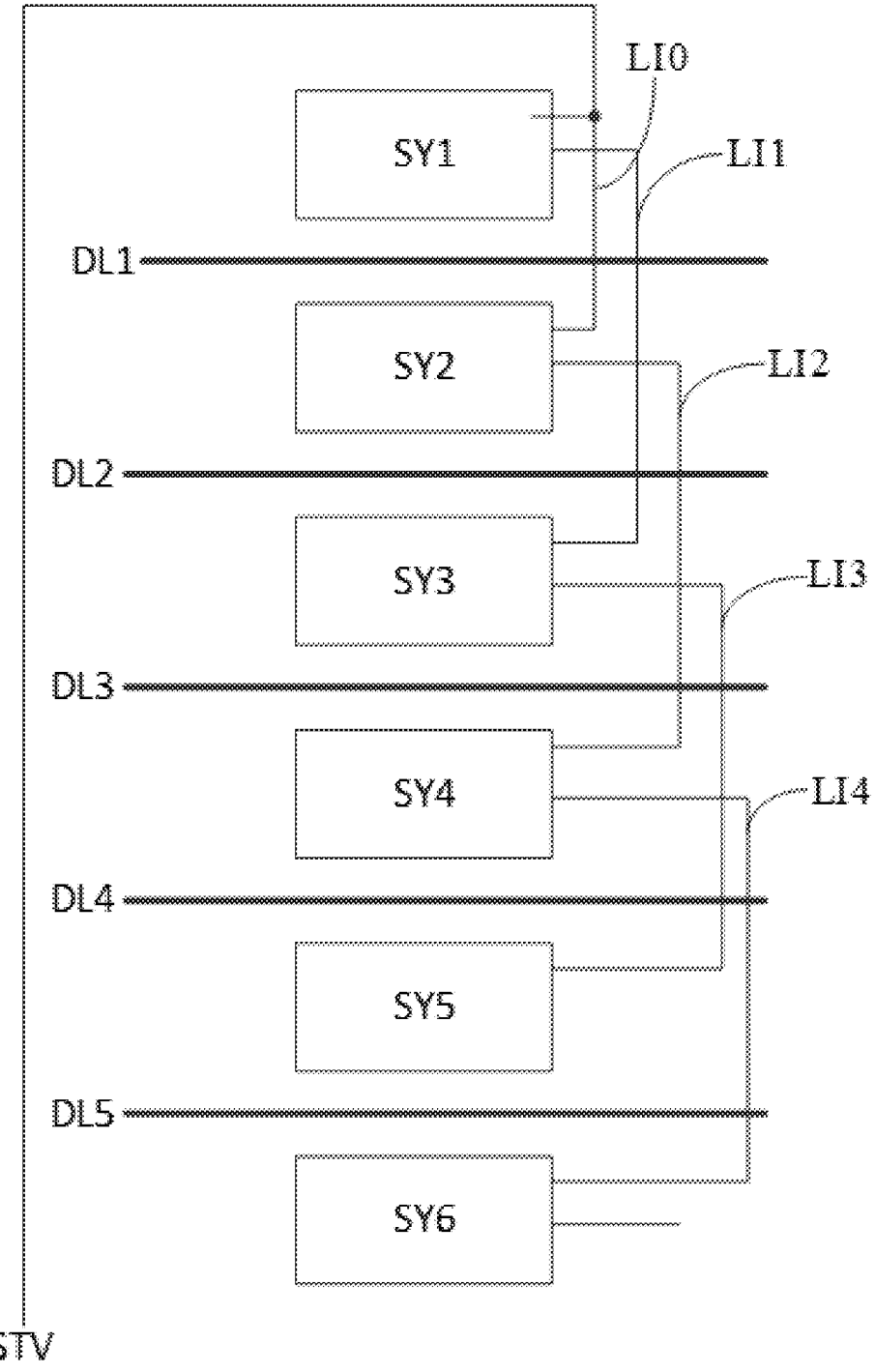
FIG. 1 is a structural diagram of six stages of driving circuits included in a related driving module.

The technical solutions in the embodiments of the present disclosure will be clearly and completely described below with reference to the accompanying drawings in the embodiments of the present disclosure. Obviously, the described embodiments are only some of the embodiments of the present disclosure, rather than all of the embodiments. Based on the embodiments in the present disclosure, all other embodiments obtained by those of ordinary skill in the art without making creative efforts fall within the scope of protection of the present disclosure.

The transistors used in all embodiments of the present disclosure may be thin film transistors, field effect transistors, or other devices with the same characteristics. In the embodiment of the present disclosure, in order to distinguish the two electrodes of the transistor except the gate electrode, one electrode is called the first electrode and the other electrode is called the second electrode.

In actual operation, when the transistor is a thin film transistor or a field effect transistor, the first electrode may be a drain electrode, and the second electrode may be a source electrode; or, the first electrode may be a source electrode, the second electrode may be a drain electrode.

The display substrate according to the embodiment of the present disclosure includes a base substrate and a driving module arranged on the base substrate; the driving module includes a control switch and N cascaded driving circuits; the driving circuit includes an input terminal; N is a positive integer;

The input terminals of the previous a stages of driving circuits included in the driving module is electrically connected to an start voltage line; a is a positive integer;

The input terminal of the nth stage of driving circuit included in the driving module is electrically connected to an output terminal of the (n–m)th stage of driving circuit included in the driving module through an input cascade line; n and m are positive integers, and m is less than n;

The driving module also includes at least one connection line, the connection line extending along a first direction;

There is an overlapping area between an orthographic projection of the connection line on the base substrate and an orthographic projection of the start voltage line on the base substrate; and/or, there is an overlapping area between the orthographic projection of the connection line on the base substrate and an orthographic projection of the input cascade line on the base substrate;

The control switch is electrically connected to the connection line.

In at least one embodiment of the present disclosure, the control switch may include a control module and a control line.

In specific implementation, when the first c stages of driving circuits included in the driving module in the display substrate is cut off, the control switch controls the connection line and the input cascade line to communicate with each other, so that the start voltage line can be connected to an input terminal of the (c+k)th stage of driving circuit;

The input cascade line is electrically connected to the input terminal of the (c+k)th stage of driving circuit;

Both c and k are positive integers.

In at least one embodiment of the present disclosure, when k is greater than 1, no input signal is connected from the input terminal of the (c+1)th stage of driving circuit to the input terminal of the (c+k−1)th stage of driving circuit. A frame sealing glue is provided at the position from the (c+1)th stage of driving circuit to the (c+k−1)th stage of driving circuit.

In at least one embodiment of the present disclosure, the start voltage line includes a portion extending along the second direction, and the start signal on the start voltage line is transmitted from a side close to the Nth stage of driving circuit in the driving module to the side close to the first stage of driving circuit in the driving module; the second direction is the direction from the Nth stage of driving circuit to the first stage of driving circuit.

In at least one embodiment of the present disclosure, the first direction may intersect with the second direction.

In at least one embodiment of the present disclosure, the driving module may be a gate driving module, and the driving circuit may be a gate driving circuit, but is not limited thereto.

In specific implementation, the start voltage is output by TCON (timing controller) and then output to the start voltage line through the level shifter. TCON is set in the driver IC. The start voltage line extends from the side of the driver IC to the side away from the driver IC.

In at least one embodiment of the present disclosure, at least part of the connection lines and the start voltage line are located on different layers, and at least part of the connection lines and the input cascade line are located on different layers.

In specific implementation, at least part of the connection lines and the start voltage line are located on different layers, so that when repair is required, the connection lines and the start voltage line can be electrically connected by welding or other means; at least part of the connection lines and the input cascade lines are located on different layers, so that when repair is required, the connection lines can be electrically connected to the input cascade lines by welding or other means.

Optionally, the connection line is provided between two adjacent driving circuits; or, the connection line penetrates at least part of the driving circuit.

It should be noted that in the present disclosure, the connection line is arranged between two adjacent driving circuits, which may include the case where the connection line is arranged between the two driving circuits and does not overlap with the two driving circuits, and also includes the case where the connection line partially overlaps one driving circuit, and may include the case where the driving circuit partially overlaps one driving circuit and partially overlaps the other driving circuit at the same time. The overlap here refers to the overlap with the transistors or signal lines included in the driving circuit.

As shown in FIG. 1, the one labeled SY1 is the first stage of driving circuit in the driving module, the one labeled SY2 is the second stage of driving circuit in the driving module, and the one labeled SY3 is the third stage of driving circuit in the driving module, the one labeled SY4 is the fourth stage of driving circuit in the driving module, the one labeled SY5 is the fifth stage of driving circuit in the driving module, and the one labeled SY6 is the sixth stage of driving circuit in the driving module.

In at least one embodiment shown in FIG. 1, the line labeled STV is the start voltage line, A first connection line DL1 is provided between SY1 and SY2, a second connection line DL2 is provided between SY2 and SY3, a third connection line DL3 is provided between SY3 and SY4, and a fourth connection line DL4 is provided between SY4 and SY5 and the fifth connection line DL5 is provided between SY5 and SY6.

The input terminals of SY1 and SY2 are electrically connected to the start voltage line STV through the start voltage input line LI0 (here it is only shown that the start voltage input line is electrically connected to the first two stages of gate driving circuits, and it can also be only electrically connected to the first stage of gate driving circuit, or to other multiple stages of gate driving circuits, such as the first 3 stages, the first 4 stages, etc., which are not limited here);

The input terminal of SY3 is electrically connected to the output terminal of SY1 through the first input cascade line LI1;

The input terminal of SY4 is electrically connected to the output terminal of SY2 through the second input cascade line LI2;

The input terminal of SY5 is electrically connected to the output terminal of SY3 through the third input cascade line LI3;

The input terminal of SY6 is electrically connected to the output terminal of SY4 through the fourth input cascade line LI4;

It should be noted that the input terminal here may refer to the gate electrode of the input transistor of the gate driving circuit, and/or, the first electrode of the input transistor, and the second electrode of the input transistor is electrically connected to the pull-up node of the gate driving circuit; the output terminal here can refer to the output terminal of the gate driving circuit, which can be GO (GO is the current stage of driving signal output terminal, that is, the output terminal that is electrically connected to the gate line of the display area), it can also be the output terminal OC responsible for cascading, carry and reset (OC is the current stage of carry signal output terminal). For example, refer to the gate driving circuit in FIG. 51, which is not limited here.

There is an overlapping area between the orthographic projection of DL1 on the base substrate and the orthographic projection of LI1 on the base substrate;

There is an overlapping area between the orthographic projection of DL2 on the base substrate and the orthographic projection of LI1 on the base substrate, and there is an overlapping area between the orthographic projection of DL2 on the base substrate and the orthographic projection of LI2 on the base substrate;

There is an overlapping area between the orthographic projection of DL3 on the base substrate and the orthographic projection of LI2 on the base substrate, and there is an overlapping area between the orthographic projection of DL3 on the base substrate and the orthographic projection of LI3 on the base substrate;

There is an overlapping area between the orthographic projection of DL4 on the base substrate and the orthographic projection of LI3 on the base substrate, and there is an overlapping area between the orthographic projection of DL3 on the base substrate and the orthographic projection of LI4 on the base substrate;

There is an overlapping area between the orthographic projection of DL5 on the base substrate and the orthographic projection of LI4 on the base substrate.

It should be noted that the number of start voltage lines, the number of driving circuits, the cascade relationship, etc. in FIG. 1 are schematic illustrations, and the specific number and cascade relationship can be set according to actual conditions.

It should be noted that in this case, connection lines can be set between two adjacent stages of driving circuits, or the display can be divided into areas, and connection lines can be set between areas and areas. For example, when the driving module includes forty stages of driving circuits, (the first stage of driving circuit SY1 to the fortieth stage of driving circuit SY40), there can be no connection line between SY1-SY20 (SY20 is the twentieth stage of driving circuit), and there is no connection line between SY21 (SY21 is the twenty-first stage of driving circuit)—SY40, there is connection line between SY20 and SY21, that is, the display panel is divided into multiple areas according to actual needs. Each area includes at least two driving circuits, and there are connection lines between areas, the division of specific areas and the number of connection lines can be set according to actual needs, and are not limited here.

In this case, by cutting the large-size display panel into small-size display panels, that is, the large display panel and the small display panel share a set of design solutions and the same mask, which can reduce the cost of development and mask, such as small-size display panels realized by cutting, without the need to redesign and re-mask. The present disclosure can achieve normal display when a large-sized panel is cut into a small-sized panel.

In the embodiment shown in FIG. 1, the driving module can be electrically connected to four clock signal lines, but is not limited to this.

In actual operation, the driving module can be electrically connected to 2 m clock signal lines. At this time, the first m stages of driving circuits included in the driving module are electrically connected to the start voltage line;

The output terminal of the nth stage of driving circuit of the driving module is electrically connected to the input terminal of the (n+m)th stage of driving circuit;

Both n and m are positive integers.

For example, when m is equal to 6, the driving module is electrically connected to twelve clock signal lines, and the output terminal of the nth stage of driving circuit included in the driving module is electrically connected to the input terminal of the (n+6)th stage of driving circuit.

Figure 2:
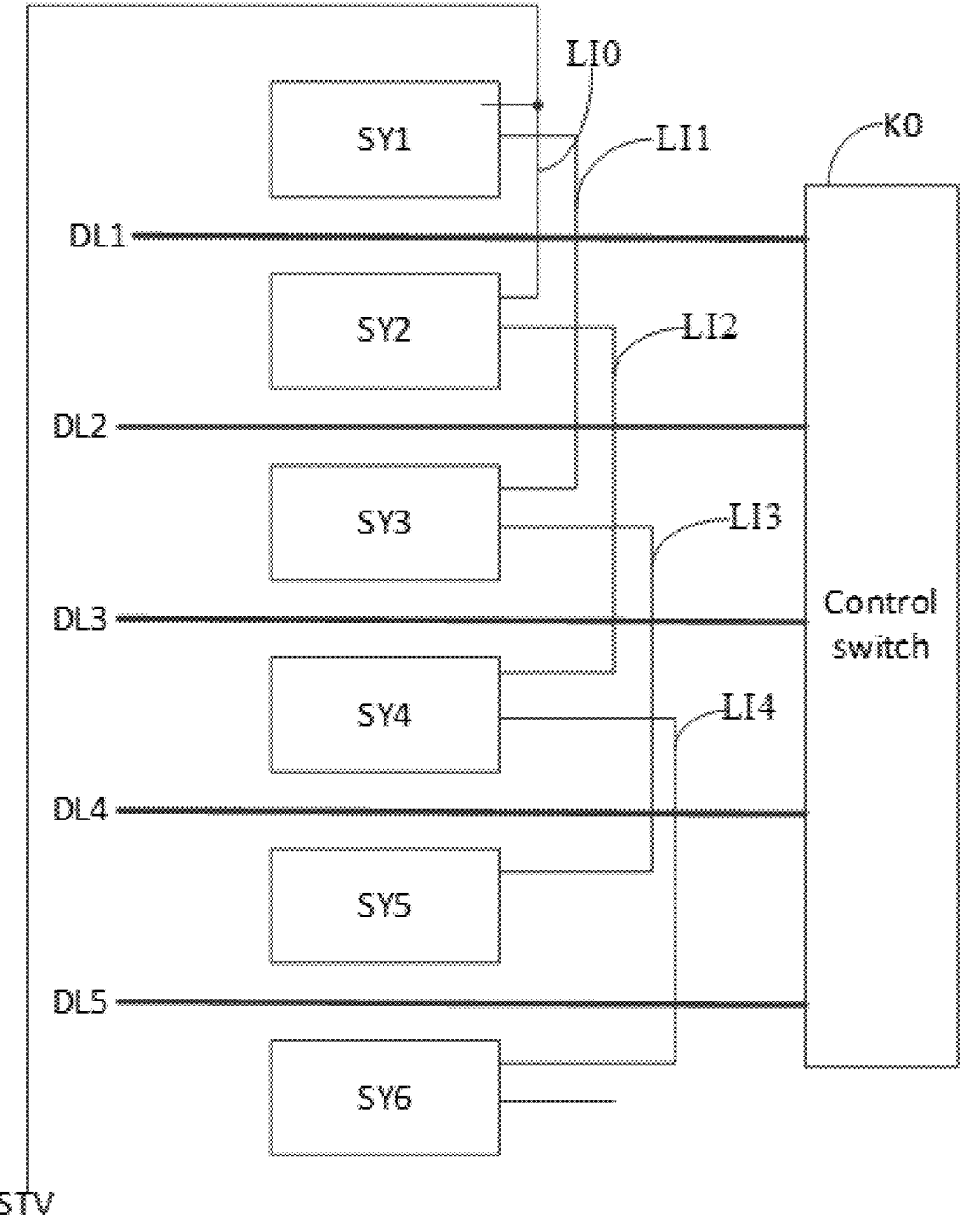
FIG. 2 is a structural diagram of a driving module in a display substrate according to at least one embodiment of the present disclosure.

As shown in FIG. 2, based on at least one embodiment of the display substrate shown in FIG. 1, the driving module may further include a control switch K0;

The control switch K0 is electrically connected to DL1, DL2, DL3, DL4 and DL5 respectively. In this case, a control switch is set up to connect and disconnect the connection line. When the screen is cut or the STV signal line cannot provide the start signal to the gate driving circuit, the start voltage line is electrically connected to the control switch through the electrical connection between the control switch and the connection line. When the control switch and the input cascade line are electrically connected, the start voltage signal can be transmitted to any row to achieve normal display.

In at least one embodiment of the display substrate shown in FIG. 2, K0 is electrically connected to the right terminal of each connection line, but is not limited to this. In actual operation, K0 can also be electrically connected to the left terminal of each connection line, or K0 can also be electrically connected to the left terminal of each connection line and the right terminal of each connection line respectively. The electrical connection in the present disclosure may be a direct electrical connection or an indirect electrical connection, that is, an electrical connection realized through other components such as transistors, resistors, inductors, etc.

In at least one embodiment of the present disclosure, the driving module includes a plurality of clock signal lines, a plurality of stages of driving circuits and a line collection portion; the driving circuit includes a first driving circuit portion and a second driving circuit portion;

The plurality of clock signal lines, the first driving circuit portion, the line collection portion and the second driving circuit portion are arranged in sequence along a direction close to the display area;

The input cascade line is provided in the line collection portion;

The driving circuit includes the first driving circuit portion and the second driving circuit portion.

In specific implementation, the driving module may include a plurality of clock signal lines, a multiple stages of driving circuit and a line collection portion. The driving circuit may include a first driving circuit portion and a second driving circuit portion. The plurality of clock signal lines, the first driving circuit portion, the line collecting portion and the second driving circuit portion are arranged in sequence along the direction close to the display area.

Optionally, the second driving circuit portion includes an output transistor in the driving circuit;

The first driving circuit portion includes a pull-up node control sub-circuit, a pull-down node control sub-circuit and an output reset sub-circuit; the pull-up node control sub-circuit is used to control the potential of the pull-up node, and the pull-down node control sub-circuit is used to control the potential of the pull-down node, and the output reset sub-circuit is used to reset the driving signal under the control of the potential of the pull-down node.

In specific implementation, the second driving circuit portion may include a first output transistor and a second output transistor;

The gate electrode of the first output transistor is electrically connected to the pull-up node, the first electrode of the first output transistor is electrically connected to the output clock signal line, and the second electrode of the first output transistor is electrically connected to the current stage of driving signal output terminal;

The gate electrode of the second output transistor is electrically connected to the pull-up node, the first electrode of the second output transistor is electrically connected to the output clock signal line, and the second electrode of the second output transistor is connected to the current stage of carry signal output terminal.

In at least one embodiment of the present disclosure, the connection lines included in the driving module can penetrate the clock signal lines included in the driving circuit, the first driving circuit portion and the line collection portion in a direction from away from the display area to close to the display area.

Optionally, the control switch includes a control line and a control module;

The control module is electrically connected to the control line, the start voltage line, the connection line and the line collection portion respectively, and is used to control to connect or disconnect the connection line and the line collection portion under the control of the control signal provided by the control line;

There is an overlapping area between the orthographic projection of the connection line on the base substrate and the orthographic projection of the line collection portion on the base substrate.

Figure 3:
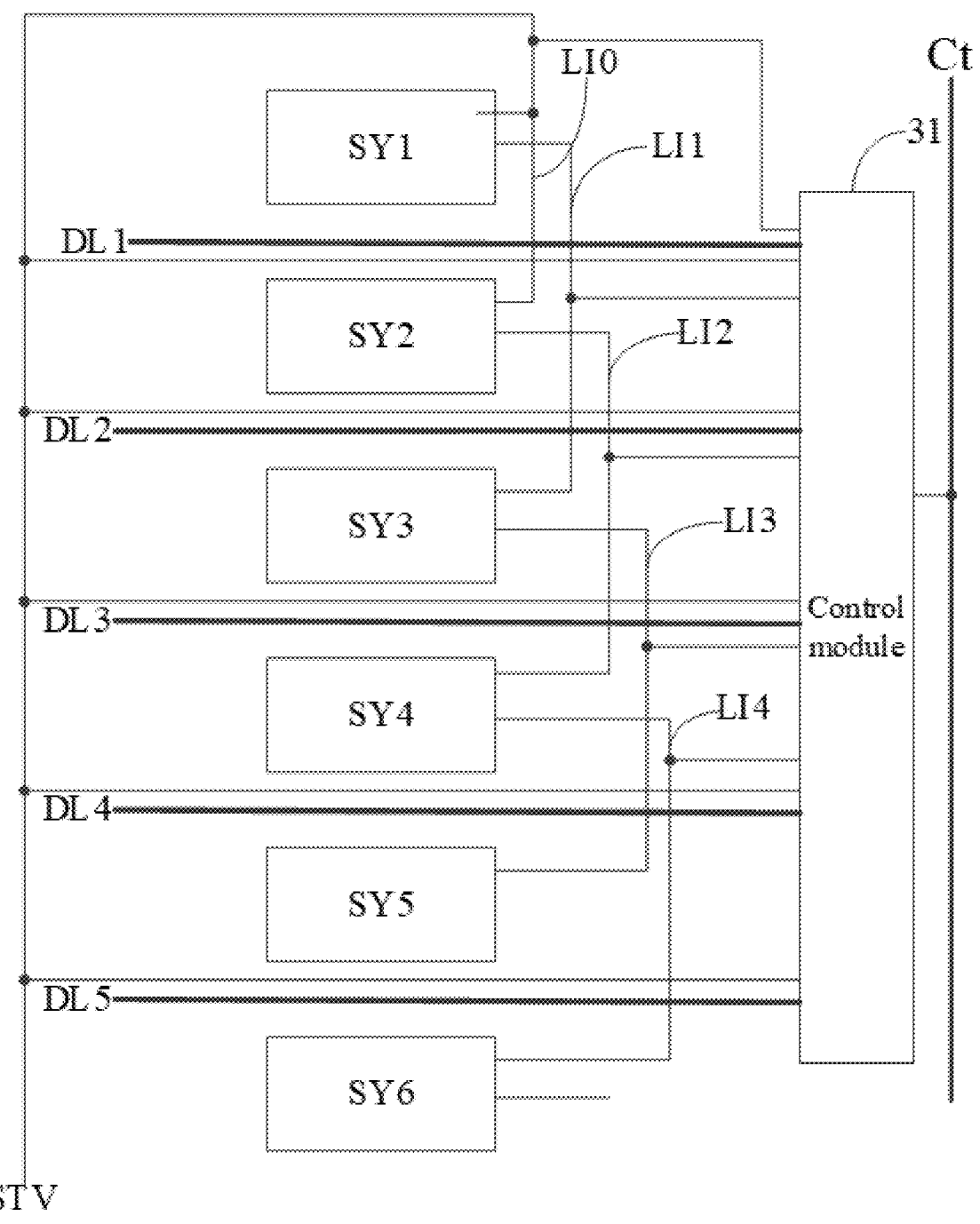
FIG. 3 is a structural diagram of a driving module in a display substrate according to at least one embodiment of the present disclosure.

As shown in FIG. 3, based on at least one embodiment of the display substrate shown in FIG. 2, the control switch may include a control module 31 and a control line Ct;

The control module 31 is electrically connected to the control line Ct, the start voltage line STV, the right terminal of DL1, the right terminal of DL2, the right terminal of DL3, the right terminal of DL4 and the right terminal of DL5 respectively;

The control module 31 can also be electrically connected to the start voltage input line LI0, the first input cascade line LI1, the second input cascade line LI2, the third input cascade line LI3 and the fourth input cascade line LI4 respectively.

In at least one embodiment of the display substrate shown in FIG. 3, the control line Ct is provided on the right side of the each stage of driving circuit, but is not limited to this. In actual operation, the control line Ct can also be set on the left side of each stage of driving circuit, or the control line can include a first control line and a second control line, and the first control line can be set on the left side of each stage of driving circuit, the second control line may be provided on the right side of each stage of driving circuit.

In at least one embodiment of the present disclosure, the control module is electrically connected to the input cascade line in the line collection portion; the control module includes at least one control sub-module;

The control sub-module corresponding to the nth stage of driving circuit included in the driving module is electrically connected to the input terminal of the (n+j)th stage of driving circuit through an input cascade line; j is a positive integer.

In specific implementation, the control module may include at least one control sub-module, and the control sub-module corresponding to the nth stage of driving circuit may be electrically connected to the input terminal of the (n+j)th stage of driving circuit through an input cascade line, so that when the first n−1 stages of driving circuits in the driving module is cut off, the control sub-module corresponding to the nth stage of driving circuit can be electrically connected to the input terminal of the (n+j)th stage of driving circuit, so that the input terminal of the (n+j)th stage of driving circuit is connected to the start voltage line.

In at least one embodiment of the present disclosure, the control module may include N control sub-modules, and each stage of driving circuit is provided with one control sub-module; or, the control module may include at least one control sub-module. A control sub-module is provided corresponding to portion of the driving circuit included in the driving module.

Optionally, the control line includes a first control line and a second control line, and the control sub-module includes a first control circuit and a second control circuit;

The first control circuit is electrically connected to the first control line, the start voltage line and the connection line respectively, and is used to control to connect or disconnect the start voltage line and the connection line under the control of a first control signal provided by the first control line.

The second control circuit is electrically connected to the second control line, the connection line and the input cascade line respectively, and is used to control to connect or disconnect the connection line and the input cascade line under the control of the second control signal provided by the second control line.

Figure 4:
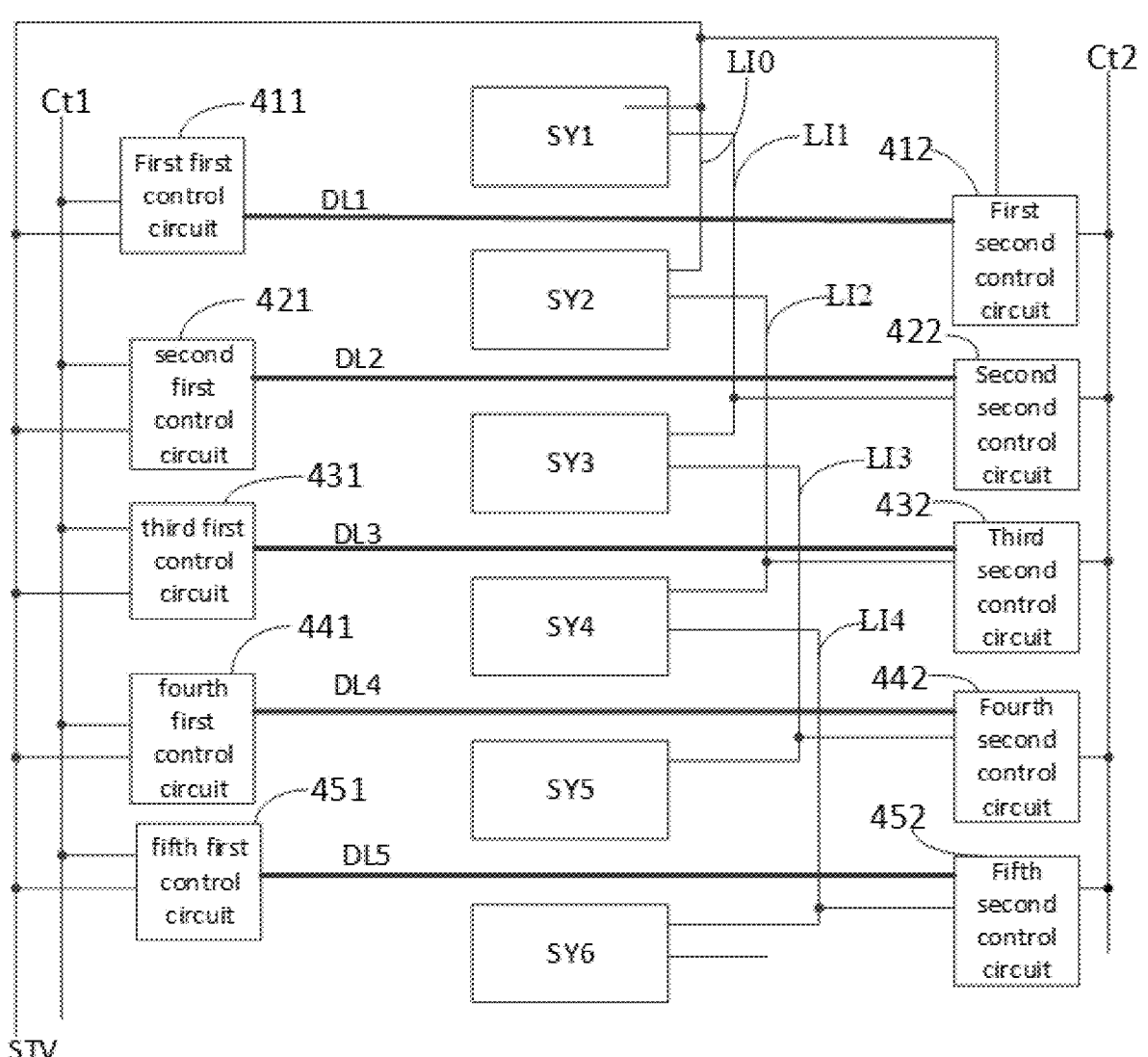
FIG. 4 is a structural diagram of a driving module in a display substrate according to at least one embodiment of the present disclosure.

As shown in FIG. 4, based on at least one embodiment of the display substrate shown in FIG. 1, the control switch includes a control module and a control line, and the control line includes a first control line Ct1 and a second control line Ct2; The control module includes a first control sub-module, a second control sub-module, a third control sub-module, a fourth control sub-module and a fifth control sub-module;

The first control sub-module includes a first first control circuit 411 and a first second control circuit 412;

The second control sub-module includes a second first control circuit 421 and a second second control circuit 422;

The third control sub-module includes a third first control circuit 431 and a third second control circuit 432;

The fourth control sub-module includes a fourth first control circuit 441 and a fourth second control circuit 442;

The fifth control sub-module includes a fifth first control circuit 451 and a fifth second control circuit 452;

The first first control circuit 411 is electrically connected to the first control line Ct1, the start voltage line STV and the first connection line DL1 respectively, and is configured to control to connect or disconnect the start voltage line STV and the first connection line DL1 under the control of the first control signal provided by the first control line Ct1;

The first second control circuit 412 is electrically connected to the second control line Ct2, the first connection line DL1 and the start voltage input line LI0 respectively, and is configured to control to connect or disconnect the first connection line DL1 and the start voltage input line LI0 under the control of the second control signal provided by the second control line Ct2;

The second first control circuit 421 is electrically connected to the first control line Ct1, the start voltage line STV and the second connection line DL2 respectively, is configured to control to connect or disconnect the start voltage line STV and the second connection line DL2 under the control of the first control signal provided by the first control line Ct1;

The second second control circuit 422 is electrically connected to the second control line Ct2, the second connection line DL2 and the first input cascade line LI1 respectively, is configured to control to connect or disconnect the second connection line DL2 and the first input cascade line LI1 under the control of the second control signal provided by the second control line Ct2;

The third first control circuit 431 is electrically connected to the first control line Ct1, the start voltage line STV and the third connection line DL3 respectively, is configured to control to connect or disconnect the start voltage line STV and the third connection line DL3 under the first control signal provided by the first control line Ct1;

The third second control circuit 432 is electrically connected to the second control line Ct2, the third connection line DL3 and the second input cascade line LI2 respectively, is configured to control to connect or disconnect the third connection line DL3 and the second input cascade line LI2 under the control of the second control signal provided by the second control line Ct2;

The fourth first control circuit 441 is electrically connected to the first control line Ct1, the start voltage line STV and the fourth connection line DL4 respectively, is configured to control to connect or disconnect the start voltage line STV and the fourth connection line DL4 under the control of the first control signal provided by the first control line Ct1;

The fourth second control circuit 442 is electrically connected to the second control line Ct2, the fourth connection line DL4 and the third input cascade line LI3 respectively, is configured to control to connect or disconnect the fourth connection line DL4 and the third input cascade line LI3 under the control of the second control signal provided by the second control line Ct2;

The fifth first control circuit 451 is electrically connected to the first control line Ct1, the start voltage line STV and the fifth connection line DL5 respectively, is configured to control to connect or disconnect the start voltage line STV and the fifth connection line DL5 under the control of the first control signal provided by the first control line Ct1;

The fifth second control circuit 452 is electrically connected to the second control line Ct2, the fifth connection line DL5 and the fourth input cascade line LI4 respectively, is configured to control to connect or disconnect the fifth connection line DL5 and the fourth input cascade line LI4 under the control of the second control signal provided by the second control line Ct2.

In at least one embodiment of the display substrate shown in FIG. 4, the second stage of driving circuit to the sixth stage of driving circuit respectively correspond to a control sub-module, and the control sub-module includes a first control circuit and a second control circuit. In actual operation, some of the driving circuits from the second stage of driving circuit to the sixth stage of driving circuit can also be provided with corresponding control sub-modules.

In at least one embodiment of the display substrate shown in FIG. 4, when the first stage of driving circuit to the third stage of driving circuit are cut off, the third first control circuit 431 can control to connect the start voltage line STV and the third connection line DL3 under the control of the first control signal, and the third second control circuit 432 controls to connect the third connection line DL3 and the second input cascade line LI2 under the control of the second control signal, so that the start voltage line STV is connected to the input terminal of SY4 through the second input cascade line LI2;

When cutting off the first stage of driving circuit to the third stage of driving circuit, it is necessary to cut off the first control line Ct1 and the second control line Ct2 so that the control sub-module corresponding to the driving circuits after the fourth stage of driving circuit included in the driving module cannot receive the first control signal and the second control signal.

In at least one embodiment of the display substrate shown in FIG. 4, when the first stage of driving circuit to the third stage of driving circuit are cut off, the fourth first control circuit 441 can also be used to control to connect the start voltage line STV and the fourth connection line DL4 under the control of the first control signal provided by the first control line Ct1, and the fourth second control circuit 442 is configured to control to connect the fourth connection line DL4 and the third input cascade line LI3 under the control of the second control signal provided by the second control line Ct2, so that the start voltage line STV is connected to the input terminal of SY5 through the third input cascade line LI3, and the first control line Ct1 and the second control line Ct2 need to be cut off, so that the control sub-module corresponding to the driving circuit after the fifth stage of driving circuit included in the driving module cannot receive the first control signal and a second control signal.

In at least one embodiment of the present disclosure, the driving module includes a plurality of connection lines; the connection lines are provided between adjacent two stage of driving circuits;

The first terminal of the connection line is electrically connected to the first control circuit, and the second terminal of the connection line is electrically connected to the second control circuit; the first terminal and the second terminal are opposite terminals.

Optionally, the first terminal may be the left terminal, and the second terminal may be the right terminal, but is not limited thereto.

As shown in FIG. 4, the left terminal of the first connection line DL1 is electrically connected to the first first control circuit 411, and the right terminal of the first connection line DL1 is electrically connected to the first second control circuit 412;

The left terminal of the second connection line DL2 is electrically connected to the second first control circuit 421, and the right terminal of the second connection line DL2 is electrically connected to the second second control circuit 422;

The left terminal of the third connection line DL3 is electrically connected to the third first control circuit 431, and the right terminal of the third connection line DL3 is electrically connected to the third second control circuit 432;

The left terminal of the fourth connection line DL4 is electrically connected to the fourth first control circuit 441, and the right terminal of the fourth connection line DL4 is electrically connected to the fourth second control circuit 442;

The left terminal of the fifth connection line DL5 is electrically connected to the fifth first control circuit 451, and the right terminal of the fifth connection line DL5 is electrically connected to the fifth second control circuit 452.

Optionally, the first control circuit includes a first control transistor, and the second control circuit includes a second control transistor;

a gate electrode of the first control transistor is electrically connected to a first electrode of the first control transistor, the gate electrode of the first control transistor is electrically connected to the first control line, and the third electrode of the first control transistor is electrically connected to the first terminal of the connection line, and a second electrode of the first control transistor is electrically connected to the start voltage line;

a gate electrode of the second control transistor is electrically connected to the second control line, a first electrode of the second control transistor is electrically connected to the second terminal of the connection line, and a second electrode of the second control transistor is electrically connected to the input cascade line.

Figure 5A:
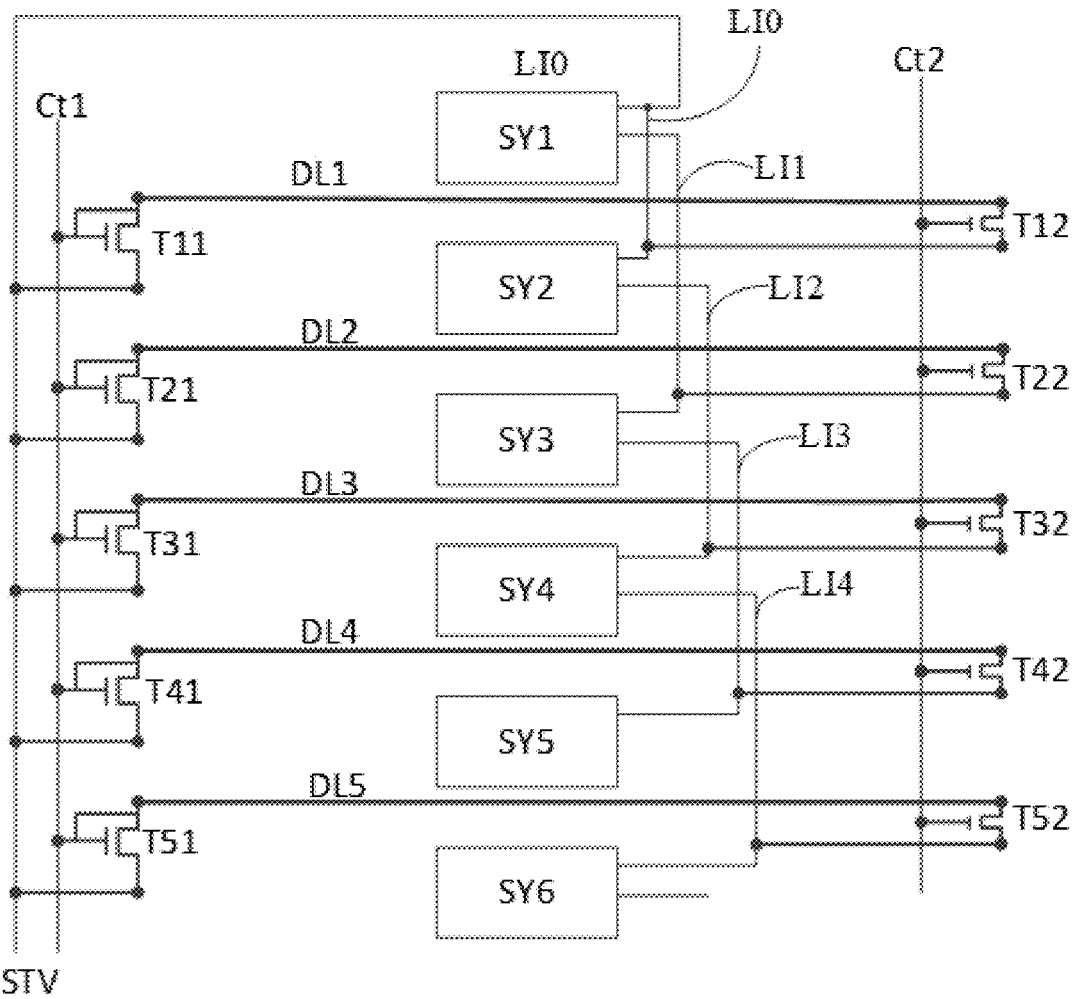
FIG. 5A is a structural diagram of a driving module in a display substrate according to at least one embodiment of the present disclosure.

As shown in FIG. 5A, based on at least one embodiment of the display substrate shown in FIG. 4, the first first control circuit may include a first first control transistor T11, and the first second control circuit may include first second control transistor T12;

The gate electrode of T11 is electrically connected to the first electrode of T11, the gate electrode of T11 is electrically connected to the first control line Ct1, the first electrode of T11 is electrically connected to the left terminal of the first connection line DL1, and the second electrode of T11 is electrically connected to the start voltage line STV;

The gate electrode of T12 is electrically connected to the second control line Ct2, the first electrode of T12 is electrically connected to the right terminal of the first connection line DL1, and the second electrode of T12 is electrically connected to the start voltage input line LI0;

The second first control circuit includes a second first control transistor T21, and the second second control circuit includes a second second control transistor T22;

The gate electrode of the second first control transistor T21 is electrically connected to the first electrode of the second first control transistor T21, and the gate electrode of the second first control transistor T21 is connected to the first control line Ct1, the first electrode of the second first control transistor T21 is electrically connected to the left terminal of the second connection line DL2, and the second electrode of the second first control transistor T21 is electrically connected to the start voltage line STV;

The gate electrode of the second second control transistor T22 is electrically connected to the second control line Ct2, and the first electrode of the second second control transistor T22 is electrically connected to the right terminal of the second connection line DL2, the second electrode of the second second control transistor T22 is electrically connected to the first input cascade line LI1;

The third first control circuit includes a third first control transistor T31, and the third second control circuit includes a third second control transistor T32;

The gate electrode of the third first control transistor T31 is electrically connected to the first electrode of the third first control transistor T31, and the gate electrode of the third first control transistor T31 is connected to the first control line Ct1, the first electrode of the third first control transistor T31 is electrically connected to the left terminal of the third connection line DL3, and the second electrode of the third first control transistor T31 is electrically connected to the start voltage line STV;

The gate electrode of the third second control transistor T32 is electrically connected to the second control line Ct2, and the first electrode of the third second control transistor T32 is electrically connected to the right terminal of the third connection line DL3, the second electrode of the third second control transistor T32 is electrically connected to the second input cascade line LI2; other control transistors are connected in the same manner, and will not be described in detail here.

In FIG. 5A, T41 is the fourth first control transistor included in the fourth first control circuit, T42 is the fourth second control transistor included in the fourth second control circuit, T51 is the fifth first control transistor included in the fifth first control circuit, and T52 is the fifth second control transistor included in the fifth second control circuit.

In at least one embodiment of the display substrate shown in FIG. 5A, all control transistors are n-type transistors, but are not limited to this.

In at least one embodiment of the display substrate shown in FIG. 5A, when the first three rows of driving circuits are cut off, T11, T12, T21 and T22 are cut off. Optionally, Ct1 controls T31 to turn on, and Ct2 controls T32 to turn on, to control to electrically connect the start voltage line STV and the second input cascade line LI2, so that the input terminal of SY4 is connected to the start voltage provided by the start voltage line STV;

Moreover, Ct1 and Ct2 need to be cut off so that the gate electrodes of T41 and T51 are not electrically connected to Ct1, so that the gate electrodes of T42 and T52 are not electrically connected to Ct2. For example, Ct1 between T31 and T41 can be cut off. Ct2 between T32 and T42 are cut off. Of course, when cutting off the first three rows of driving circuits, the T41 and T42 can be turned on, or the T51 and T52 can be turned on, which is not limited. When the T41 and T42 are turned on, the Ct1 between T41 and T51 can be cut off. Ct2 between T42 and T52 are cut off; and so on, no details will be given here.

In at least one embodiment shown in FIG. 5A, the driving module is electrically connected to four clock signal lines, but is not limited to this.

Figure 5B:
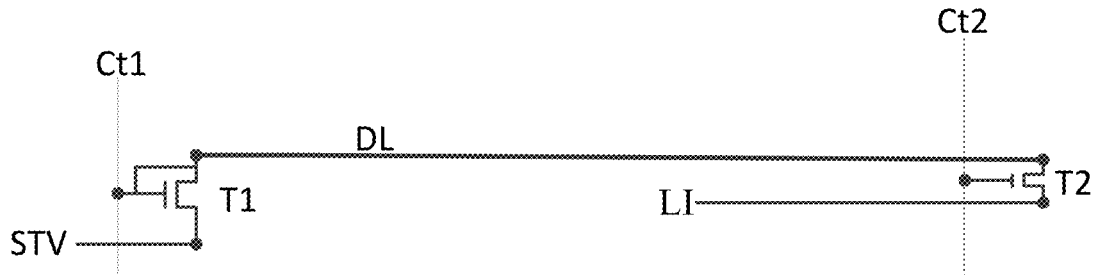
FIG. 5B is a structural diagram of a control module in a display substrate according to at least one embodiment of the present disclosure.

As shown in FIG. 5B, a control sub-module included in the control module may include a first control transistor T1 and a second control transistor T2;

The gate electrode of the first control transistor T1 is electrically connected to the first control line Ct1, the first electrode of the first control transistor T1 is electrically connected to the left terminal of the connection line DL, and the second electrode of the first control transistor T1 is electrically connected to the first electrode of the first control transistor T1;

The gate electrode of the second control transistor T2 is electrically connected to the second control line Ct2, the first electrode of the second control transistor T2 is electrically connected to the right terminal of the connection line DL, and the second electrode of the second control transistor T2 is connected to the input cascade line LI.

Optionally, the first control circuit includes a first control transistor, and the second control circuit includes a second control transistor;

a gate electrode of the first control transistor is electrically connected to the first control line, a first electrode of the first control transistor is electrically connected to the first terminal of the connection line, and a second electrode of the first control transistor is electrically connected to the start voltage line;

a gate electrode of the second control transistor is electrically connected to the second control line, a first electrode of the second control transistor is electrically connected to the second terminal of the connection line, and a second electrode of the second control transistor is electrically connected to the input cascade line.

Figure 6A:
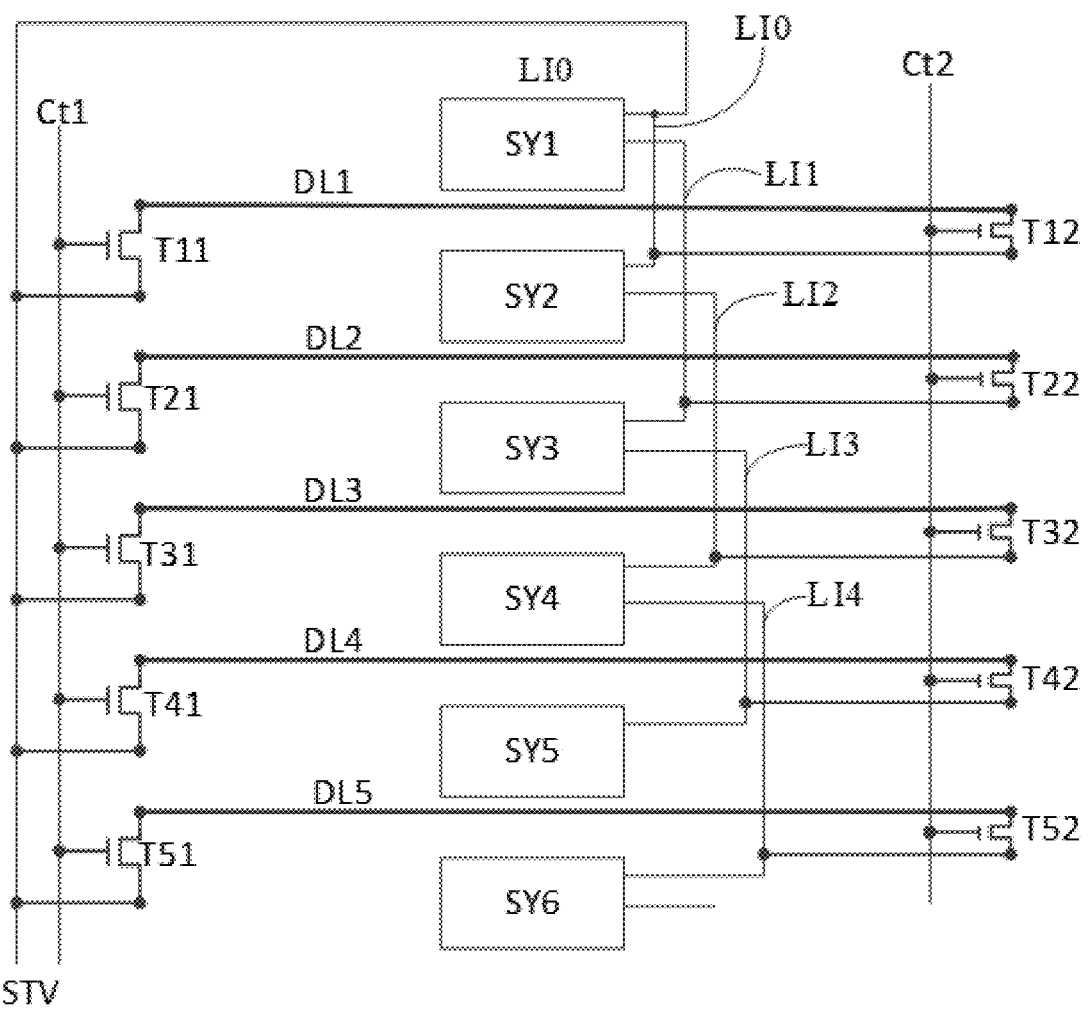
FIG. 6A is a structural diagram of a driving module in a display substrate according to at least one embodiment of the present disclosure.

As shown in FIG. 6A, based on at least one embodiment of the display substrate shown in FIG. 4, the first first control circuit may include a first first control transistor T11, and the first second control circuit may include first second control transistor T12;

The gate electrode of T11 is electrically connected to the first control line Ct1, the first electrode of T11 is electrically connected to the left terminal of the first connection line DL1, and the second electrode of T11 is electrically connected to the start voltage line STV;

The gate electrode of T12 is electrically connected to the second control line Ct2, the first electrode of T12 is electrically connected to the right terminal of the first connection line DL1, and the second electrode of T12 is electrically connected to the start voltage input line LI0;

The second first control circuit includes a second first control transistor T21, and the second second control circuit includes a second second control transistor T22;

The gate electrode of the second first control transistor T21 is electrically connected to the first control line Ct1, and the first electrode of the second first control transistor T21 is electrically connected to the left terminal of the second connection line DL2, the second electrode of the second first control transistor T21 is electrically connected to the start voltage line STV;

The gate electrode of the second second control transistor T22 is electrically connected to the second control line Ct2, and the first electrode of the second second control transistor T22 is electrically connected to the right terminal of the second connection line DL2, the second electrode of the second second control transistor T22 is electrically connected to the first input cascade line LI1;

The third first control circuit includes a third first control transistor T31, and the third second control circuit includes a third second control transistor T32;

The gate electrode of the third first control transistor T31 is electrically connected to the first control line Ct1, and the first electrode of the third first control transistor T31 is electrically connected to the left terminal of the third connection line DL3, the second electrode of the third first control transistor T31 is electrically connected to the start voltage line STV;

The gate electrode of the third second control transistor T32 is electrically connected to the second control line Ct2, and the first electrode of the third second control transistor T32 is electrically connected to the right terminal of the third connection line DL3, the second electrode of the third second control transistor T32 is electrically connected to the second input cascade line LI2;

The fourth first control circuit includes a fourth first control transistor T41, and the fourth second control circuit includes a fourth second control transistor T42;

The gate electrode of the fourth first control transistor T41 is electrically connected to the first control line Ct1, and the first electrode of the fourth first control transistor T41 is electrically connected to the left terminal of the fourth connection line DL4, the second electrode of the fourth first control transistor T41 is electrically connected to the start voltage line STV;

The gate electrode of the fourth second control transistor T42 is electrically connected to the second control line Ct2, and the first electrode of the fourth second control transistor T42 is electrically connected to the right terminal of the fourth connection line DL4, the second electrode of the fourth second control transistor T42 is electrically connected to the third input cascade line LI3;

The fifth first control circuit includes a fifth first control transistor T51, and the fifth second control circuit includes a fifth second control transistor T52;

The gate electrode of the fifth first control transistor T51 is electrically connected to the first control line Ct1, and the first electrode of the fifth first control transistor T51 is electrically connected to the left terminal of the fifth connection line DL5, the second electrode of the fifth first control transistor T51 is electrically connected to the start voltage line STV;

The gate electrode of the fifth second control transistor T52 is electrically connected to the second control line Ct2, and the first electrode of the fifth second control transistor T52 is electrically connected to the right terminal of the fifth connection line DL5, the second electrode of the fifth second control transistor T52 is electrically connected to the fourth input cascade line LI4.

In at least one embodiment of the display substrate shown in FIG. 6A, all control transistors are n-type transistors, but are not limited to this.

In at least one embodiment of the display substrate shown in FIG. 6A, when the first three rows of driving circuits are cut off, T11, T12, T21 and T22 are cut off, Ct1 controls T31 to open, and Ct2 controls T32 to turn on to control the start voltage line STV to be electrically connected to the second input cascade line LI2, so that the input terminal of SY4 is connected to the start voltage provided by the start voltage line STV;

Furthermore, Ct1 and Ct2 need to be cut off so that the gates of T41 and T51 are not electrically connected to Ct1, so that the gates of T42 and T52 are not electrically connected to Ct2.

Figure 6B:
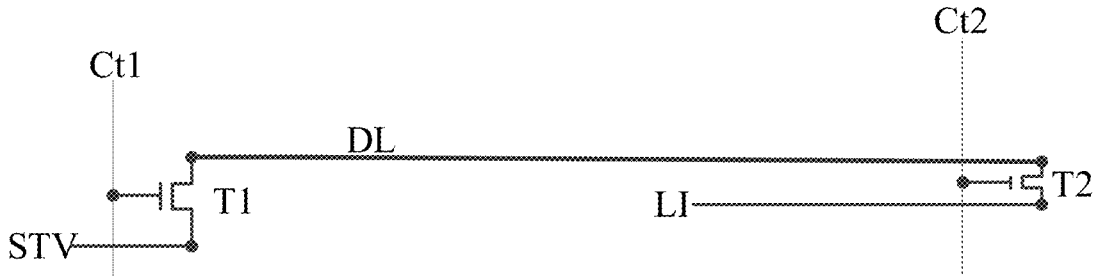
FIG. 6B is a structural diagram of a control module in a display substrate according to at least one embodiment of the present disclosure.

As shown in FIG. 6B, a control sub-module included in the control module may include a first control transistor T1 and a second control transistor T2;

The gate electrode of the first control transistor T1 is electrically connected to the first control line Ct1, the first electrode of the first control transistor T1 is electrically connected to the left terminal of the connection line DL, and the second electrode of the first control transistor T1 is electrically connected to the start voltage line STV;

The gate electrode of the second control transistor T2 is electrically connected to the second control line Ct2, the first electrode of the second control transistor T2 is electrically connected to the right terminal of the connection line DL, and the second electrode of the second control transistor T2 is connected to the input cascade line LI.

In at least one embodiment of the present disclosure, the control line includes a second control line, and the control sub-module includes a second control circuit;

The connection line is electrically connected to the start voltage line;

The second control circuit is electrically connected to the second control line, the connection line and the input cascade line respectively, and is used to control to connect or disconnect the connection line and the input cascade line under the control of the second control signal provided by the second control line.

Figure 7:
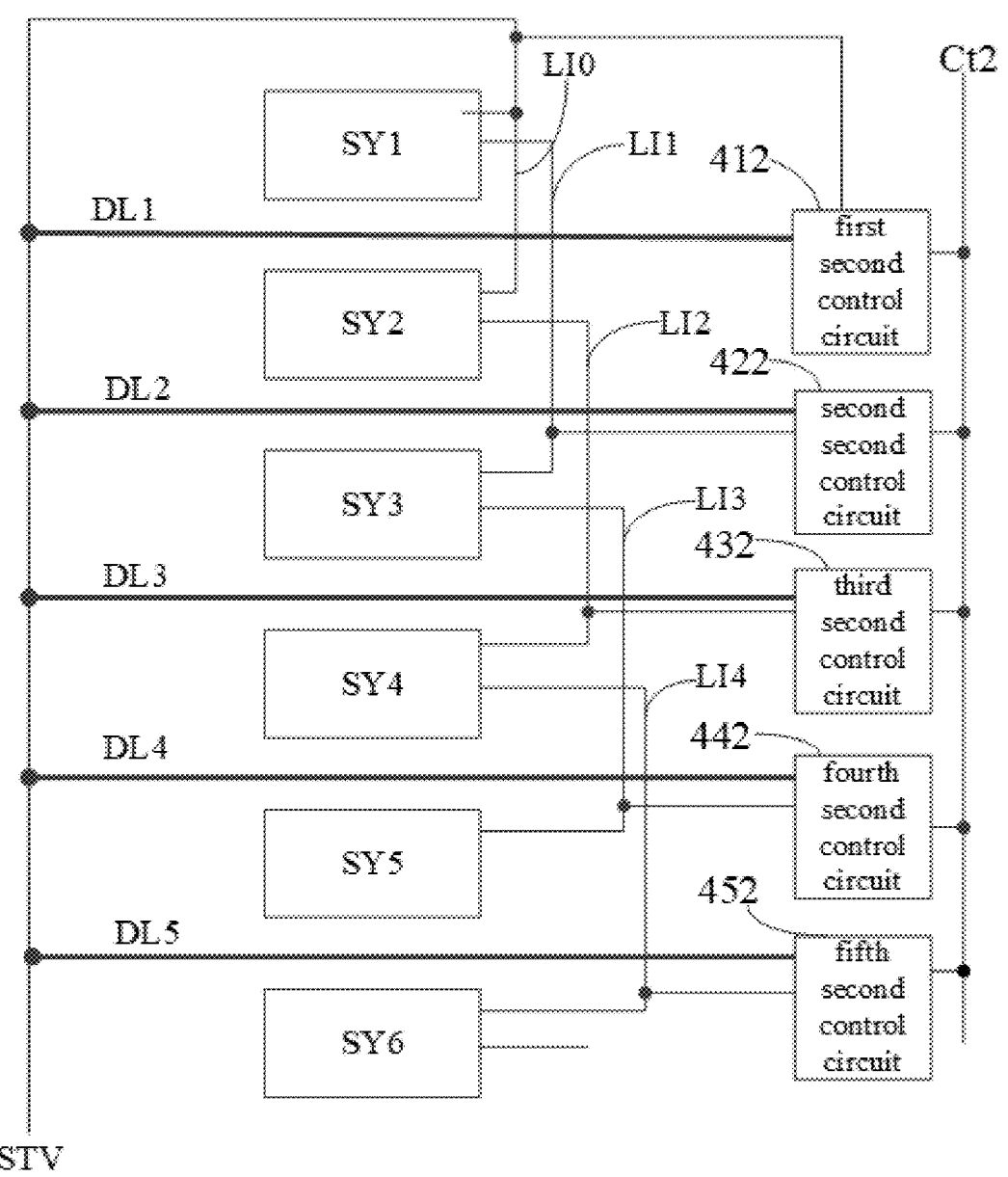
FIG. 7 is a structural diagram of a driving module in a display substrate according to at least one embodiment of the present disclosure.

As shown in FIG. 7, based on at least one embodiment of the display substrate shown in FIG. 1, the control switch includes a control module and a control line, the control line includes a second control line Ct2; the control module includes the first control sub-module, the second control sub-module, the third control sub-module, the fourth control sub-module and the fifth control sub-module; the first control sub-module includes a first second control circuit 412, the second control sub-module includes a second second control circuit 422, the third control sub-module includes a third second control circuit 432, the fourth control sub-module includes a fourth second control circuit 442, the fifth control sub-modules include a fifth second control circuit 452;

The first connection line DL1, the second connection line DL2, the third connection line DL3, the fourth connection line DL4 and the fifth connection line DL5 are all electrically connected to the start voltage line STV;

The first second control circuit 412 is electrically connected to the second control line Ct2, the first connection line DL1 and the start voltage input line LI0 respectively, and is used to control to connect or disconnect the first connection line DL1 and the start voltage input line LI0 under the control of the second control signal provided by the second control line Ct2;

The second second control circuit 422 is electrically connected to the second control line Ct2, the second connection line DL2 and the first input cascade line LI1 respectively, is configured to control to connect or disconnect the second connection line DL2 and the first input cascade line LI1 under the control of the second control signal provided by the second control line Ct2;

The third second control circuit 432 is electrically connected to the second control line Ct2, the third connection line DL3 and the second input cascade line LI2 respectively, is configured to control to connect or disconnect the third connection line DL3 and the second input cascade line LI2 under the control of the second control signal provided by the second control line Ct2;

The fourth second control circuit 442 is electrically connected to the second control line Ct2, the fourth connection line DL4 and the third input cascade line LI3 respectively, is configured to control to connect or disconnect the fourth connection line DL4 and the third input cascade line LI3 under the control of the second control signal provided by the second control line Ct2;

The fifth second control circuit 452 is electrically connected to the second control line Ct2, the fifth connection line DL5 and the fourth input cascade line LI4 respectively, is configured to control to connect or disconnect the fifth connection line DL5 and the fourth input cascade line LI4 under the control of the second control signal provided by the second control line Ct2.

Optionally, the driving module includes a plurality of connection lines; the connection lines are arranged between adjacent two stage of driving circuits;

a first terminal of the connection line is electrically connected to the start voltage line, and a second terminal of the connection line is electrically connected to the second control circuit; the first terminal and the second terminal are opposite terminals.

In specific implementation, when the control line includes a second control line and the control sub-module includes a second control circuit, the first terminal of the connection line may be electrically connected to the start voltage line, and the second terminal of the connection line may be electrically connected to the second control circuit.

For example, the first terminal may be the left terminal, and the second terminal may be the right terminal, but is not limited thereto.

Optionally, the second control circuit includes a second control transistor;

a gate electrode of the second control transistor is electrically connected to the second control line, a first electrode of the second control transistor is electrically connected to the second terminal of the connection line, and a second electrode of the second control transistor is electrically connected to the input cascade line.

Figure 8A:
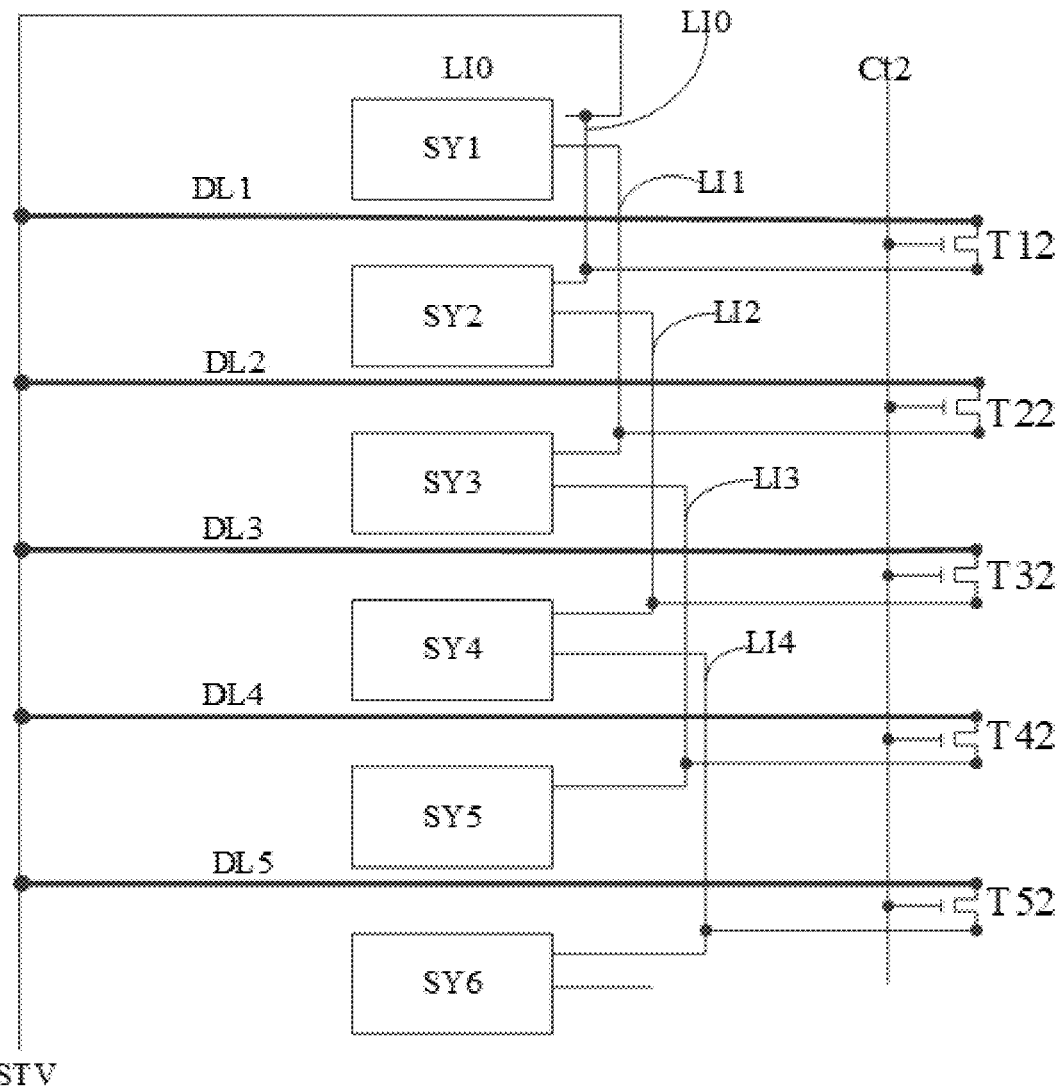
FIG. 8A is a structural diagram of a driving module in a display substrate according to at least one embodiment of the present disclosure.

As shown in FIG. 8A, based on at least one embodiment of the pixel circuit shown in FIG. 7, The first second control circuit may include a first second control transistor T12;

The left terminal of the first connection line DL1 is electrically connected to the start voltage line STV; the gate electrode of T12 is electrically connected to the second control line Ct2, the first electrode of T12 is electrically connected to the right terminal of the first connection line DL1, and the second electrode of T12 Electrically connected to the start voltage input line LI0;

The second second control circuit includes a second second control transistor T22;

The left terminal of the second connection line DL2 is electrically connected to the start voltage line STV; the gate electrode of the second second control transistor T22 is electrically connected to the second control line Ct2, and the first electrode of the second second control transistor T22 is electrically connected to the right terminal of the second connection line DL2, and the second electrode of the second second control transistor T22 is electrically connected to the first input cascade line LI1;

The third second control circuit includes a third second control transistor T32;

The left terminal of the third connection line DL3 is electrically connected to the start voltage line STV; the gate electrode of the third second control transistor T32 is electrically connected to the second control line Ct2, and the first electrode of the third second control transistor T32 is electrically connected to the right terminal of the third connection line DL3, and the second electrode of the third second control transistor T32 is electrically connected to the second input cascade line LI2;

The fourth second control circuit includes a fourth second control transistor T42;

The left terminal of the fourth connection line DL4 is electrically connected to the start voltage line STV; the gate electrode of the fourth second control transistor T42 is electrically connected to the second control line Ct2, and the first electrode of the fourth second control transistor T42 is electrically connected to the right terminal of the fourth connection line DL4, and the second electrode of the fourth second control transistor T42 is electrically connected to the third input cascade line LI3;

The fifth second control circuit includes a fifth second control transistor T52;

The left terminal of the fifth connection line DL5 is electrically connected to the start voltage line STV; the gate electrode of the fifth second control transistor T52 is electrically connected to the second control line Ct2, and the first electrode of the fifth second control transistor T52 is electrically connected to the right terminal of the fifth connection line DL5, and the second electrode of the fifth second control transistor T52 is electrically connected to the fourth input cascade line LI4.

In at least one embodiment of the display substrate shown in FIG. 8A, all control transistors are n-type transistors, but are not limited to this.

In at least one embodiment of the display substrate shown in FIG. 8A, when the first three rows of driving circuits are cut off, T21 and T22 are cut off, and Ct2 controls T32 to turned on to control the voltage connection between the start voltage line STV and the second input cascade line LI2, so that the input terminal of SY4 is connected to the start voltage provided by the start voltage line STV;

Furthermore, Ct2 needs to be cut off so that the gate electrodes of T42 and T52 are not electrically connected to Ct2.

Figure 8B:
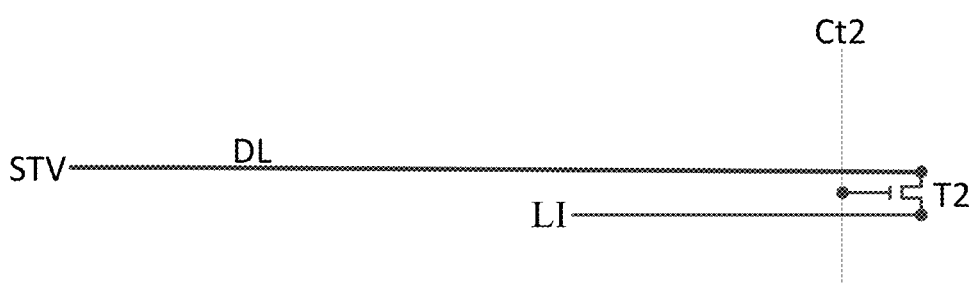
FIG. 8B is a structural diagram of a control module in a display substrate according to at least one embodiment of the present disclosure.

As shown in FIG. 8B, a control sub-module included in the control module may include a second control transistor T2;

The left terminal of the connection line DL is electrically connected to the start voltage line STV;

The gate electrode of the second control transistor T2 is electrically connected to the second control line Ct2, the first electrode of the second control transistor T2 is electrically connected to the right terminal of the connection line DL, and the second electrode of the second control transistor T2 is connected to the input cascade line LI.

In at least one embodiment of the present disclosure, the control line includes a first control line, and the control sub-module includes a first control circuit;

The first control circuit is electrically connected to the first control line, the start voltage line and the connection line respectively, and is configured to control to connect or disconnect the connection line and the start voltage line under the control of the first control signal provided by the first control line;

The connection line is electrically connected to the input cascade line.

In specific implementation, the control line may include a first control line, and the control sub-module may include a first control circuit. The first control circuit controls to connect or disconnect the connection line and the start voltage line under the control of the first control signal, so as to control the connection or disconnection between the start voltage line and the input cascade line.

Figure 9:
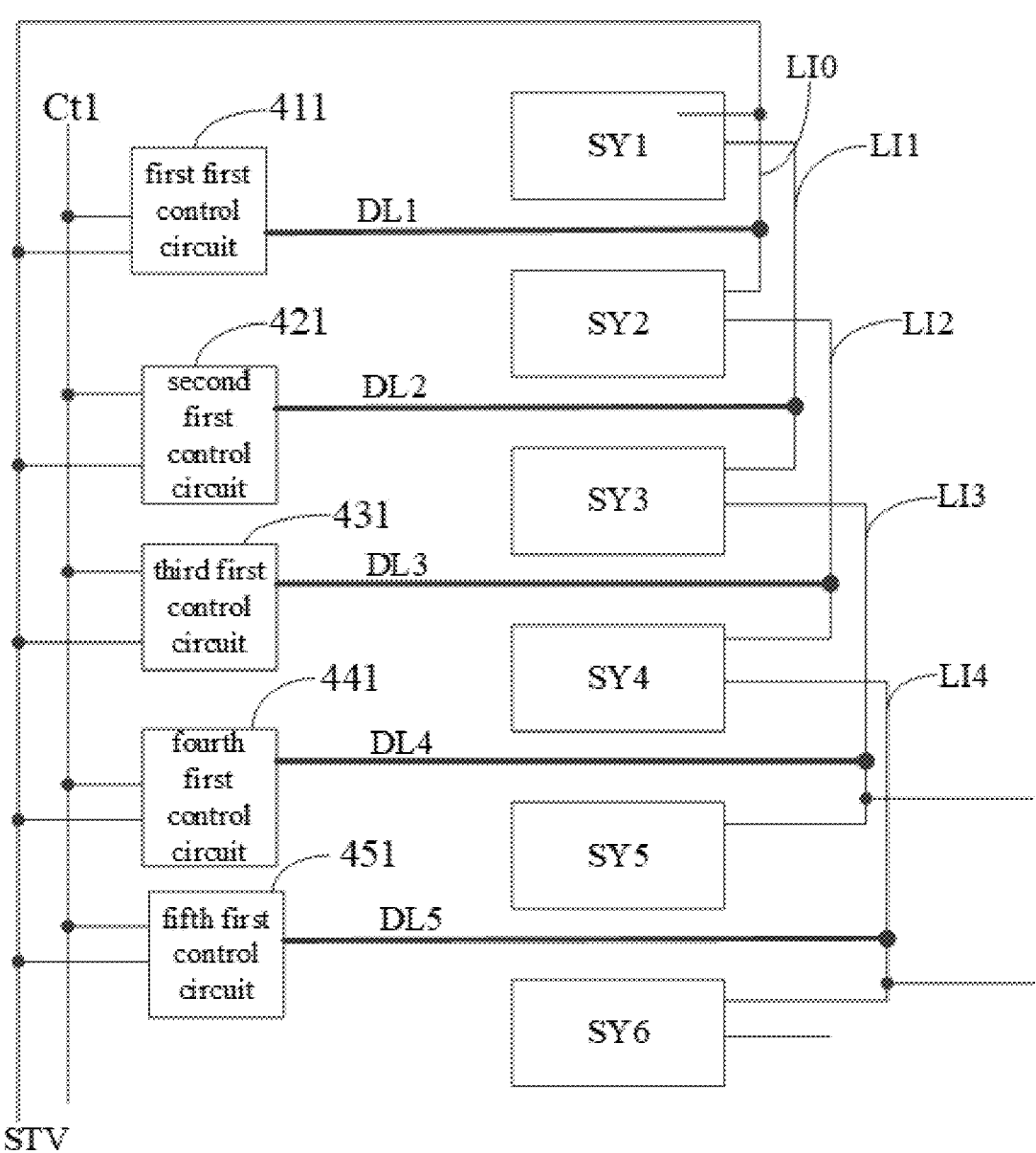
FIG. 9 is a structural diagram of a driving module in a display substrate according to at least one embodiment of the present disclosure.

As shown in FIG. 9, based on at least one embodiment of the display substrate shown in FIG. 1, the control switch includes a control module and a control line, the control line includes a first control line Ct1; the control module includes a first control sub-module, a second control sub-module, a third control sub-module, a fourth control sub-module and a fifth control sub-module; the first control sub-module includes a first first control circuit 411, the second control sub-module includes a second first control circuit 421, the third control sub-module includes a third first control circuit 431, the fourth control sub-module includes a fourth first control circuit 441, the fifth control sub-modules include the fifth first control circuit 451;

The first first control circuit 411 is electrically connected to the first control line Ct1, the start voltage line STV and the first connection line DL1 respectively, is configured to control to connect or disconnect the first connection line DL1 and the start voltage line STV under the control of the first control signal provided by the first control line Ct1;

The first connection line DL1 is electrically connected to the start voltage input line LI0;

The second first control circuit 421 is electrically connected to the first control line Ct1, the start voltage line STV and the second connection line DL2 respectively, is configured to control to connect or disconnect the second connection line DL2 and the start voltage line STV under the control of the first control signal provided by the first control line Ct1;

The second connection line DL2 is electrically connected to the first input cascade line LI1;

The third first control circuit 431 is electrically connected to the first control line Ct1, the start voltage line STV and the third connection line DL3 respectively, is configured to control to connect or disconnect the third connection line DL3 and the start voltage line STV under the control of the first control signal provided by the first control line Ct1;

The third connection line DL3 is electrically connected to the second input cascade line LI2;

The fourth first control circuit 441 is electrically connected to the first control line Ct1, the start voltage line STV and the fourth connection line DL4 respectively, is configured to control to connect or disconnect the fourth connection line DLA and the start voltage line STV under the control of the first control signal provided by the first control line Ct1;

The fourth connection line DLA is electrically connected to the third input cascade line LI3;

The fifth first control circuit 451 is electrically connected to the first control line Ct1, the start voltage line STV and the fifth connection line DL5 respectively, is configured to control to connect or disconnect the fifth connection line DL5 and the start voltage line STV under the control of the first control signal provided by the first control line Ct1;

The fifth connection line DL5 is electrically connected to the fourth input cascade line LI4.

Figure 10A:
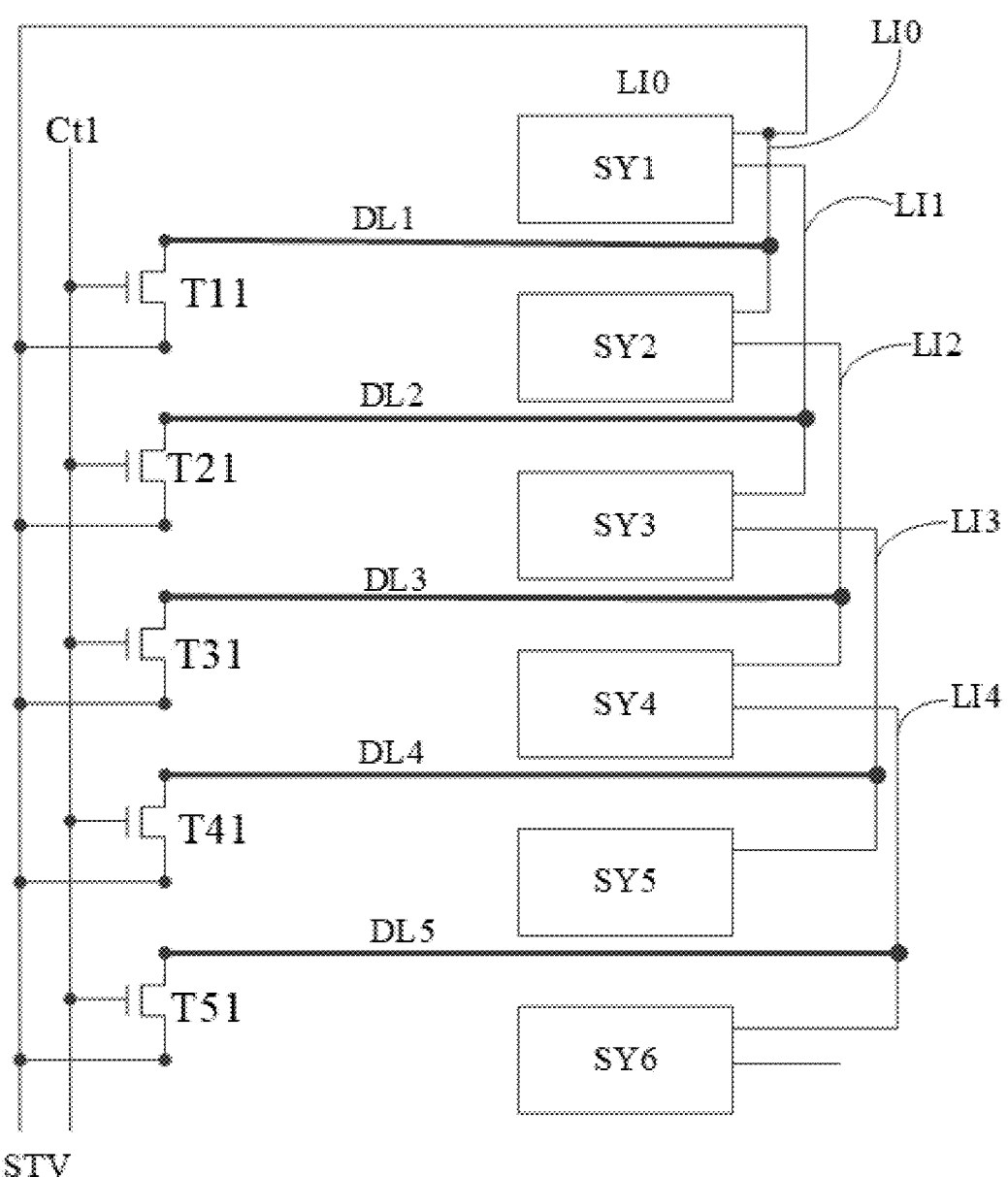
FIG. 10A is a structural diagram of a driving module in a display substrate according to at least one embodiment of the present disclosure.

In at least one embodiment of the display substrate shown in FIG. 10A, when the first three rows of driving circuits are cut off, T11 and T12 are cut off, and Ct1 controls T31 to turned on to control the electrical connection between the start voltage line STV and the second input cascade line LI2;

Furthermore, Ct1 needs to be cut off so that the gate electrodes of T41 and T51 are not electrically connected to Ct1.

Optionally, the driving module includes a plurality of connection lines; the connection lines are arranged between adjacent two stage of driving circuits;

The first terminal of the connection line is electrically connected to the first control circuit, and the second terminal of the connection line is electrically connected to the input cascade line; the first terminal and the second terminal are opposite terminals.

In specific implementation, the first terminal of the connection line may be electrically connected to the corresponding first control circuit, and the second terminal of the connection line may be electrically connected to the input cascade line, but is not limited to this.

For example, the first terminal may be the left terminal, and the second terminal may be the right terminal, but is not limited thereto.

Optionally, the first control circuit includes a first control transistor;

a gate electrode of the first control transistor is electrically connected to the first control line, a first electrode of the first control transistor is electrically connected to the start voltage line, and a second electrode of the first control transistor is electrically connected to the first terminal of the connection line.

As shown in FIG. 10A, based on at least one embodiment of the display substrate shown in FIG. 9, the first first control circuit may include a first first control transistor T11;

The gate electrode of T11 is electrically connected to the first control line Ct1, the source electrode of T11 is electrically connected to the left terminal of the first connection line DL1, and the drain electrode of T11 is electrically connected to the start voltage line STV;

The right terminal of the first connection line DL1 is electrically connected to the start voltage input line LI0;

The second first control circuit includes a second first control transistor T21;

The gate electrode of the second first control transistor T21 is electrically connected to the first control line Ct1, and the source electrode of the second first control transistor T21 is electrically connected to the left terminal of the second connection line DL2, the drain electrode of the second first control transistor T21 is electrically connected to the start voltage line STV;

The right terminal of the second connection line DL2 is electrically connected to the first input cascade line LI1;

The third first control circuit includes a third first control transistor T31;

The gate electrode of the third first control transistor T31 is electrically connected to the first control line Ct1, and the source electrode of the third first control transistor T31 is electrically connected to the left terminal of the third connection line DL3, the drain electrode of the third first control transistor T31 is electrically connected to the start voltage line STV;

The right terminal of the third connection line DL3 is electrically connected to the second input cascade line LI2;

The fourth first control circuit includes a fourth first control transistor T41;

The gate electrode of the fourth first control transistor T41 is electrically connected to the first control line Ct1, and the source electrode of the fourth first control transistor T41 is electrically connected to the left terminal of the fourth connection line DL4, the drain electrode of the fourth first control transistor T41 is electrically connected to the start voltage line STV;

The right terminal of the fourth connection line DL4 is electrically connected to the third input cascade line LI3;

The fifth first control circuit includes a fifth first control transistor T51;

The gate electrode of the fifth first control transistor T51 is electrically connected to the first control line Ct1, and the source electrode of the fifth first control transistor T51 is electrically connected to the left terminal of the fifth connection line DL5, the drain electrode of the fifth first control transistor T51 is electrically connected to the start voltage line STV;

The right terminal of the fifth connection line DL5 is electrically connected to the fourth input cascade line LI4.

In at least one embodiment of the display substrate shown in FIG. 10A, all control transistors are n-type transistors, but are not limited to this.

Figure 10B:
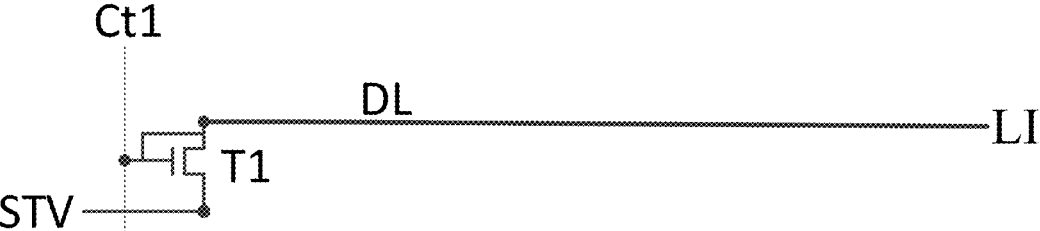
FIG. 10B is a structural diagram of a control module in a display substrate according to at least one embodiment of the present disclosure.

As shown in FIG. 10B, a control sub-module included in the control module may include a first control transistor T1;

The gate electrode of the first control transistor T1 is electrically connected to the first control line Ct1, the first electrode of the first control transistor T1 is electrically connected to the left terminal of the connection line DL, and the second electrode of the first control transistor T1 is electrically connected to the start voltage line STV;

The right terminal of the connection line DL is electrically connected to the input cascade line LI.

In at least one embodiment of the present disclosure, the connection line included in the driving module penetrates the clock signal line included in the driving circuit, the first driving circuit portion and the line collection portion in a direction from away from the display area to close to the display area.

Optionally, the display substrate includes a first metal layer and an electrode layer sequentially arranged in a direction away from the base substrate;

The connection line includes a first line portion formed on the electrode layer and a second line portion formed on the first metal layer; the first line portion and the second line portion are electrically connected;

At least part of the first line portion is provided in the clock signal line area, the first driving circuit portion and the line collection portion; the clock signal line area is an area where the plurality of clock signal lines are provided;

At least part of the second line portion is provided on the line collection portion.

In at least one embodiment of the present disclosure, the electrode layer may be an indium tin oxide (ITO) layer, and the first metal layer may be a source-drain metal layer, but is not limited thereto.

In specific implementation, the connection line may include a first line portion and a second line portion, the first line portion is formed on the electrode layer, and the second line portion is formed on the first metal layer; at least part of the first line portion is provided on the clock signal line area, the first driving circuit portion and the line collection portion, at least part of the second line portion is provided in the line collection portion, but is not limited to this.

In at least one embodiment of the present disclosure, the display panel includes an electrode layer and a first metal layer arranged on one side of the base substrate;

The connection line is formed by the electrode layer or the first metal layer.

In specific implementation, the connection lines may also be routed in a single layer, and the connection lines may be formed on the electrode layer or the first metal layer.

Optionally, the driving circuit includes an input circuit; the input circuit includes a control terminal, a first terminal and a second terminal;

The control terminal of the input circuit is electrically connected to the input terminal, and the second terminal of the input circuit is electrically connected to the pull-up node;

The input circuit is used to control the potential of the pull-up node under the control of an input signal provided by the input terminal.

In at least one embodiment of the present disclosure, the first terminal of the input circuit may be electrically connected to the input terminal; or, the first terminal of the input circuit may not be electrically connected to the input terminal.

Optionally, the input circuit includes a first transistor;

The gate electrode of the first transistor is electrically connected to the first input terminal, the first electrode of the first transistor is electrically connected to the second input terminal, and the second electrode of the first transistor is electrically connected to the pull-up node;

The first input terminal and the second input terminal may be electrically connected or not.

In specific implementation, the first input terminal and the second input terminal may both be the adjacent previous stage of driving signal output terminals, or the first input terminal may be the adjacent previous stage of the carry signal output terminal, the second output terminal may be an adjacent previous stage of driving signal output terminal, but is not limited to this.

In at least one embodiment of the present disclosure, the input circuit may include a first transistor;

a gate electrode of the first transistor is electrically connected to the input terminal, a first electrode of the first transistor is electrically connected to the high voltage terminal, a the second electrode of the first transistor is electrically connected to the pull-up node.

Optionally, the gate electrode of the first transistor is formed on the second metal layer, and the first electrode of the first transistor is formed on the first metal layer;

The gate electrode of the first transistor is electrically connected to the first connection line portion formed on the second metal layer;

The first electrode of the first transistor is electrically connected to the second connection line portion formed in the second metal layer through a via hole;

The connection line includes a third connection line portion formed on the electrode layer and a fourth connection line portion formed on the first metal layer; the third connection line portion and the fourth connection line portion are electrically connected;

There is an overlapping area between the orthographic projection of the third connection line portion on the base substrate and the orthographic projection of the first connection line portion on the base substrate; there is an overlapping area between an orthographic projection of the fourth connection line portion on the base substrate and an orthographic projection of the second connection line portion on the base substrate.

In at least one embodiment of the present disclosure, the second metal layer may be a gate metal layer, but is not limited thereto.

In at least one embodiment of the present disclosure, the first connection line portion is electrically connected to an input cascade line provided in the line collection area, and/or the second connection line portion is electrically connected to an input cascade line provided in the line collection area.

Figure 11:
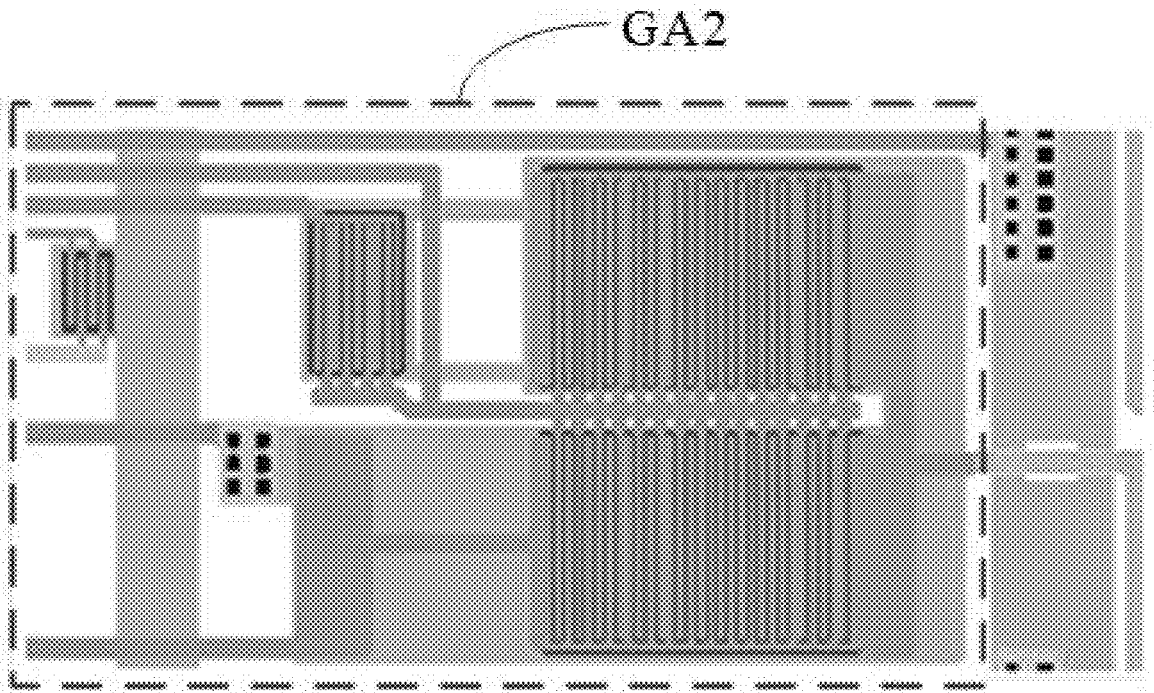
FIG. 11 is a layout diagram of the second driving circuit portion in the driving module shown in FIG. 5B.

In FIG. 11, the one labeled GA2 is the second driving circuit portion. FIG. 11 is a layout diagram of the second driving circuit portion GA2; the layout diagram shown in FIG. 11 corresponds to the second driving circuit portion of the driving module shown in FIG. 5B.

Optionally, the second driving circuit portion includes an output transistor in the driving circuit;

The first driving circuit portion includes a pull-up node control sub-circuit, a pull-down node control sub-circuit and an output reset sub-circuit; the pull-up node control sub-circuit is used to control the potential of the pull-up node, and the pull-down node control sub-circuit is used to control the potential of the pull-down node, and the output reset sub-circuit is used to reset the driving signal under the control of the potential of the pull-down node.

In specific implementation, the second driving circuit portion may include a first output transistor and a second output transistor;

The gate electrode of the first output transistor is electrically connected to the pull-up node, the first electrode of the first output transistor is electrically connected to the output clock signal line, and the second electrode of the first output transistor is electrically connected to the current stage of the driving signal output terminal;

The gate electrode of the second output transistor is electrically connected to the pull-up node, the first electrode of the second output transistor is electrically connected to the output clock signal line, and the second electrode of the second output transistor is connected to the current stage of carry signal output terminal.

Figure 12:
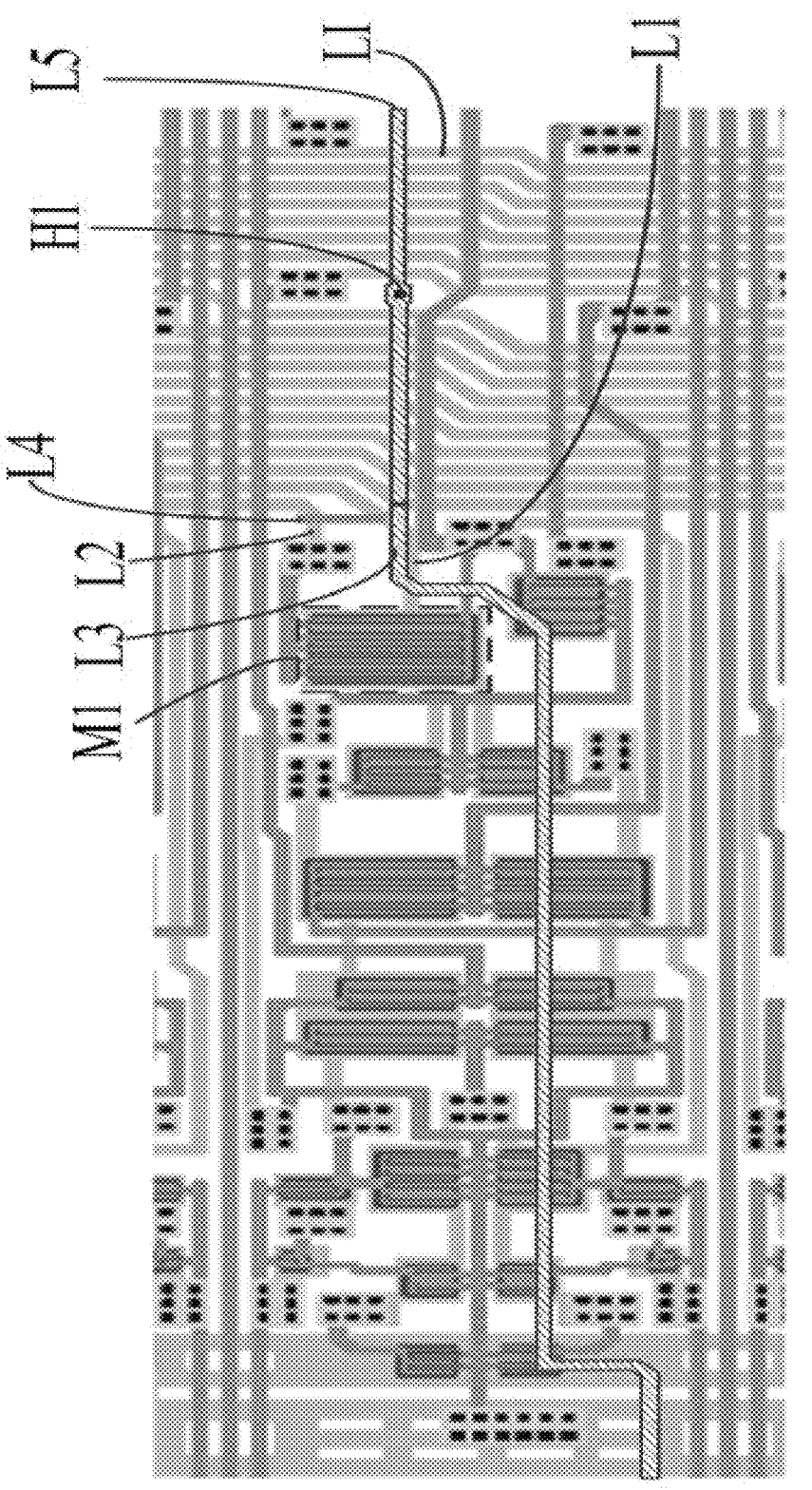
FIG. 12 is a layout diagram of the first driving circuit portion and the line collection portion of the driving module included in the display substrate according to at least one embodiment of the present disclosure.
Figure 13:
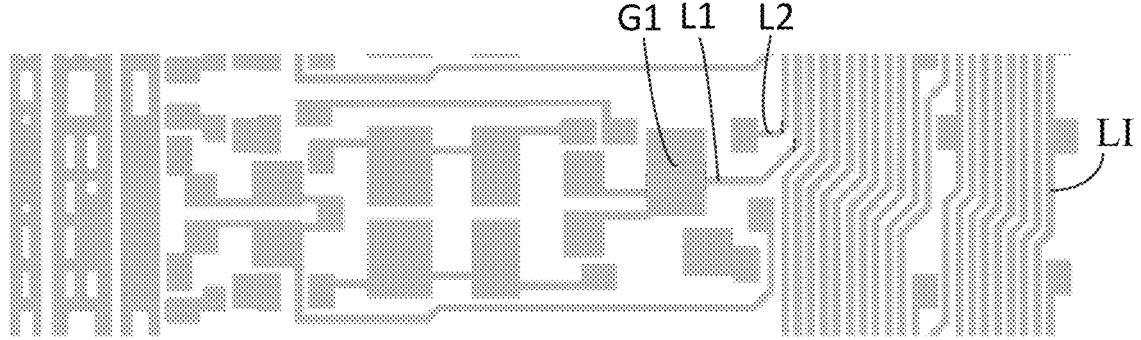
FIG. 13 is a layout diagram of the gate metal layer in FIG. 12.
Figure 14:
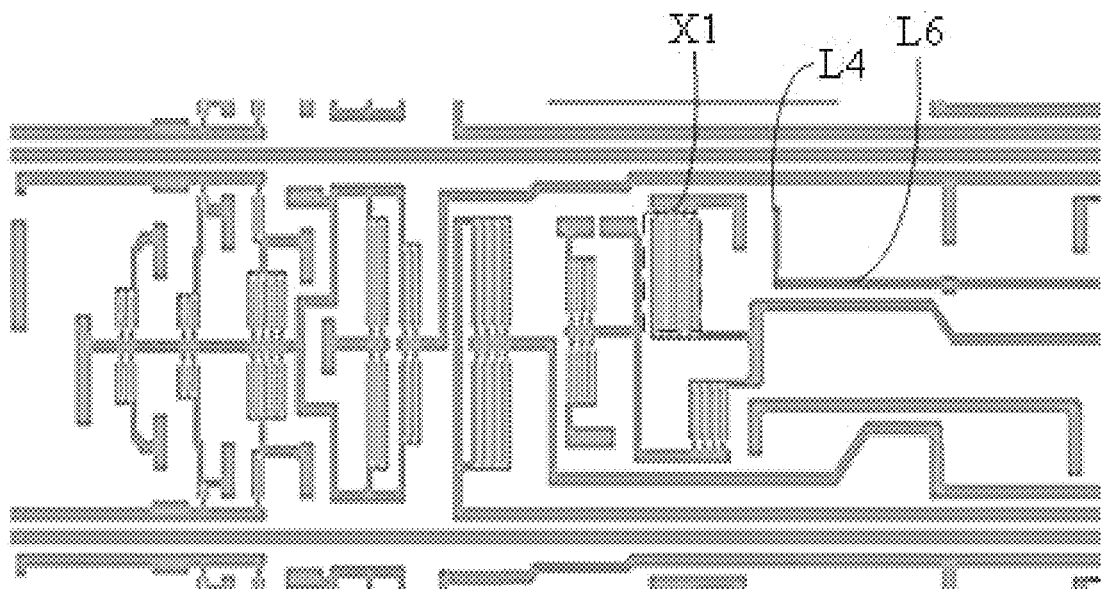
FIG. 14 is a layout diagram of the source-drain metal layer in FIG. 12.
Figure 15:
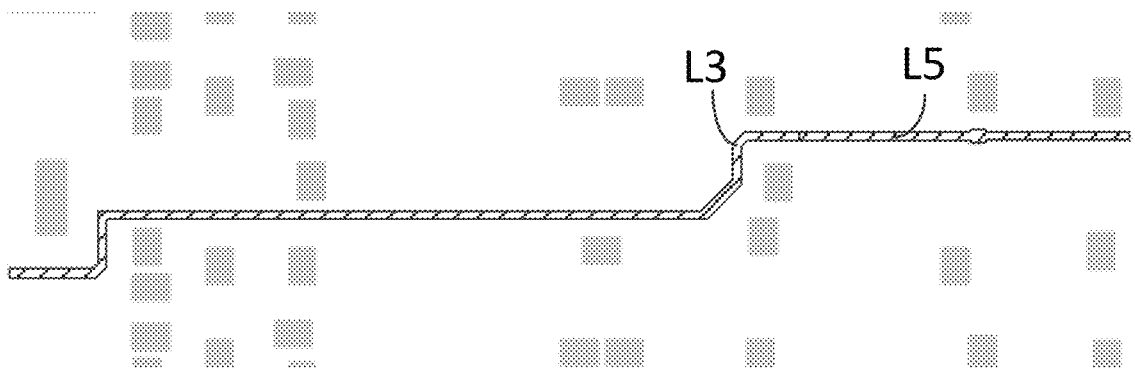
FIG. 15 is a layout diagram of the electrode layer in FIG. 12.

FIG. 12 is a layout diagram of the first driving circuit portion and the line collection portion of the driving module included in the display substrate according to at least one embodiment of the present disclosure;

FIG. 13 is a layout diagram of the gate metal layer in FIG. 12;

FIG. 14 is a layout diagram of the source-drain metal layers in FIG. 12;

FIG. 15 is a layout diagram of the electrode layer in FIG. 12.

Figure 16:
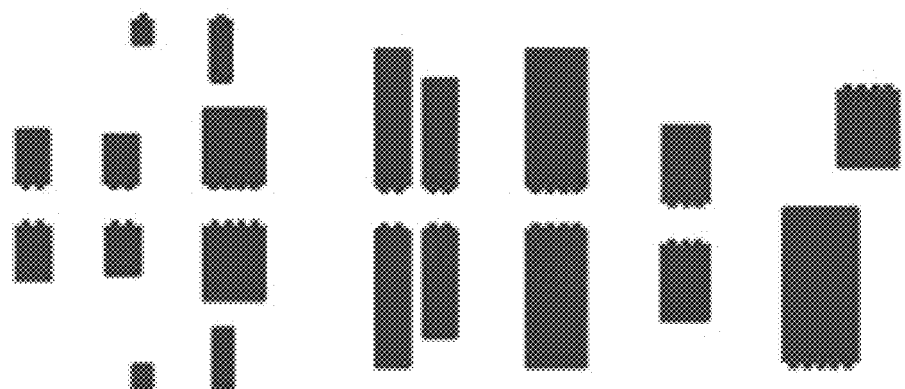
FIG. 16 is a layout diagram of the active layer in FIG. 12.
Figure 17:
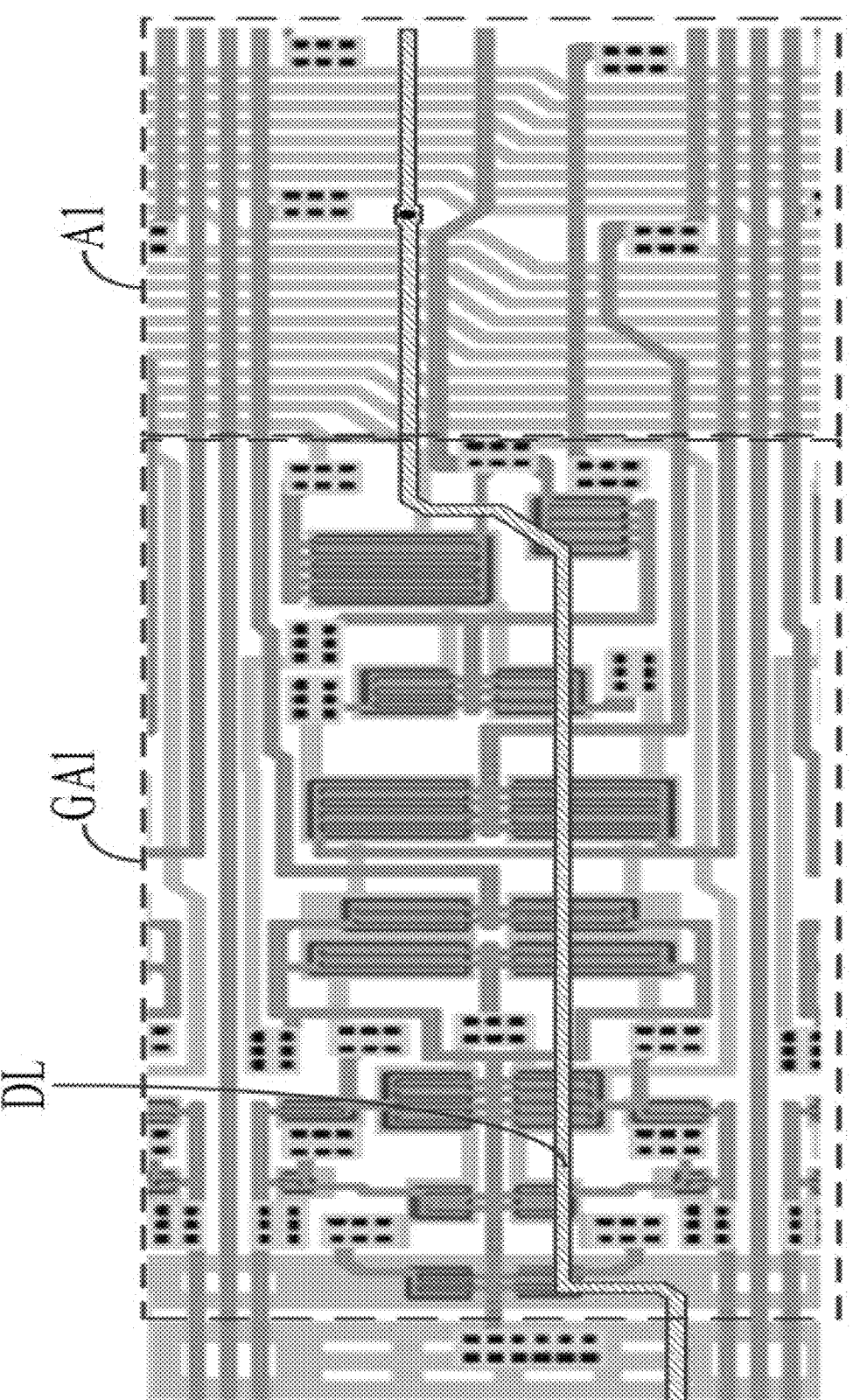
FIG. 17 is a schematic diagram showing labels for the first driving circuit portion, the line collection portion and the connection lines added on the basis of FIG. 12.

FIG. 16 is a layout diagram of the active layer in FIG. 12;

FIG. 17 is a schematic diagram showing labels for the first driving circuit portion, the line collection portion and the connection lines added based on FIG. 12.

In FIG. 17, the one labeled GA1 is the first driving circuit portion, the one labeled A1 is the collection line portion, and the one labeled DL is the connection line.

Figure 18:
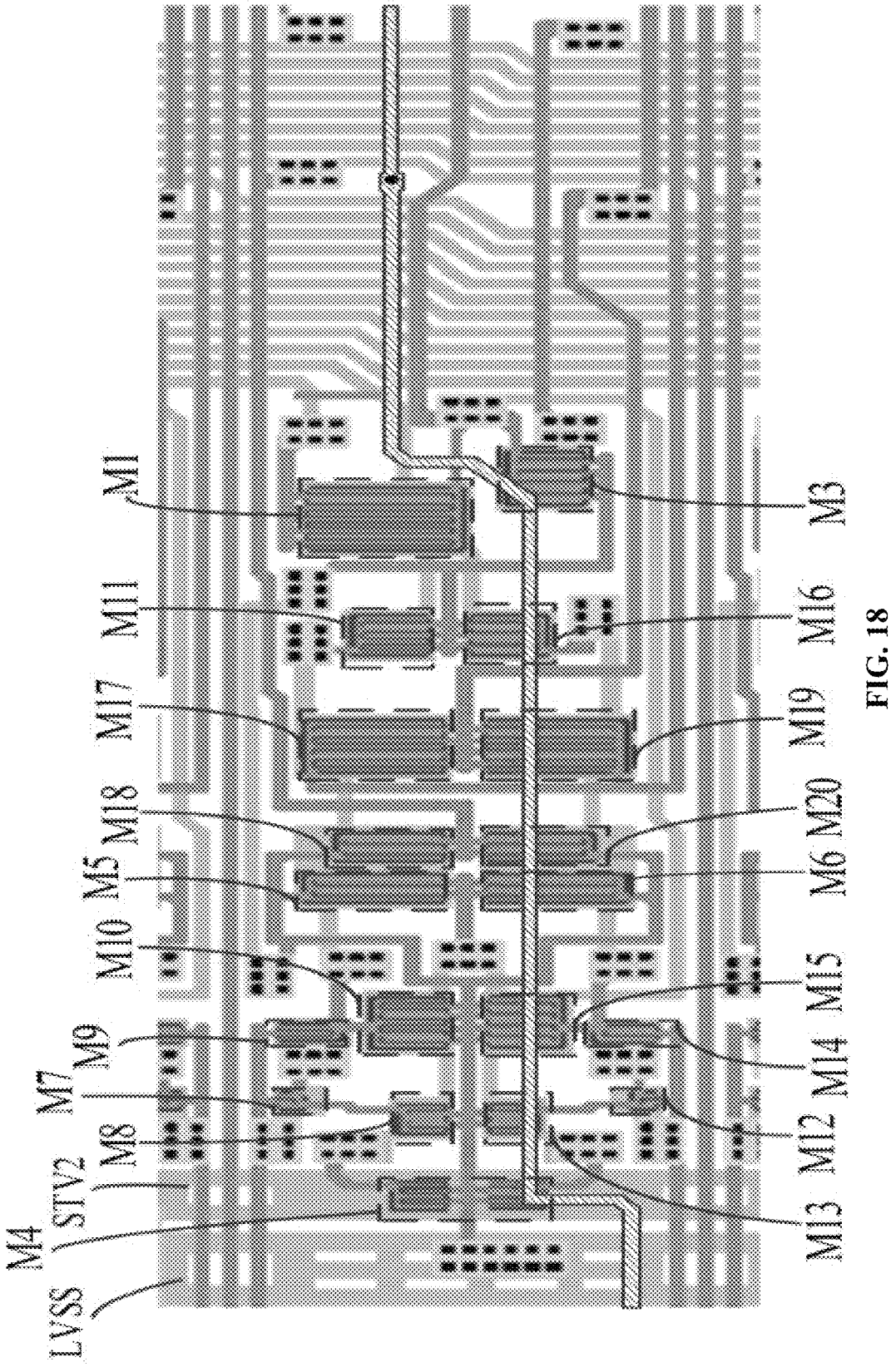
FIG. 18 is a schematic diagram showing labels for each transistor added on the basis of FIG. 12.

FIG. 18 is a schematic diagram showing labels for each transistor added based on FIG. 12.

In at least one embodiment of the present disclosure, the driving module is arranged on the base substrate, and the gate metal layer, the active layer, the source-drain metal layer and the electrode layer are sequentially arranged in a direction away from the base substrate.

The layout diagram shown in FIG. 12 corresponds to the first driving circuit portion and the line collection portion of the driving module shown in FIG. 5B.

As shown in FIG. 12 and FIG. 13, the gate electrode G1 of the first transistor M1 is formed on the gate metal layer; the first electrode of the first transistor M1 and the second electrode of the first transistor M1 are formed on the source-drain metal layer. The gate electrode G1 of the first transistor M1 is electrically connected to the first connection line portion L1 formed on the gate metal layer. The first electrode of the first transistor M1 is electrically connected to the second connection line portion L2 formed on the gate metal layer through a via hole. Optionally, through the deposited electrode layer, such as an ITO (indium tin oxide) layer, the electrical connection between the first electrode of the first transistor M1 and the second connection line portion L2 are realized. That is, the electrode layer is equivalent to a bridge structure and is filled in the via hole to connect the gate metal layer and the source-drain metal layer. The connection line includes a third connection line portion L3 formed on the electrode layer, and a fourth connection line portion L4 formed on the source-drain metal layer. As shown in FIG. 14, the one labeled X1 is the electrode portion of M1, the electrode portion X1 of M1 includes the first electrode and the second electrode of M1, the first electrode is one of the source electrode and the drain electrode, the second electrode is the other one of the source electrode and the drain electrode. Referring to FIGS. 12 to 14, in this case, optionally, when the connection line overlaps the first connection line portion L1 and the second connection line portion L2, when it is necessary to transmit the start signal provided by the STV, the transmission of the start signal to the input transistor (first transistor M1) of the gate driving circuit is realized through welding at the overlapping area.

In FIG. 13, the one labeled G1 is the gate electrode of M1.

As shown in FIG. 12, there is an overlapping area between the orthographic projection of the third connection line portion L3 on the base substrate and the orthographic projection of the first connection line portion L1 on the base substrate, there is an overlapping area between the orthographic projection of the fourth connection line portion L4 on the base substrate and the orthographic projection of the second connection line portion L2 on the base substrate.

In at least one embodiment of the present disclosure, there is an overlapping area between the orthographic projection of the fourth connection line portion L4 on the base substrate and the orthographic projection of the second connection line portion L2 on the base substrate, in actual operation, the fourth connection line portion L4 and the second connection line portion L2 can be connected through welding, so that the start voltage line is electrically connected to the first electrode of M1.

The display substrate according to at least one embodiment of the present disclosure may further include a fifth connection line portion and a sixth connection line portion;

The fifth connection line portion is formed on the electrode layer, and the fifth connection line portion is connected to the third connection line portion;

The sixth connection line portion is formed on the first metal layer, and the sixth connection line portion is connected to the fourth connection line portion;

The fifth connection line portion and the sixth connection line portion are electrically connected.

In specific implementation, since the thickness of the electrode layer is thin, the fifth connection line portion formed on the electrode layer and the sixth connection line portion formed on the first metal layer can be used in the line collection area. An orthographic projection of the fifth connection line portion on the base substrate may at least partially overlap an orthographic projection of the sixth connection line portion on the base substrate.

As shown in FIGS. 12 to 18, the display substrate according to at least one embodiment of the present disclosure further includes a fifth connection line portion L5 and a sixth connection line portion L6;

As shown in FIG. 15, the fifth connection line portion L5 is formed on the electrode layer; the fifth connection line portion L5 and the third connection line portion L3 are connected. Optionally, the fifth connection line portion L5 and the third connection line portion L3 are arranged at the same layer and made of the same material;

As shown in FIG. 14, the sixth connection line portion L6 is formed on the source-drain metal layer; the sixth connection line portion L6 is connected to the fourth connection line portion L4. Optionally, the sixth connection line portion L6 and the fourth connection line portion L4 are arranged at the same layer and made of the same material;

As shown in FIGS. 12 to 18, the fifth connection line portion L5 and the sixth connection line portion L6 are electrically connected through a first via hole H1, and the first via hole H1 is provided on the insulating layer between the fifth connection line portion L5 and the sixth connection line portion L6, when the fifth connection line portion L5 is deposited, it will fall on the first via hole H1, and then the fifth connection line portion L5 and the sixth connection line portion L6 are electrically connected through the first via hole H1.

In at least one embodiment shown in FIGS. 12 to 18, the fifth connection line portion L5 and the sixth connection line portion L6 may both be provided in the line collection area A1, but are not limited thereto.

In FIG. 18, the one labeled STV2 is the start signal line, and the one labeled LVSS is the second low voltage line;

The one labeled M1 is the first transistor, the one labeled M3 is the third transistor, the one labeled M4 is the fourth transistor, the one labeled M5 is the fifth transistor, the one labeled M6 is the sixth transistor, the one labeled M7 is the seventh transistor, the one labeled M8 is the eighth transistor, the one labeled M9 is the ninth transistor, the one labeled M10 is the tenth transistor, the one labeled M11 is the eleventh transistor, the one labeled M12 is the twelfth transistor, the one labeled M13 is the thirteenth transistor, the one labeled M14 is the fourteenth transistor, the one labeled M15 is the fifteenth transistor, the one labeled M16 is the sixteenth transistor, and the one labeled M17 is the seventeenth transistor, the one labeled M18 is the eighteenth transistor, the one labeled M19 is the nineteenth transistor, and the one labeled M20 is the twentieth transistor.

In at least one embodiment of the present disclosure, STV is used to provide a start signal for the driving module included in the display panel, and STV2 is used to provide a total reset signal for the driving module. The total reset signal can be a control signal for resetting the pull-up node PU in the driving circuit in the display panel before the display starts or before the start of one frame time.

In at least one embodiment shown in FIG. 12, when the driving circuit is an nth stage of driving circuit, the input cascade line LI is electrically connected to the (n−j)th stage of driving circuit output terminal, and n and j are positive integers.

In specific implementation, when the driving module is electrically connected to twelve clock signal lines, j may be 6, or j may be 5, but is not limited to this; j may also be other positive integers.

The display substrate according to at least one embodiment of the present disclosure further includes a fifth connection line portion;

The fifth connection line portion is formed on the electrode layer, and the fifth connection line portion communicates with the third connection line portion.

In specific implementation, the display substrate may further include a fifth connection line portion formed on the electrode layer, and the fifth connection line portion is connected to the third connection line portion. That is, in at least one embodiment shown in FIGS. 12 to 18, the sixth connection line portion formed on the source-drain metal layers may not be provided, and only the fifth connection line portion L5 formed on the electrode layer may be provided in the line collection area A1.

Optionally, the gate electrode of the first transistor is formed on the second metal layer, and the first electrode of the first transistor is formed on the first metal layer;

The gate electrode of the first transistor is electrically connected to the first connection line portion formed on the second metal layer;

The first electrode of the first transistor is electrically connected to the second connection line portion formed in the second metal layer through the via hole;

The connection line includes a third connection line portion formed on the electrode layer;

There is an overlapping area between the orthographic projection of the third connection line portion on the base substrate and the orthographic projection of the first connection line portion on the base substrate; there is an overlapping area between an orthographic projection of the third connection line portion on the base substrate and an orthographic projection of the second connection line portion on the base substrate.

In specific implementation, the gate electrode of the first transistor may be formed on the gate metal layer, and the first electrode of the first transistor may be formed on the source-drain metal layer;

The gate electrode of the first transistor is electrically connected to the first connection line portion formed on the gate metal layer, and the first electrode of the first transistor is electrically connected to the second connection line portion formed on the gate metal layer through the via hole;

The connection line includes a third connection line portion, and the third connection line portion is formed on the electrode layer.

Figure 19:
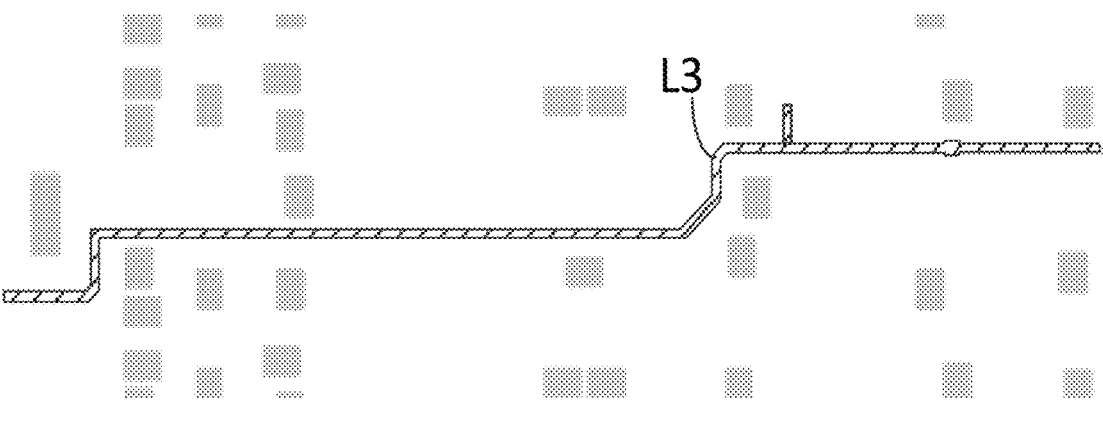
FIG. 19 is a layout diagram of the electrode layer in the first driving circuit portion of the driving module included in the display substrate according to at least one embodiment of the present disclosure.

In at least one embodiment of the present disclosure, as shown in FIG. 19, the connection line may include a third connection line portion L3 formed on the electrode layer. There is an overlapping area between the orthographic projection of the third connection line portion L3 on the base substrate and the orthographic projection of the first connection line portion L1 on the base substrate in FIG. 13; there is an overlapping portion between the orthographic projection of the third connection line portion L3 on the base substrate and the orthographic projection of the second connection line portion L2 on the base substrate in FIG. 13, that is, the connection line layers are all made of electrode layers.

In at least one embodiment of the present disclosure, the gate electrode of the first transistor and the first electrode of the first transistor are electrically connected;

There is an overlapping area between the orthographic projection of the connection line on the base substrate and the orthographic projection of the gate electrode of the first transistor on the base substrate; or, There is an overlapping area between the orthographic projection of the connection line on the base substrate and an orthographic projection of the first electrode of the first transistor on the base substrate.

During specific implementation, the gate electrode of the first transistor and the first electrode of the first transistor may be electrically connected to each other. In this way, the orthographic projection of the connection line on the base substrate may only overlap the orthographic projection of the gate electrode of the first transistor on the base substrate; or the orthographic projection of the connection line on the base substrate may only overlap the orthographic projection of the first electrode of the first transistor on the base substrate, the repair can be achieved.

Figure 20:
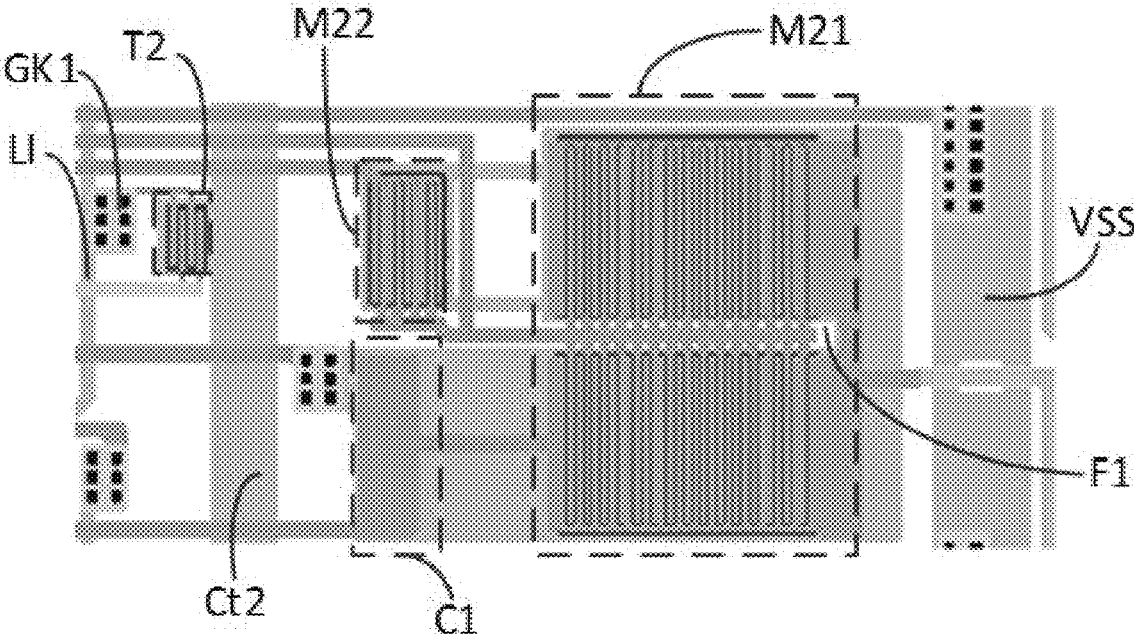
FIG. 20 is a layout diagram of the second driving circuit portion.

FIG. 20 is a layout diagram of the second driving circuit portion. FIG. 20 corresponds to at least one embodiment of the driving module shown in FIG. 5B.

In FIG. 20, the one labeled M21 is the twenty-first transistor, the one labeled M22 is the twenty-second transistor, the one labeled C1 is the first capacitor, and the one labeled F1 is the groove F1 provided between the first electrode of the transistor M21 and the second electrode of the twenty-first transistor M21. The groove F1 can prevent the first electrode of the transistor M21 from being connected or short-circuited with the second electrode of the transistor M21.

In FIG. 20, the one labeled VSS is the first low voltage line.

In FIG. 20, the one labeled T2 is the second control transistor, and the one labeled Ct2 is the second control line;

The gate electrode of T2 is electrically connected to the second control line Ct2. Optionally, the gate electrode of T2 and the second control line are integrally formed. The first electrode of T2 is electrically connected to the right terminal of the connection line DL in FIG. 17. The second electrode of T2 is electrically connected to the input cascade line LI in FIG. 12. The first electrode of T2 is set on the source-drain metal layer, and the connection line DL is set on the electrode layer. The first electrode of T2 and the right terminal of the connection line DL are electrically connected through the first via H1 (refer to FIG. 12). The specific location of the connection via hole can be determined according to the actual design and is not limited here. The second electrode of T2 is set on the source-drain metal layer, and the input cascade line LI is set on the gate metal layer. The electrical connection between the second electrode of T2 and the input cascade line LI in FIG. 12 can be achieved through via hole GK1. At the position corresponding to GK1, an electrode layer is provided on the side of the second electrode of T2 away from the input cascade line LI. The electrode layer realizes the electrical connection between the second electrode of T2 and the input cascade line LI through the via hole GK1.

Figure 21:
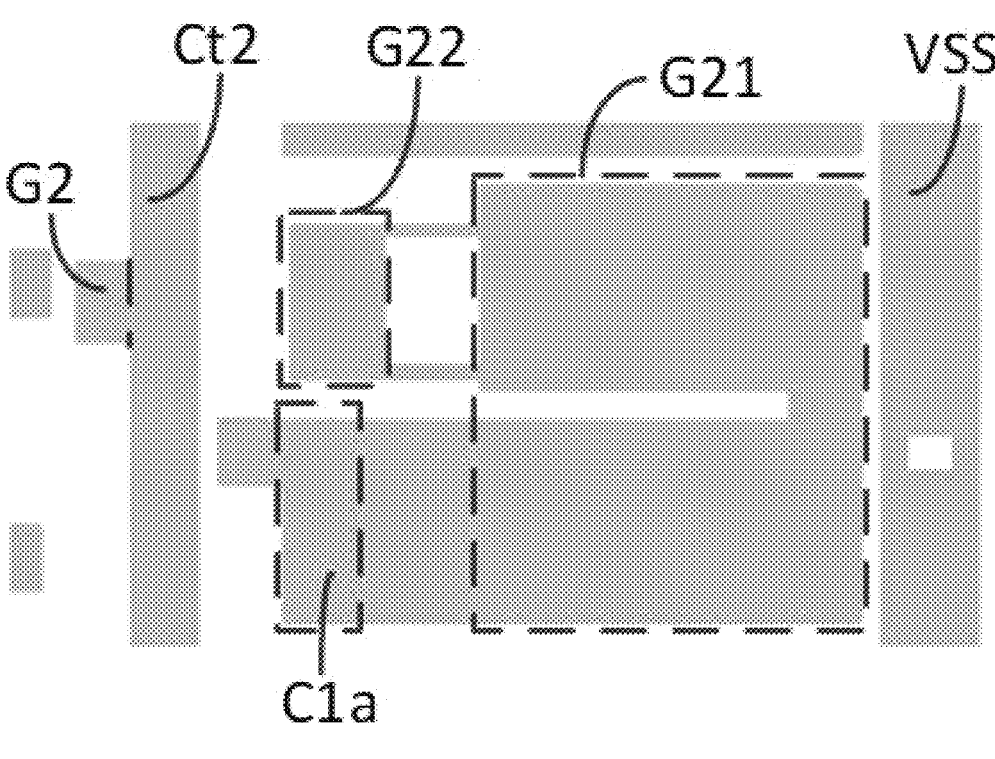
FIG. 21 is a layout diagram of the gate metal layer in FIG. 20.

FIG. 21 is a layout diagram of the gate metal layer in FIG. 20, in which G21 is the gate electrode of M21, G22 is the gate electrode of M22, and C1a is the first electrode plate of C1.

In FIG. 21, the one labeled G2 is the gate electrode of T2, and the one labeled Ct2 is the second control line.

As shown in FIG. 21, C1a and G21 are connected, and C1a and G21 are arranged on the same layer and made of the same material;

G2 and Ct2 are connected, and G2 and Ct2 are arranged on the same layer and made of the same material.

Figure 22:
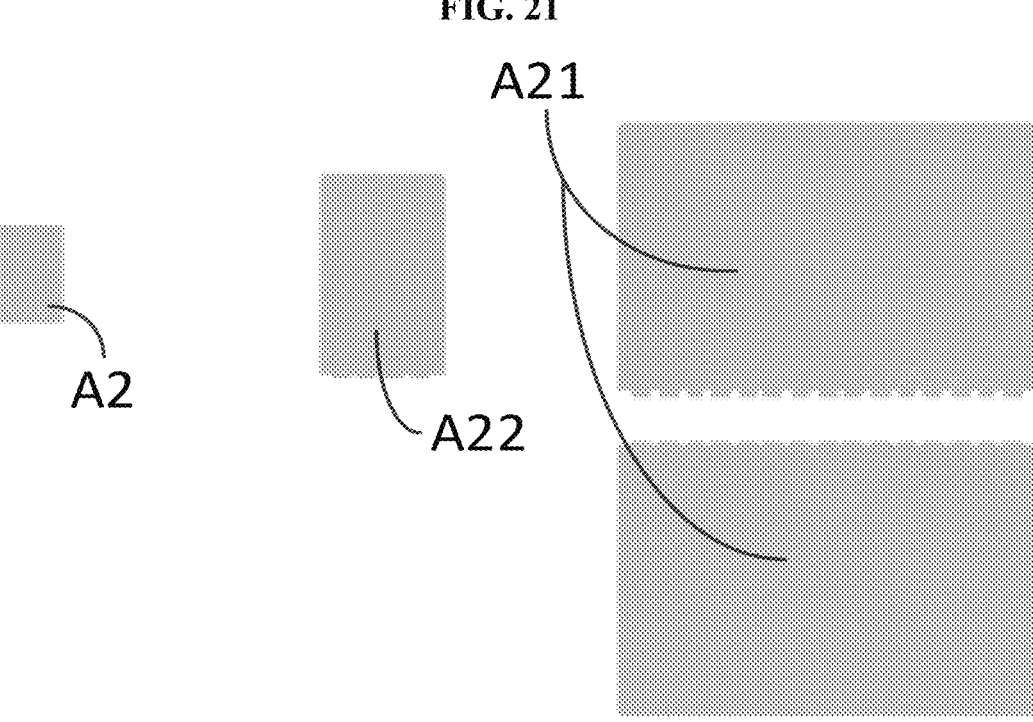
FIG. 22 is a layout diagram of the active layer in FIG. 20.

FIG. 22 is a layout diagram of the active layer in FIG. 20. In FIG. 22, the one labeled A21 is the active layer pattern of M21, the one labeled A22 is the active layer pattern of M22, and the one labeled A2 is the active layer pattern of M2.

Figure 23:
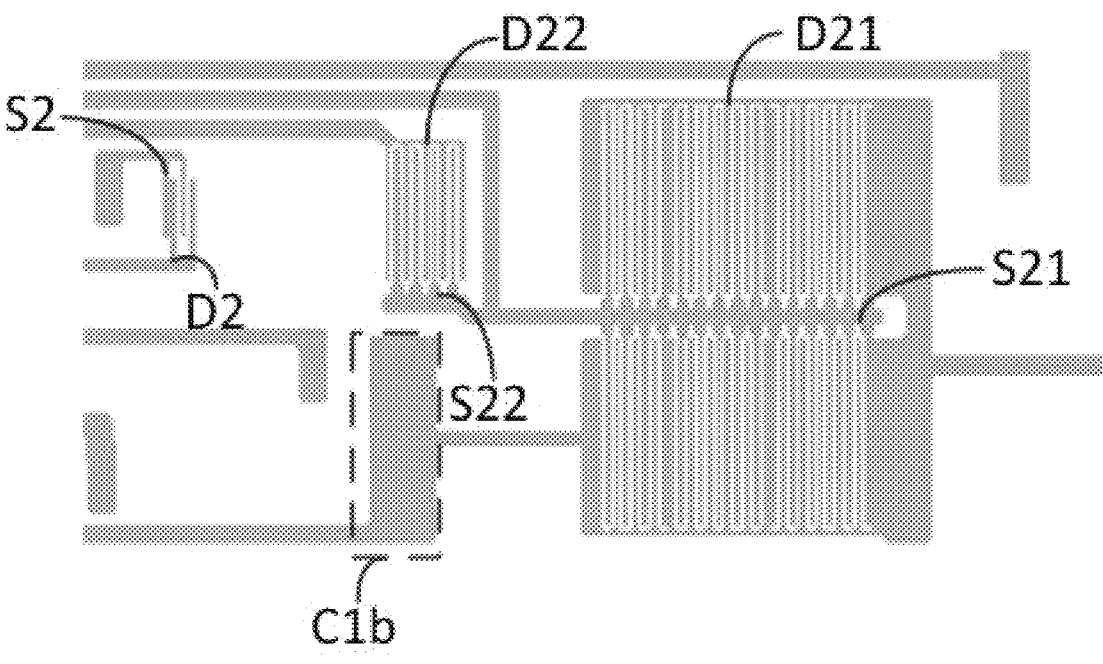
FIG. 23 is a layout diagram of the source-drain metal layer in FIG. 20.

FIG. 23 is a layout diagram of the source-drain metal layers in FIG. 20.

In FIG. 23, the one labeled S21 is the first electrode of M21, the one labeled D21 is the second electrode of M21, the one labeled S22 is the first electrode of M22, the one labeled D22 is the second electrode of M22, the one labeled S2 is the first electrode of T2, the one labeled D2 is the second electrode of T2; the one labeled C1b is the second electrode plate of C1, and C1b and the source-drain electrode layer are arranged at the same layer and made of a same material.

As shown in FIG. 23, C1b and D21 are connected.

Figure 24:
FIG. 24 is a layout diagram of the electrode layer in FIG. 20.

FIG. 24 is a layout diagram of the electrode layer in FIG. 20. The electrode layer on the left side of FIG. 24 is used to electrically connect the gate signal of M21 with the signal line corresponding to PU. The electrode layer on the right side of FIG. 24 is used to transmit the signal provided by a low-voltage line VSS to the noise reduction transistor in the driving circuit. For example, referring to FIG. 51, the first low-voltage line VSS is electrically connected to one electrode of M17 to reduce noise at the current stage of the driving signal output terminal GO.

Figure 25:
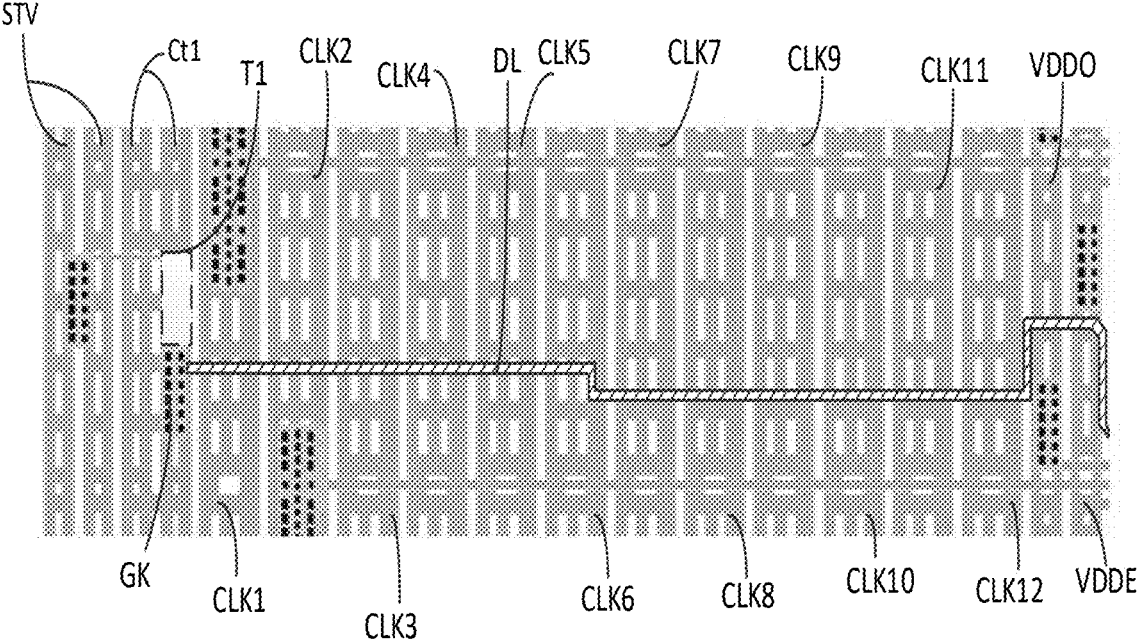
FIG. 25 is a layout diagram of each clock signal line of the driving module included in the display substrate according to at least one embodiment of the present disclosure.

FIG. 25 is a layout diagram of clock signal lines of the driving module included in the display substrate according to at least one embodiment of the present disclosure; FIG. 25 corresponds to at least one embodiment of the driving module shown in FIG. 5B.

In FIG. 25, the one labeled STV is the start voltage line. It should be noted that the number of start voltage lines can be one or more, and this is not limited. For example, it can be 2, and the driving circuits corresponding to odd-numbered rows is connected to one of the start voltage lines, and the driving circuit corresponding to the even-numbered row is connected to the other start voltage line. The drawing shows a start voltage line as an example. The one labeled Ct1 is the first control line, and the one labeled CLK1 is the first clock signal line, the one labeled CLK2 is the second clock signal line, the one labeled CLK3 is the third clock signal line, the one labeled CLK4 is the fourth clock signal line, the one labeled CLK5 is the fifth clock signal line, the one labeled CLK6 is the sixth clock signal line, the one labeled CLK7 is the seventh clock signal line, the one labeled CLK8 is the eighth clock signal line, the one labeled CLK9 is the ninth clock signal line, the one labeled CLK10 is the tenth clock signal line, the one labeled CLK11 is the eleventh clock signal line, and the one labeled CLK12 is the twelfth clock signal line;

The one labeled VDDO is the first control voltage line, and the one labeled VDDE is the second control voltage line;

The one labeled DL is the connection line.

In at least one embodiment of the present disclosure, the STV is used to provide a start signal for a driving module included in the display panel.

In FIG. 25, the one labeled T1 is the first control transistor;

The first control line Ct1 is multiplexed as the gate electrode of the first control transistor T1, and the gate electrode of the first control transistor T1 is electrically connected to the first electrode of the first control transistor T1; the first electrode of the first control transistor T1 is electrically connected to the left terminal of the connection line DL, and the second electrode of the first control transistor T1 is electrically connected to the start voltage line STV.

Figure 26:
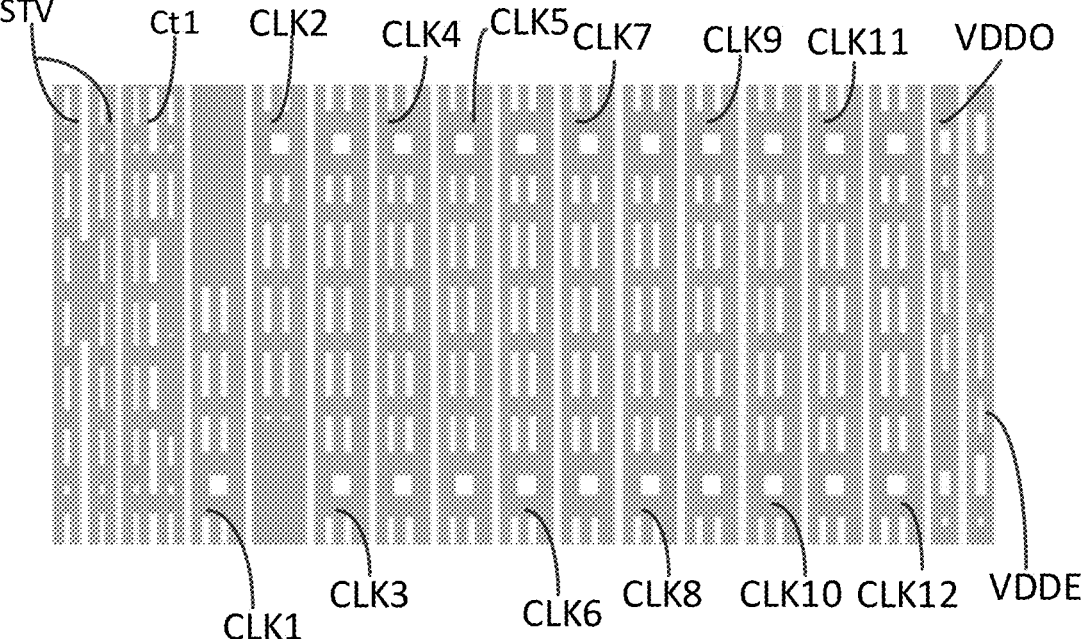
FIG. 26 is a layout diagram of the gate metal layer in FIG. 25.
Figure 27:
FIG. 27 is a layout diagram of the source-drain metal layers in FIG. 25.
Figure 28:
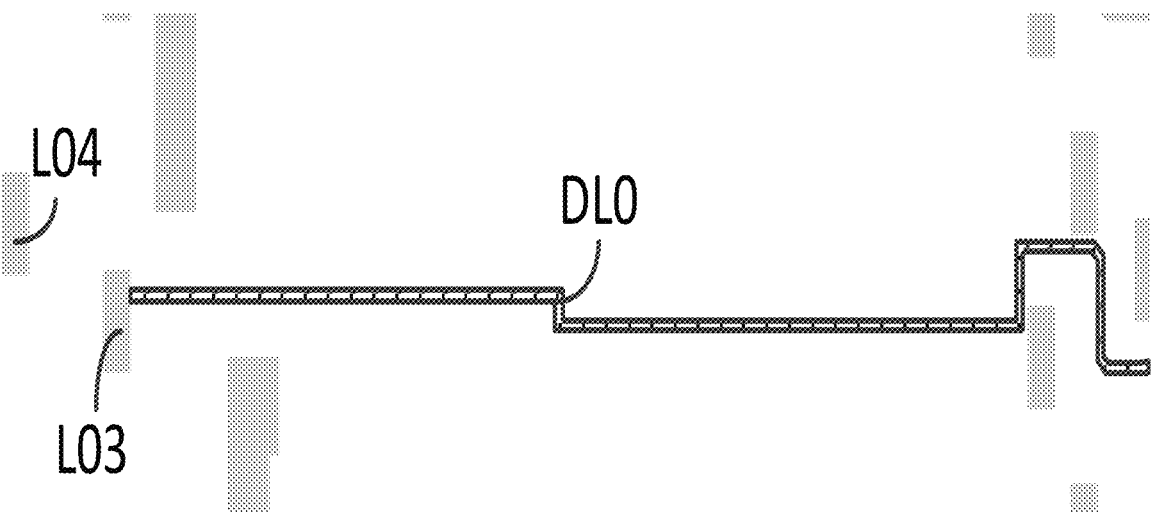
FIG. 28 is a layout diagram of the electrode layer in FIG. 25.
Figure 29:
FIG. 29 is a layout diagram of the active layer in FIG. 25.

FIG. 26 is a layout diagram of the gate metal layer in FIG. 25. FIG. 27 is a layout diagram of the source-drain metal layers in FIG. 25. FIG. 28 is a layout diagram of the electrode layer in FIG. 25. FIG. 29 is a layout diagram of the active layer in FIG. 25.

In FIG. 29, the one labeled A01 is the active layer of the first control transistor. It should be noted that the active layer in this case can be any one of an oxide semiconductor layer, an amorphous silicon layer or a low-temperature polysilicon layer, which is not limited.

In FIG. 27, the one labeled S01 is the first electrode of the first control transistor T1, and the one labeled D01 is the second electrode of the first control transistor T1;

The one labeled L01 is the first connection portion, and the one labeled L02 is the second connection portion;

The first connection portion L01 is electrically connected to the first electrode S01 of T1, and the second connection portion L02 is electrically connected to the second electrode D01 of T1.

In FIG. 28, the third connection portion is labeled L03, and the fourth connection portion is labeled L04.

As shown in FIGS. 25 to 29, the first connection portion L01 is electrically connected to the third connection portion L03 through the via hole, and the second connection portion L02 is electrically connected to the fourth connection portion L04 through the via hole;

The third connection portion L03 is electrically connected to the left terminal of the connection line DL; the third connection portion L03 is electrically connected to the first connection portion L01 and the gate electrode of the first control transistor T1 through via holes respectively, so that the first electrode S01 of the first control transistor T1 is electrically connected to the left terminal of the connection line DL, and the first electrode S01 of the first control transistor T1 is electrically connected to the gate electrode of the first control transistor T1; referring to FIG. 25, two columns of via holes GK are provided at the position adjacent to the first control transistor T1 and the first connection portion L01, the left column of via holes realize the electrical connection between the third connection portion L03 and the gate electrode of T1, and the right column of via holes realize the electrical connection between the third connection portion L03 and the gate electrode of T1. The overall electrical connection among the gate electrode of the transistor, the first electrode of the transistor and the connection line is realized. Here, the connection line and the third connection portion L03 can be provided on an electrode layer, for example, it can be an ITO (indium tin oxide) electrode layer, which can be provided on the same layer as the pixel electrode or the common electrode in the display area of the display panel.

The second connection portion L02 is electrically connected to the fourth connection portion L04 through a via hole, so that the second electrode D01 of the first control transistor T1 is electrically connected to the start voltage line STV.

Figure 30:
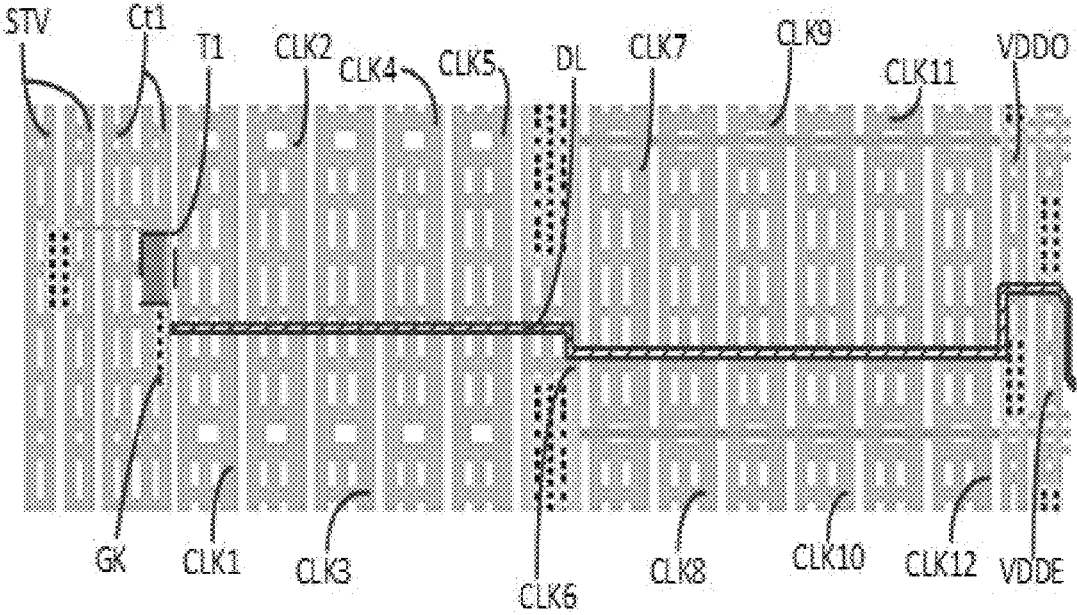
FIG. 30 is a layout diagram of each clock signal line of the driving module included in the display substrate according to at least one embodiment of the present disclosure.

FIG. 30 is a layout diagram of clock signal lines of the driving module included in the display substrate according to at least one embodiment of the present disclosure; FIG. 30 corresponds to at least one embodiment of the driving module shown in FIG. 6B.

Figure 31:
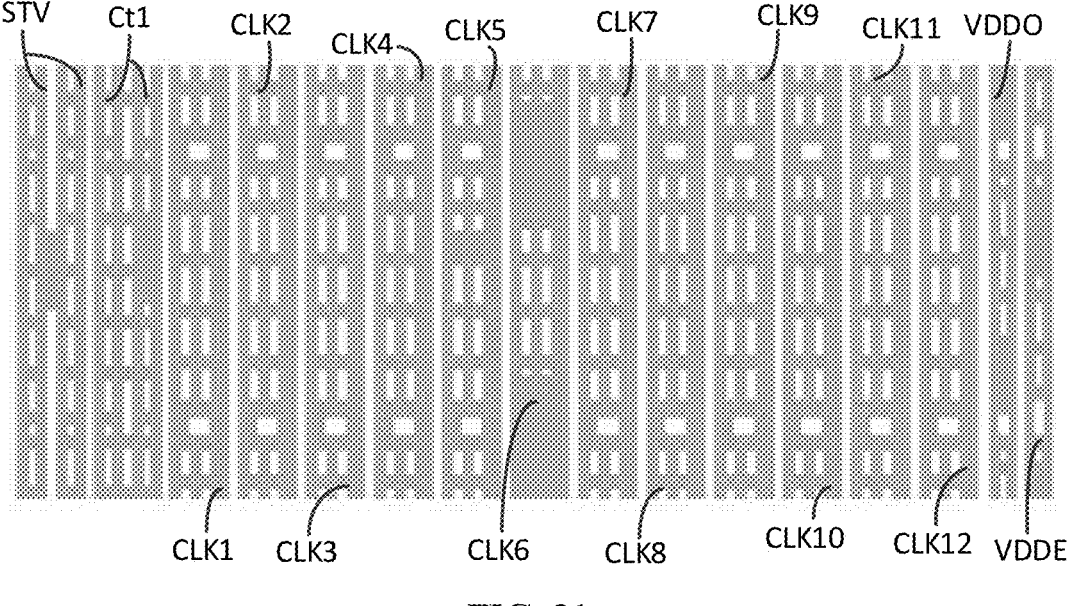
FIG. 31 is a layout diagram of the gate metal layer in FIG. 30.
Figure 32:
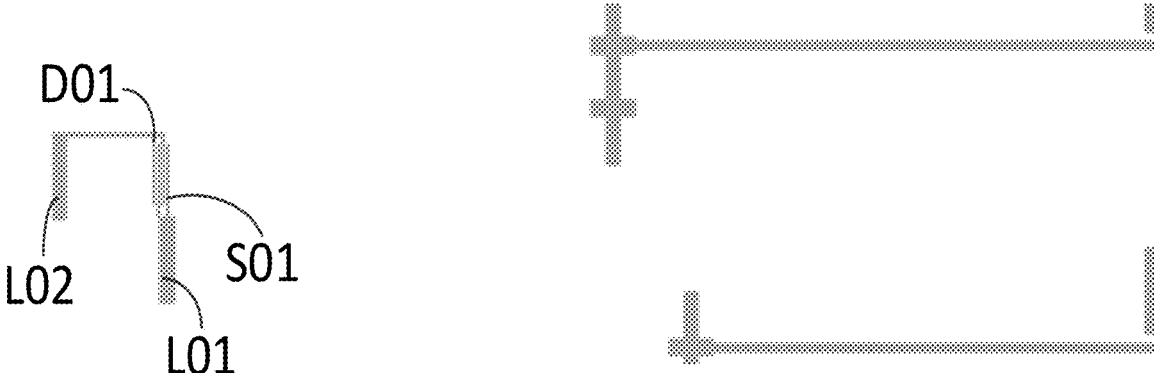
FIG. 32 is a layout diagram of the source-drain metal layers in FIG. 30.
Figure 33:
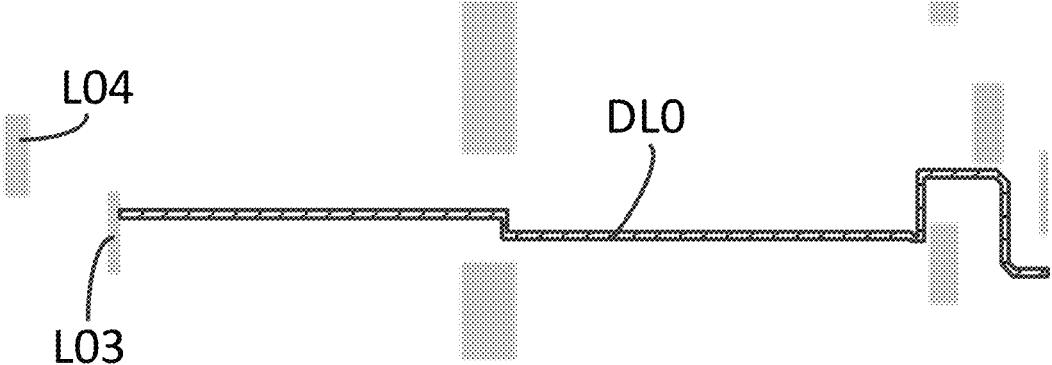
FIG. 33 is a layout diagram of the electrode layer in FIG. 30.
Figure 34:
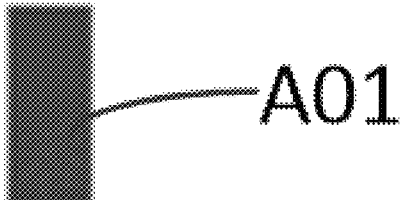
FIG. 34 is a layout diagram of the active layer in FIG. 30.

FIG. 31 is a layout diagram of the gate metal layer in FIG. 30. FIG. 32 is a layout diagram of the source-drain metal layers in FIG. 30. FIG. 33 is a layout diagram of the electrode layer in FIG. 30. FIG. 34 is a layout diagram of the active layer in FIG. 30.

In FIG. 30, the line labeled STV is the start voltage line, the line labeled Ct1 is the first control line, the line labeled CLK1 is the first clock signal line, the line labeled CLK2 is the second clock signal line, and the line labeled CLK3 is the third clock signal line, the one labeled CLK4 is the fourth clock signal line, the one labeled CLK5 is the fifth clock signal line, the one labeled CLK6 is the sixth clock signal line, and the one labeled CLK7 is the seventh clock signal line, the one labeled CLK8 is the eighth clock signal line, the one labeled CLK9 is the ninth clock signal line, the one labeled CLK10 is the tenth clock signal line, the one labeled CLK11 is the eleventh clock signal line, the one labeled CLK12 is the twelfth clock signal line; the one labeled VDDO is the first control voltage line, the one labeled VDDE is the second control voltage line; the one labeled DL is the connection line.

In FIG. 30, the one labeled T1 is the first control transistor;

The first control line Ct1 is multiplexed as the gate electrode of the first control transistor T1. The first electrode of the first control transistor T1 is electrically connected to the left terminal of the connection line DL. The second electrode of the first control transistor T1 is connected to the start voltage line STV.

As shown in FIG. 31, STV, Ct1, CLK1, CLK2, CLK3, CLK4, CLK5, CLK6, CLK7, CLK8, CLK9, CLK10, CLK11, CLK12, VDDO and VDDE are all formed on the gate metal layer.

In FIG. 32, the one labeled S01 is the first electrode of the first control transistor T1, and the one labeled D01 is the second electrode of the first control transistor T1;

The one labeled L01 is the first connection portion, and the one labeled L02 is the second connection portion;

The first connection portion L01 is electrically connected to the first electrode S01 of T1, and the second connection portion L02 is electrically connected to the second electrode D01 of T1.

In FIG. 33, the third connection portion is labeled L03, and the fourth connection portion is labeled L04.

As shown in FIGS. 30 to 34, the first connection portion L01 is electrically connected to the third connection portion L03 through the via hole GK, and the second connection portion L02 is electrically connected to the fourth connection portion L04 through the via hole GK. As shown in FIG. 30, a row of via holes GK are set to realize the electrical connection between the connecting line and the first connection portion L01;

The third connection portion L03 is electrically connected to the left terminal of the connection line DL; the third connection portion L03 is electrically connected to the first connection portion L01 through a via hole, so that the first electrode S01 of the first control transistor T1 is electrically connected to the left terminal of the connection line DL;

The second connection portion L02 is electrically connected to the fourth connection portion L04 through a via hole, so that the second electrode D01 of the first control transistor T1 is electrically connected to the start voltage line STV.

The layout diagram of the first driving circuit portion and the line collection portion in at least one embodiment of the driving module shown in FIG. 6B is shown in FIG. 12; the second driving circuit portion in at least one embodiment of the driving module shown in FIG. 6B is shown in FIG. 20.

Figure 35:
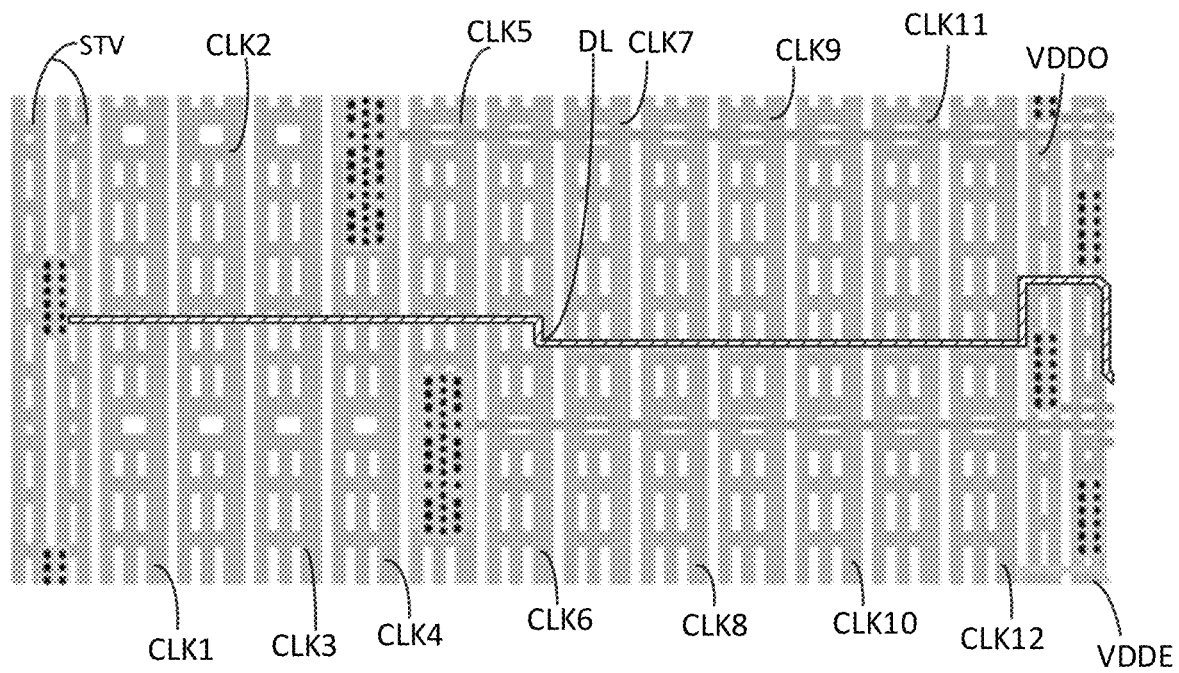
FIG. 35 is a layout diagram of each clock signal line of the driving module included in the display substrate according to at least one embodiment of the present disclosure.

FIG. 35 is a layout diagram of clock signal lines of the driving module included in the display substrate according to at least one embodiment of the present disclosure; FIG. 30 corresponds to at least one embodiment of the driving module shown in FIG. 8B.

Figure 36:
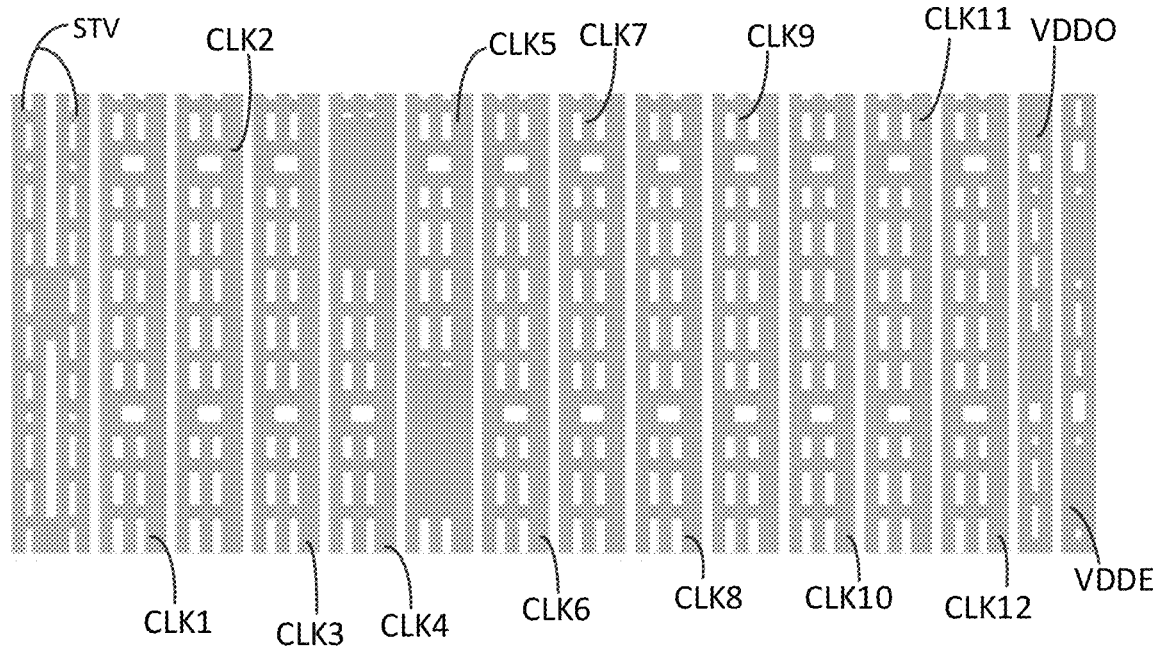
FIG. 36 is a layout diagram of the gate metal layer in FIG. 35.
Figure 37:
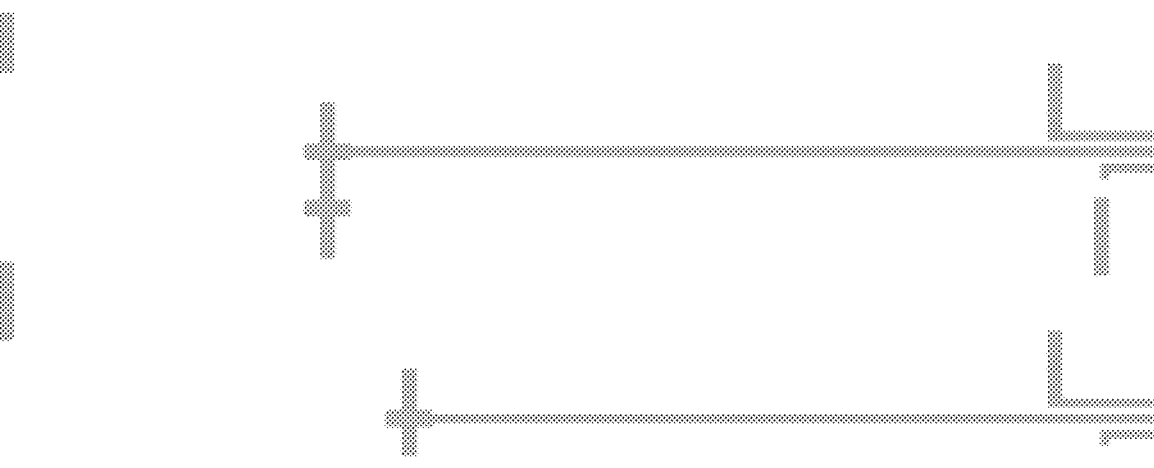
FIG. 37 is a layout diagram of the source-drain metal layers in FIG. 35.
Figure 38:
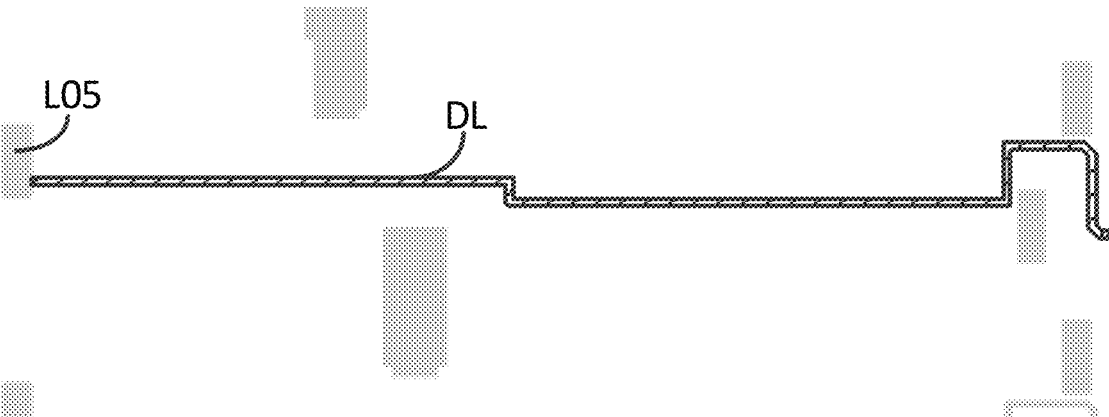
FIG. 38 is a layout diagram of the electrode layer in FIG. 35.

FIG. 36 is a layout diagram of the gate metal layer in FIG. 35, FIG. 37 is a layout diagram of the source-drain metal layers in FIG. 35, and FIG. 38 is a layout diagram of the electrode layer in FIG. 35.

In FIG. 35, the line labeled STV is the start voltage line, the line labeled Ct1 is the first control line, the line labeled CLK1 is the first clock signal line, the line labeled CLK2 is the second clock signal line, and the line labeled CLK3 is the third clock signal line, the one labeled CLK4 is the fourth clock signal line, the one labeled CLK5 is the fifth clock signal line, the one labeled CLK6 is the sixth clock signal line, and the one labeled CLK7 is the seventh clock signal line, the one labeled CLK8 is the eighth clock signal line, the one labeled CLK9 is the ninth clock signal line, the one labeled CLK10 is the tenth clock signal line, the one labeled CLK11 is the eleventh clock signal line, the one labeled CLK12 is the twelfth clock signal line; the one labeled VDDO is the first control voltage line, the one labeled VDDE is the second control voltage line; the one labeled DL is the connection line.

In FIG. 38, the one labeled DL is the connection line, and the one labeled L05 is the fifth connection portion;

The fifth connection portion L05 is connected to the connection line DL.

As shown in FIGS. 35 to 38, the fifth connection portion L05 is electrically connected to the start voltage line STV through the via hole, so that the left terminal of the connection line DL is electrically connected to the start voltage line.

The layout diagram of the first driving circuit portion and the line collection portion in at least one embodiment of the driving module shown in FIG. 8B is shown in FIG. 12; the second driving circuit portion in at least one embodiment of the driving module shown in FIG. 8B is shown in FIG. 20.

Figure 39:
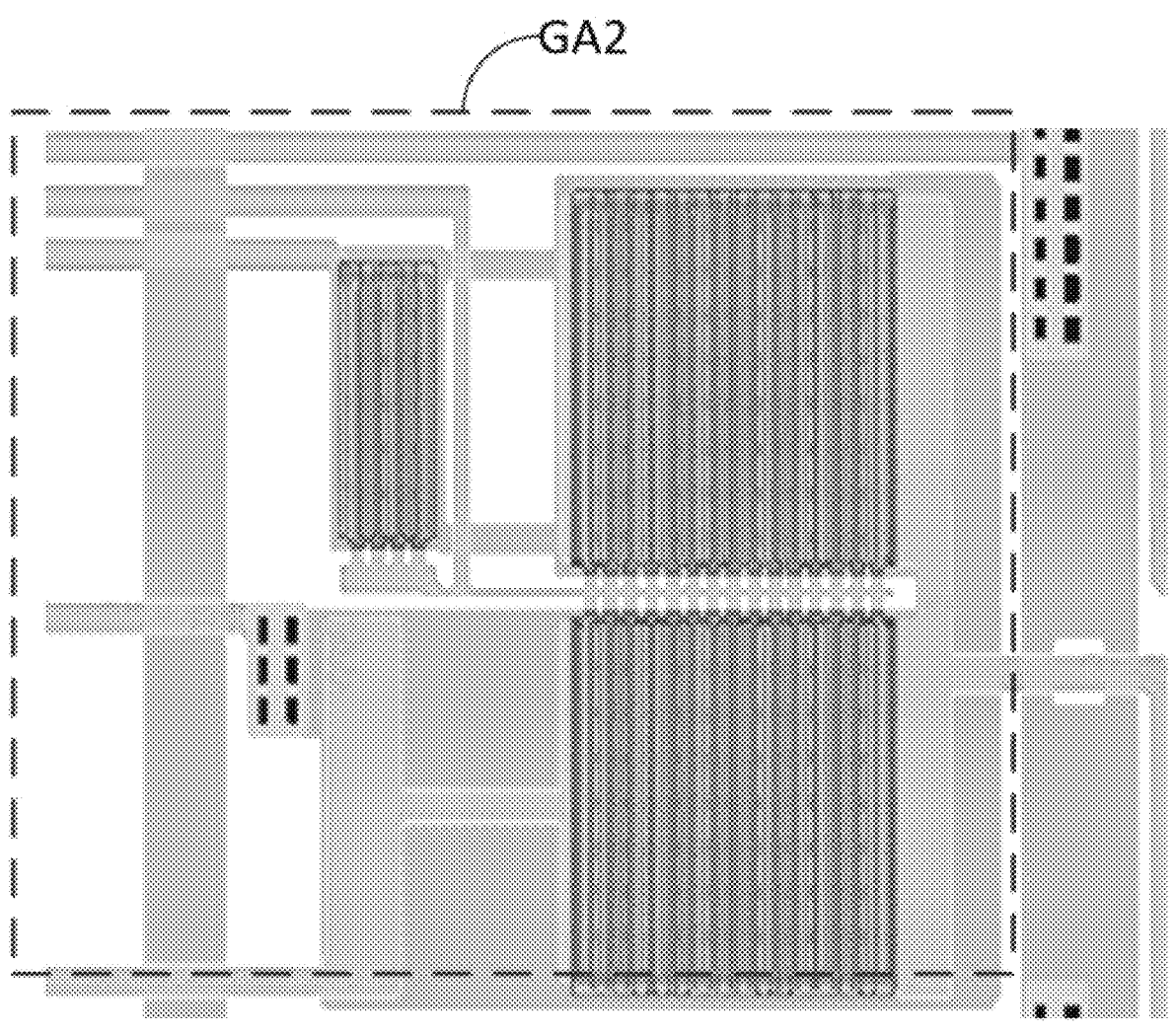
FIGS. 39 and 40 are layout diagrams of the second driving circuit portion in the driving module shown in FIG. 10B.
Figure 40:
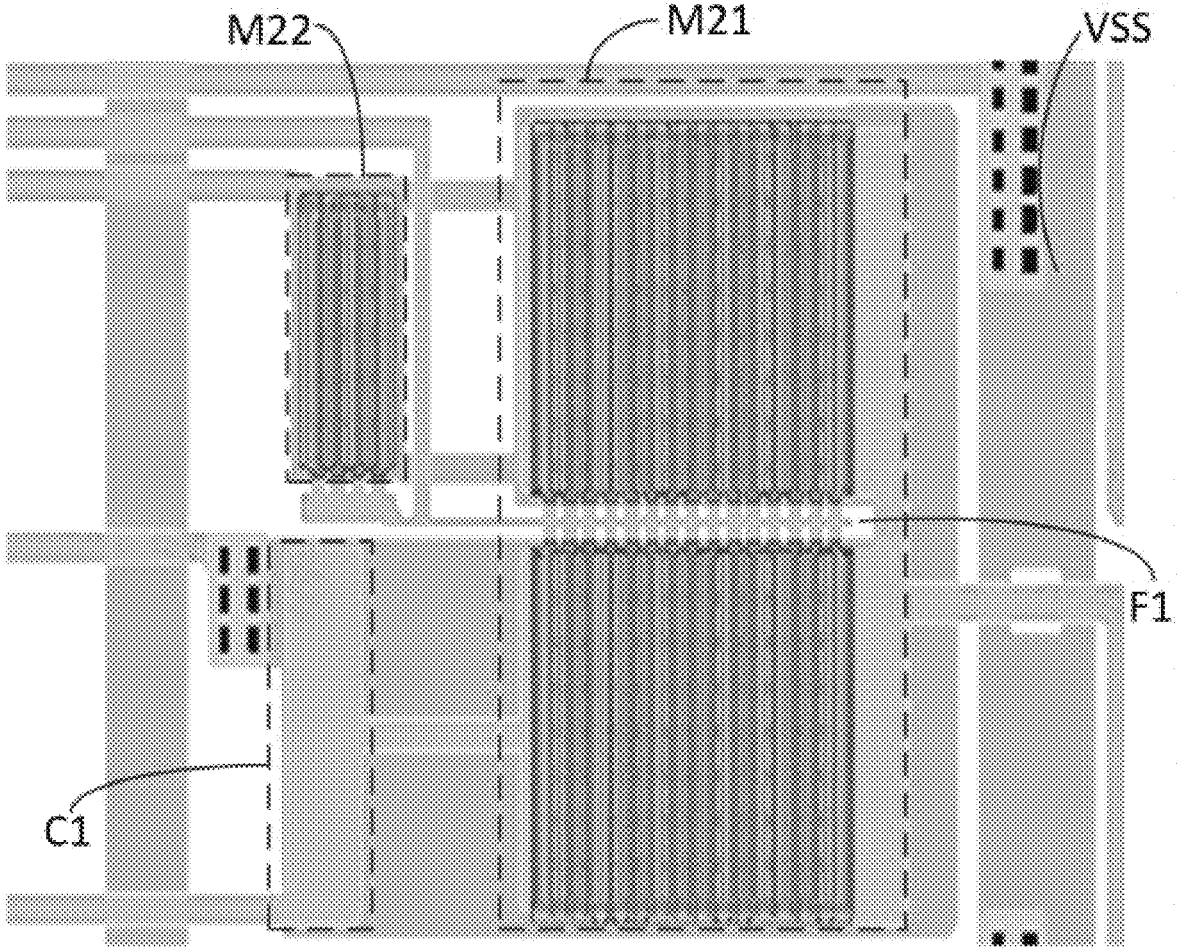

The layout diagrams of the second driving circuit portion in at least one embodiment of the driving module shown in FIG. 10B are shown in FIG. 39 and FIG. 40.

In FIG. 39, the one labeled GA2 is the second driving circuit portion.

In FIG. 40, the one labeled M21 is the twenty-first transistor, the one labeled M22 is the twenty-second transistor, the one labeled C1 is the first capacitor, and the one labeled VSS is the first low voltage line;

The one labeled C1 is the first capacitor, the one labeled F1 is the groove provided between the first electrode of the twenty-first transistor M21 and the second electrode of the twenty-first transistor M21. The groove F1 can prevent the first electrode of the twenty-first transistor M21 from being connected or short-circuited with the second electrode of M21.

Figure 41:
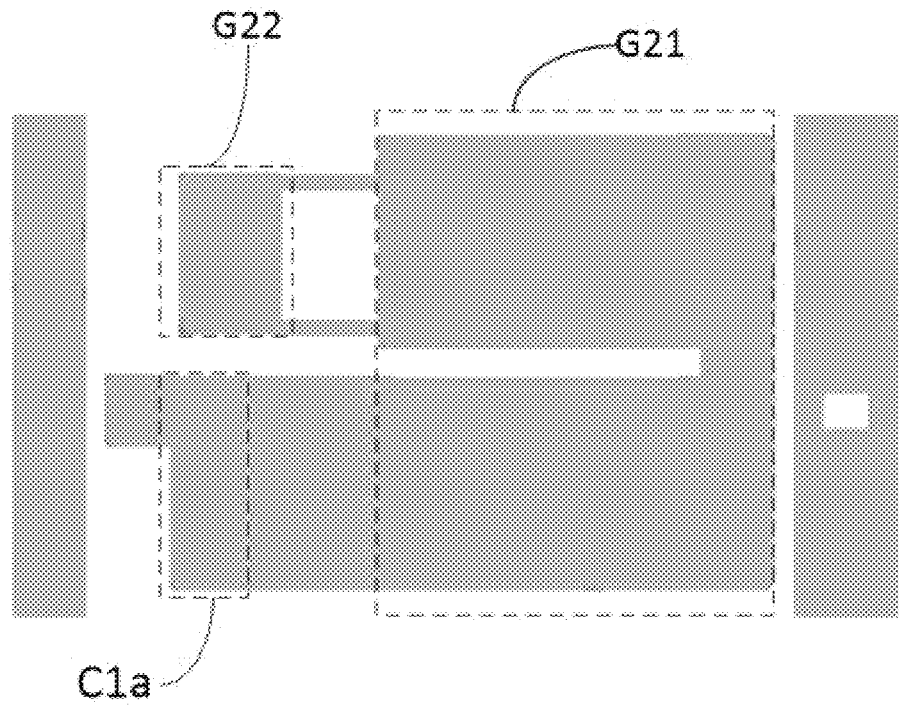
FIG. 41 is a layout diagram of the gate metal layer in FIG. 40.
Figure 42:
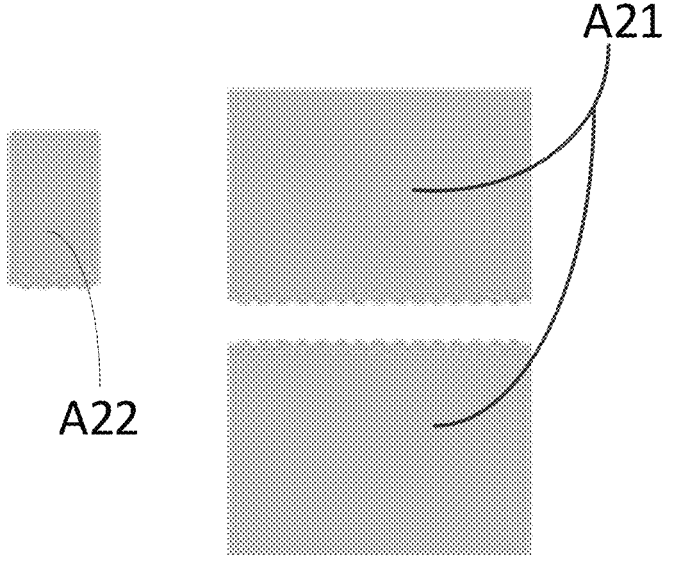
FIG. 42 is a layout diagram of the active layer in FIG. 40.
Figure 43:
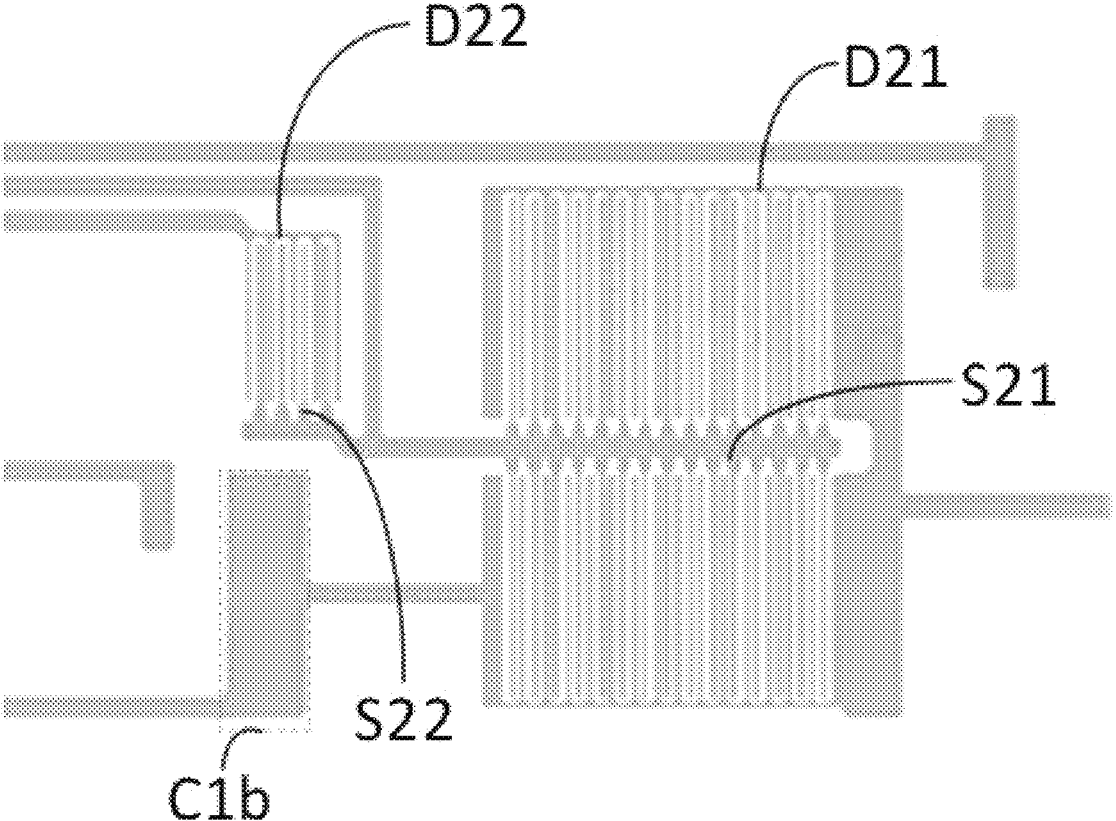
FIG. 43 is a layout diagram of the source-drain metal layers in FIG. 40.

FIG. 41 is a layout diagram of the gate metal layer in FIG. 40, FIG. 42 is a layout diagram of the active layer in FIG. 40, FIG. 43 is a layout diagram of the source-drain metal layers in FIG. 40, FIG. 44 is a layout diagram of the electrode layer in FIG. 40.

In FIG. 41, the one labeled G21 is the gate electrode of M21, the one labeled G22 is the gate electrode of M22, and the one labeled C1a is the first electrode plate of C1.

In FIG. 42, the one labeled A21 is the active layer pattern of M21, and the one labeled A22 is the active layer pattern of M22.

In FIG. 43, the one labeled C1b is the second electrode of C1, the one labeled S21 is the first electrode of M21, the one labeled D21 is the second electrode of M21, the one labeled S22 is the first electrode of M22, the one labeled D22 is the second electrode of M22.

Figure 45:
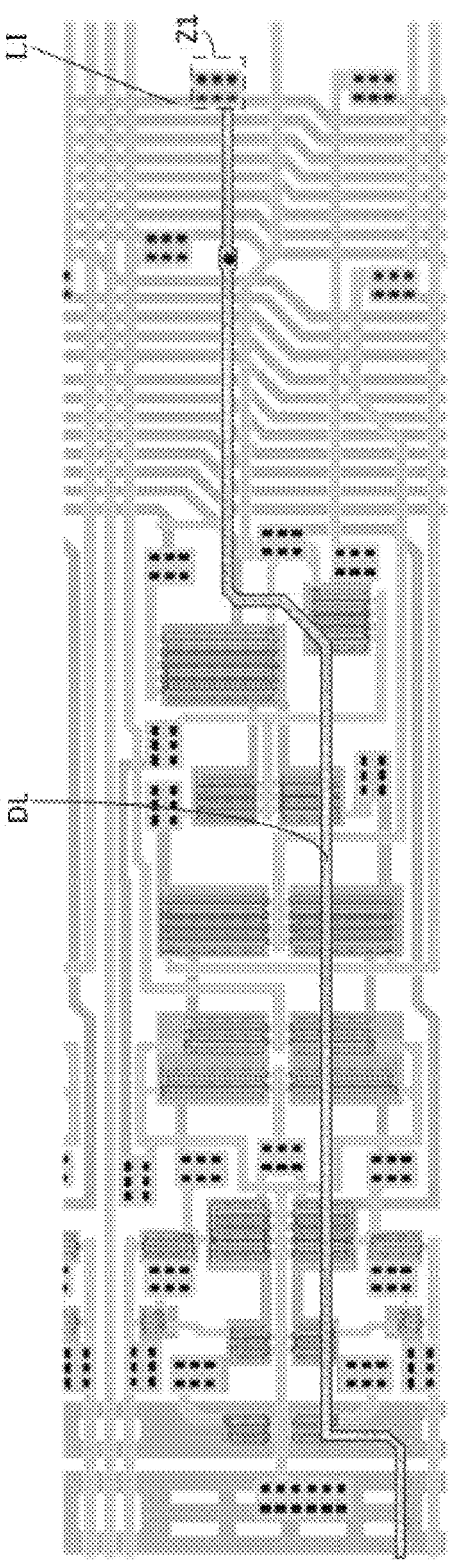
FIG. 45 is a layout diagram of the first driving circuit portion and the wring portion in the driving module shown in FIG. 10B.

The layout diagram of the first driving circuit portion and the line collection portion in at least one embodiment of the driving module shown in FIG. 10B is shown in FIG. 45;

In FIG. 45, the one labeled DL is the connection line, the one labeled LI is the input cascade line, and the one labeled Z1 is the first transfer portion;

The right terminal of the connection line DL is electrically connected to the input cascade line LI through the first transfer portion Z1 (at the position of the first transfer portion, the connection line and the input cascade line LI are electrically connected through the electrode layer and the via hole).

Figure 46:
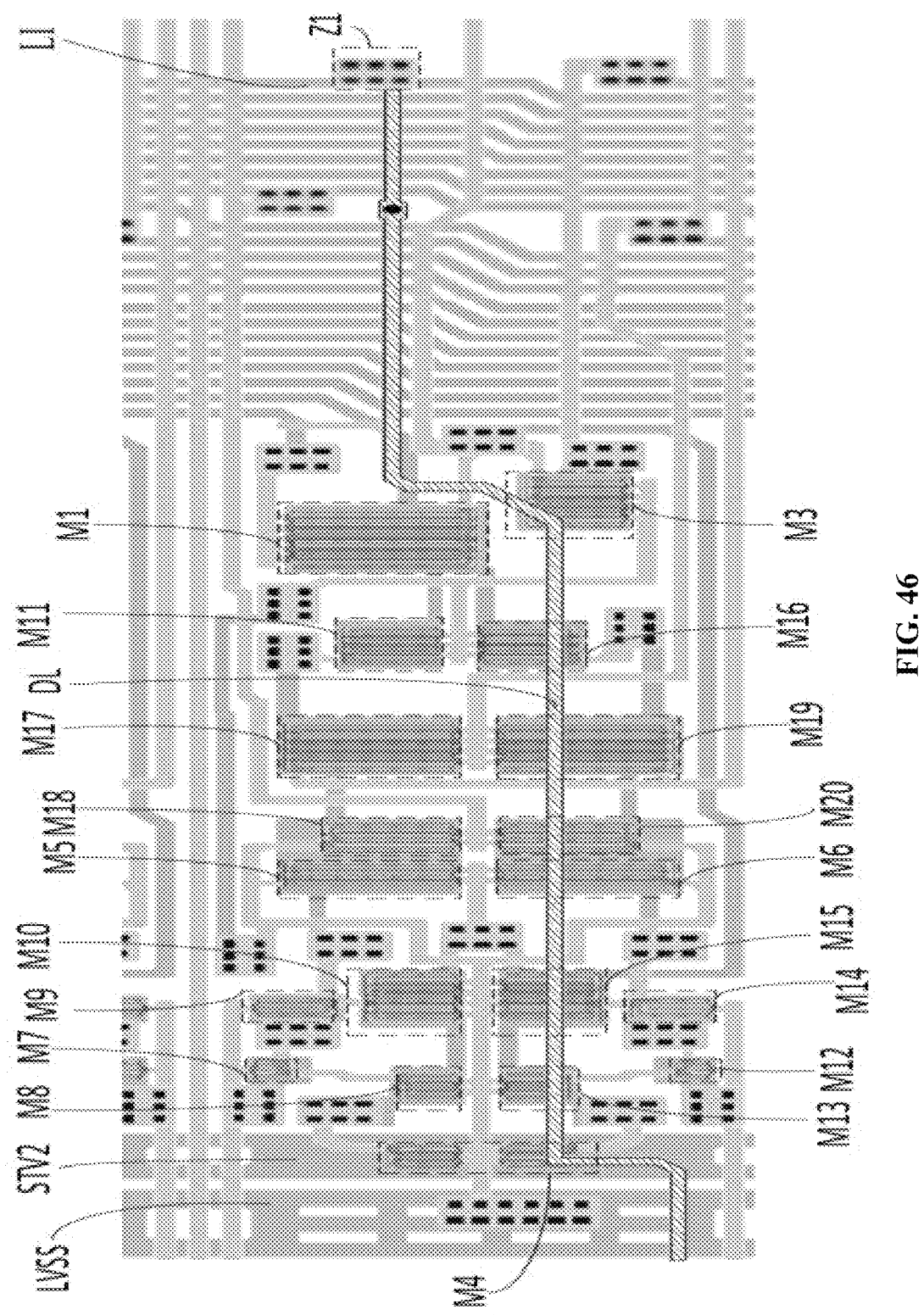
FIG. 46 is a schematic diagram showing labels of each transistor added based on the layout diagram shown in FIG. 45.

FIG. 46 is a schematic diagram showing labels for each transistor added based on the layout diagram shown in FIG. 45.

In FIG. 46, the line labeled STV2 is the start signal line, and the line labeled LVSS is the second low voltage line;

The one labeled M1 is the first transistor, the one labeled M3 is the third transistor, the one labeled M4 is the fourth transistor, the one labeled M5 is the fifth transistor, the one labeled M6 is the sixth transistor, and the one labeled M7 is the seventh transistor, the one labeled M8 is the eighth transistor, the one labeled M9 is the ninth transistor, the one labeled M10 is the tenth transistor, the one labeled M11 is the eleventh transistor, the one labeled M12 is the twelfth transistor, the one labeled M13 is the thirteenth transistor, the one labeled M14 is the fourteenth transistor, the one labeled M15 is the fifteenth transistor, the one labeled M16 is the sixteenth transistor, and the one labeled M17 is the seventeenth transistor, the one labeled M18 is the eighteenth transistor, the one labeled M19 is the nineteenth transistor, and the one labeled M20 is the twentieth transistor.

Figure 47:
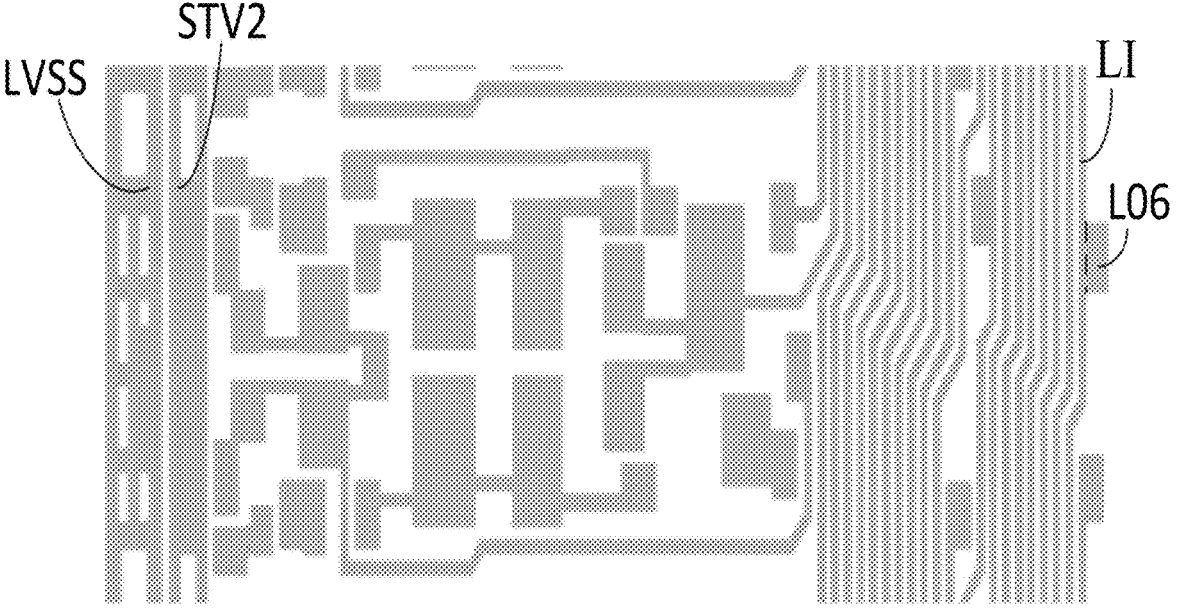
FIG. 47 is a layout diagram of the gate metal layer in FIG. 46.
Figure 48:
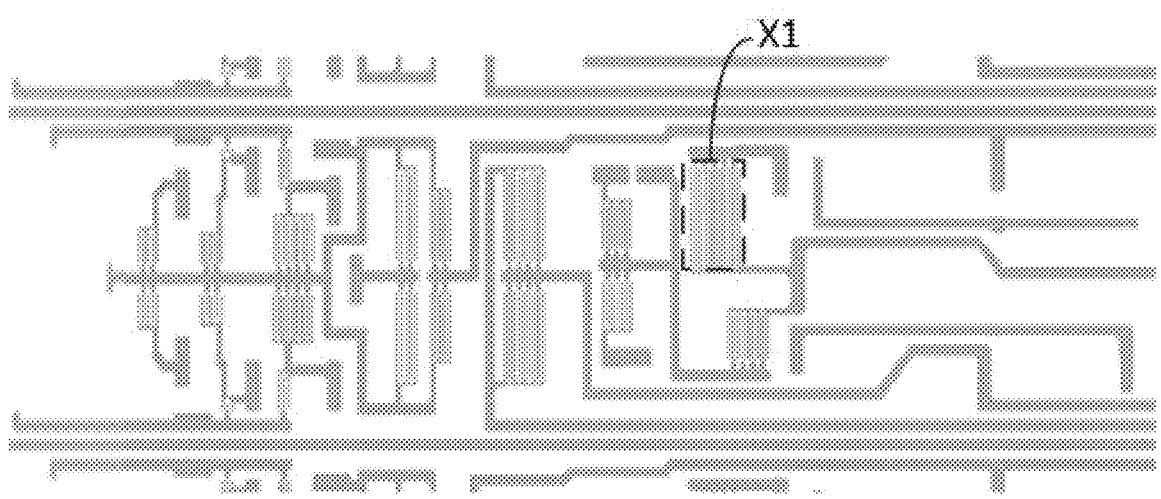
FIG. 48 is a layout diagram of the source-drain metal layers in FIG. 46.
Figure 49:
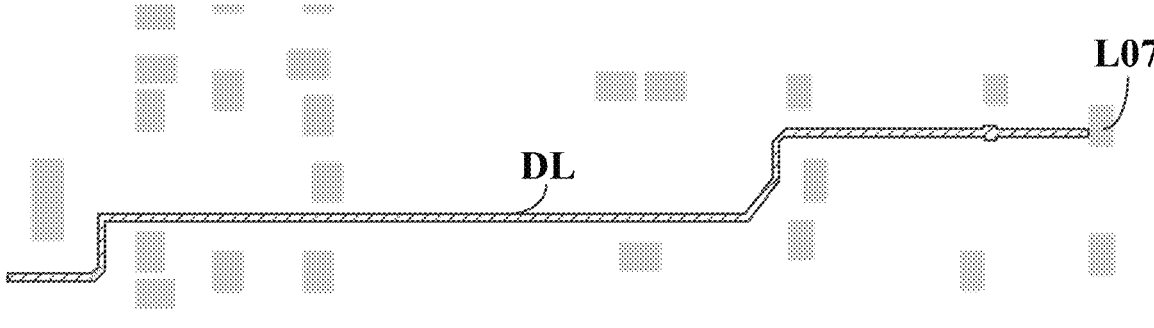
FIG. 49 is a layout diagram of the electrode layer in FIG. 46.
Figure 50:
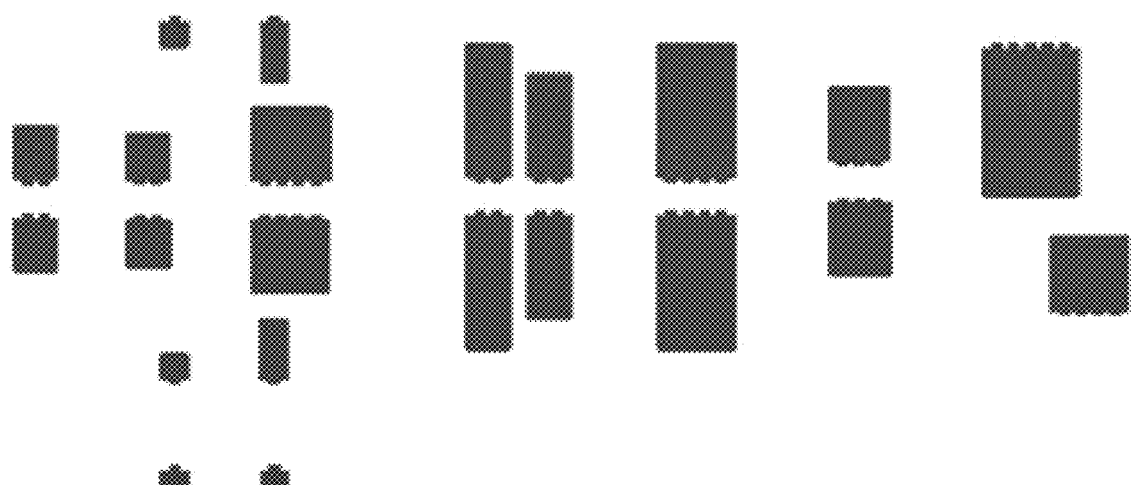
FIG. 50 is a layout diagram of the active layer in FIG. 46.

FIG. 47 is a layout diagram of the gate metal layer in FIG. 46. FIG. 48 is a layout diagram of the source-drain metal layers in FIG. 46. FIG. 49 is a layout diagram of the electrode layer in FIG. 46. FIG. 50 is a layout diagram of the active layer in FIG. 46.

In FIG. 47, the one labeled LI is the input cascade line, and the one labeled L06 is the sixth connection portion;

The input cascade line LI is connected to the sixth connection portion L06.

As shown in FIG. 48, the one labeled X1 is the electrode portion of M1. The electrode portion X1 of M1 includes the first electrode of M1 and the second electrode of M1. The first electrode is one of the source electrode and the drain electrode, and the second electrode is the other one of the source electrode and the drain electrode.

In FIG. 49, the one labeled DL is the connection line, and the one labeled L07 is the seventh connection portion; the seventh connection portion L07 is connected with the connection line DL.

As shown in FIGS. 46 to 50, the seventh connection portion L07 is electrically connected to the sixth connection portion L06 through the via hole, so that the right terminal of the connection line DL is electrically connected to the input cascade line LI.

The layout diagram of each clock signal line in at least one embodiment of the driving module shown in FIG. 10B is shown in FIG. 30.

In at least one embodiment shown in FIG. 45, when the driving circuit is an nth stage of driving circuit, the input cascade line LI is electrically connected to the output terminal of the (n–j)th stage of driving circuit, and n and j are positive integers.

In specific implementation, when the driving module is electrically connected to twelve clock signal lines, j may be 6, or j may be 5, but is not limited to this; j may also be other positive integers.

Optionally, the driving circuit includes a first driving circuit portion; the first driving circuit portion includes an input circuit, a pull-up node control circuit, a first pull-down node control circuit, a second pull-down node control circuit and a reset circuit;

The input circuit is used to control a potential of the pull-up node under the control of an input signal provided by the input terminal;

The pull-up node control circuit is used to control the potential of the pull-up node;

The first pull-down node control circuit is used to control a potential of the first pull-down node;

The second pull-down node control circuit is used to control a potential of the second pull-down node;

The reset circuit is used to reset the driving signal provided by the driving signal output terminal of the current stage under the control of a potential of the first pull-down node and a potential of the second pull-down node.

In specific implementation, the driving circuit may include a first driving circuit portion, and the first driving circuit portion may include an input circuit, an output reset circuit, a pull-up node control circuit, a first pull-down node control circuit, a second pull-down node control circuit and a reset circuit, the input circuit controls the potential of the pull-up node under the control of the input signal; the pull-up node control circuit controls the potential of the pull-up node, and the first pull-down node control circuit is used to control the potential of the first pull-down node, the second pull-down node control circuit is used to control the potential of the second pull-down node, and the reset circuit controls to reset the driving signal provided by the current stage of the driving signal output terminal.

In at least one embodiment of the present disclosure, the driving circuit may also include only one pull-down node and one pull-down node control circuit. The pull-down node control circuit is used to control the potential of the pull-down node. The reset circuit is configured to control the potential of the pull-down node under the control of the potential of the pull-down node.

Optionally, the input circuit includes a first transistor;

a gate electrode of the first transistor is electrically connected to the first input terminal, a first electrode of the first transistor is electrically connected to the second input terminal, and a second electrode of the first transistor is electrically connected to the pull-up node;

The pull-up node control circuit includes a third transistor, a fourth transistor, a fifth transistor and a sixth transistor;

a gate electrode of the third transistor is electrically connected to the reset terminal, a first electrode of the third transistor is electrically connected to the pull-up node, and a second electrode of the third transistor is electrically connected to the second voltage line;

a gate electrode of the fourth transistor is electrically connected to the start signal line, a first electrode of the fourth transistor is electrically connected to the pull-up node, and a second electrode of the fourth transistor is electrically connected to the second voltage line;

a gate electrode of the fifth transistor is electrically connected to the first pull-down node, a first electrode of the fifth transistor is electrically connected to the pull-up node, and a second electrode of the fifth transistor is electrically connected to the second voltage line;

a gate electrode of the sixth transistor is electrically connected to the second pull-down node, a first electrode of the sixth transistor is electrically connected to the pull-up node, and a second electrode of the sixth transistor is electrically connected to the second voltage line.

The first pull-down node control circuit includes a seventh transistor, an eighth transistor, a ninth transistor, a tenth transistor and an eleventh transistor;

a gate electrode of the seventh transistor and a first electrode of the seventh transistor are both electrically connected to the first control voltage line, and a second electrode of the seventh transistor is electrically connected to the first pull-down control node;

a gate electrode of the eighth transistor is electrically connected to the pull-up node, a first electrode of the eighth transistor is electrically connected to the first pull-down control node, and a second electrode of the eighth transistor is electrically connected to the second voltage line;

a gate electrode of the ninth transistor is electrically connected to the first pull-down control node, a first electrode of the ninth transistor is electrically connected to the first control voltage line, and a second electrode of the ninth transistor is electrically connected to the first pull-down node;

a gate electrode of the tenth transistor is electrically connected to the pull-up node, a first electrode of the tenth transistor is electrically connected to the first pull-down node, and a second electrode of the tenth transistor is electrically connected to the second voltage line;

a gate electrode of the eleventh transistor is electrically connected to the first input terminal, a first electrode of the eleventh transistor is electrically connected to the first pull-down node, and a second electrode of the eleventh transistor is electrically connected to the second voltage line;

The second pull-down node control circuit includes a twelfth transistor, a thirteenth transistor, a fourteenth transistor, a fifteenth transistor and a sixteenth transistor;

a gate electrode of the twelfth transistor and a first electrode of the twelfth transistor are both electrically connected to the second control voltage line, and a second electrode of the twelfth transistor is electrically connected to the second pull-down control node;

a gate electrode of the thirteenth transistor is electrically connected to the pull-up node, a first electrode of the thirteenth transistor is electrically connected to the second pull-down control node, and a second electrode of the thirteenth transistor is electrically connected to the second voltage line;

a gate electrode of the fourteenth transistor is electrically connected to the second pull-down control node, a first electrode of the fourteenth transistor is electrically connected to the second control voltage line, and a second electrode of the fourteenth transistor is electrically connected to the second pull-down node;

a gate electrode of the fifteenth transistor is electrically connected to the pull-up node, a first electrode of the fifteenth transistor is electrically connected to the second pull-down node, and a second electrode of the fifteenth transistor is electrically connected to the second voltage line;

a gate electrode of the sixteenth transistor is electrically connected to the first input terminal, a first electrode of the sixteenth transistor is electrically connected to the second pull-down node, and a second electrode of the sixteenth transistor is electrically connected to the second voltage line;

The reset circuit includes a seventeenth transistor, an eighteenth transistor, a nineteenth transistor and a twentieth transistor;

a gate electrode of the seventeenth transistor is electrically connected to the first pull-down node, a first electrode of the seventeenth transistor is electrically connected to the current stage of driving signal output terminal, and a second electrode of the seventeenth transistor is electrically connected to the first voltage line;

a gate electrode of the eighteenth transistor is electrically connected to the first pull-down node, a first electrode of the eighteenth transistor is electrically connected to the current stage of carry signal output terminal, and the second electrode of the eighteenth transistor electrically connected to the second voltage line;

a gate electrode of the nineteenth transistor is electrically connected to the second pull-down node, a first electrode of the nineteenth transistor is electrically connected to the current stage of driving signal output terminal, and the second electrode of the nineteenth transistor is electrically connected to the first voltage line;

a gate electrode of the twentieth transistor is electrically connected to the second pull-down node, a first electrode of the twentieth transistor is electrically connected to the current stage of carry signal output terminal, and a second electrode of the twentieth transistor is electrically connected to the second voltage line.

In at least one embodiment of the present disclosure, the first voltage line may be a first low voltage line, and the second voltage line may be a second low voltage line, but is not limited thereto.

In at least one embodiment of the present disclosure, the orthographic projection of the connection line on the base substrate partially overlaps the orthographic projection of the gate electrode of the fourth transistor on the base substrate;

The orthographic projection of the connection line on the base substrate partially overlaps the orthographic projection of the gate electrode of the thirteenth transistor on the base substrate;

The orthographic projection of the connection line on the base substrate partially overlaps the orthographic projection of the gate electrode of the fifteenth transistor on the base substrate;

The orthographic projection of the connection line on the base substrate partially overlaps the orthographic projection of the gate electrode of the sixteenth transistor on the base substrate;

The orthographic projection of the connection line on the base substrate partially overlaps the orthographic projection of the gate electrode of the twentieth transistor on the base substrate;

The orthographic projection of the connection line on the base substrate partially overlaps the orthographic projection of the gate electrode of the nineteenth transistor on the base substrate;

The orthographic projection of the connection line on the base substrate partially overlaps the orthographic projection of the gate electrode of the sixteenth transistor on the base substrate.

Optionally, the driving circuit also includes a second driving circuit portion;

The second driving circuit portion includes a twenty-first transistor and a twenty-second transistor;

a gate electrode of the twenty-first transistor is electrically connected to the pull-up node, a first electrode of the twenty-first transistor is electrically connected to the output clock signal terminal, and a second electrode of the twenty-second transistor is electrically connected to the current stage of driving signal output terminal;

a gate electrode of the twenty-second transistor is electrically connected to the pull-up node, a first electrode of the twenty-first transistor is electrically connected to the output clock signal terminal, and a second electrode of the twenty-second transistor is electrically connected to the current stage of carry signal output terminal.

Figure 51:
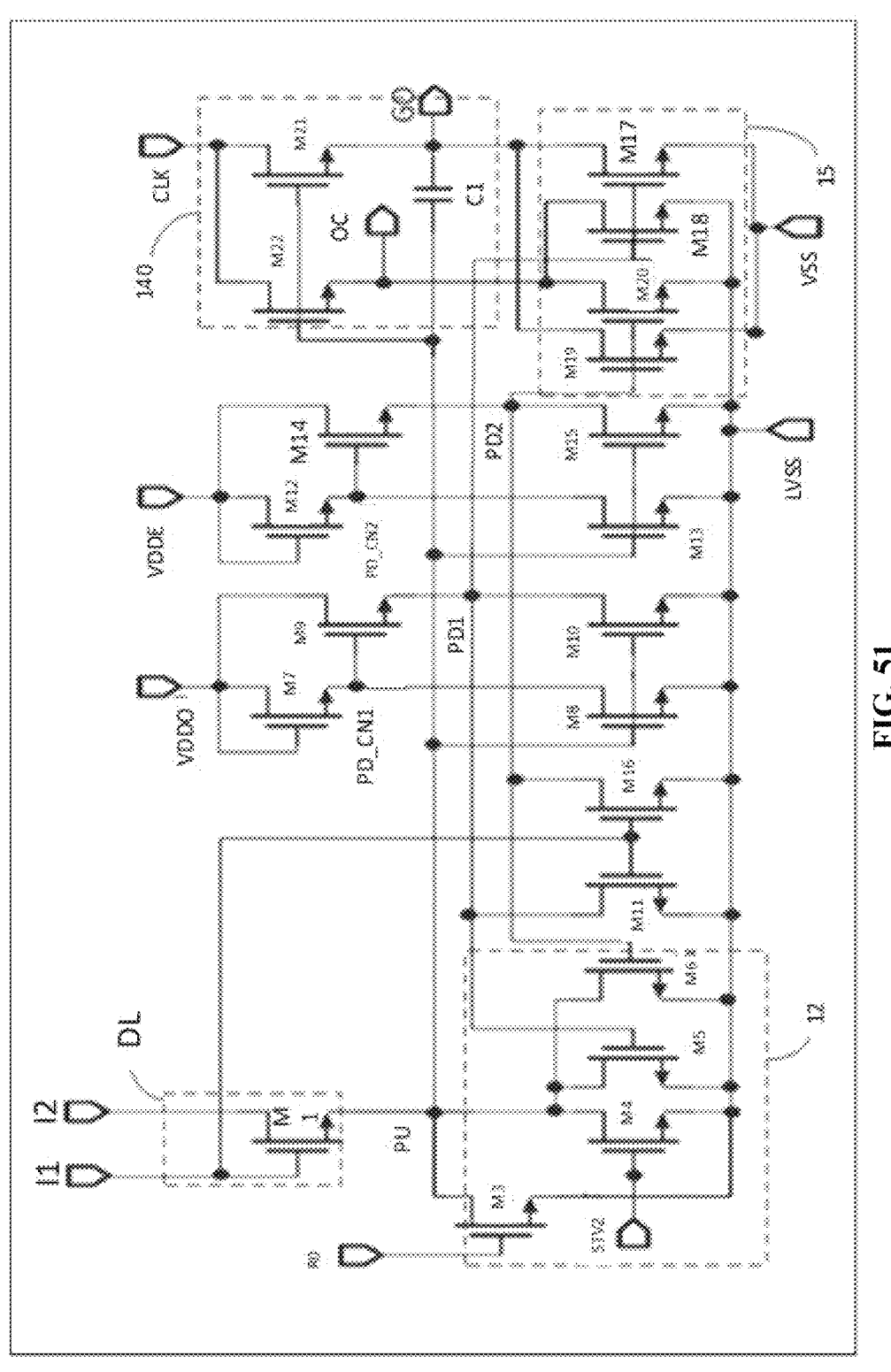
FIG. 51 is a circuit diagram of a driving circuit according to at least one embodiment of the present disclosure.

As shown in FIG. 51, at least one embodiment of the driving circuit may include a first driving circuit portion and a second driving circuit portion; at least one embodiment of the first driving circuit portion may include an input circuit 11, a pull-up node control circuit 12, the first pull-down node control circuit 13, the second pull-down node control circuit 14 and the reset circuit 15;

The input circuit 11 includes a first transistor M1;

The gate electrode of the first transistor M1 is electrically connected to the first input terminal I1, the first electrode of the first transistor M1 is electrically connected to the second input terminal I2, and the second electrode of the first transistor M1 is connected to the pull-up node PU; optionally, the first input terminal I1 of the nth stage of gate driving circuit can be electrically connected to the current stage of carry signal output terminal OC of the (n−i)th stage of gate driving circuit, and the second input terminal I2 of the nth stage of gate driving circuit can be electrically connected to the driving signal output terminal of the (n−j)th stage of gate driving circuit, where i can be equal to j, that is, the current stage of carry signal output terminal OC and the current stage of driving signal output terminal GO of the same stage of the gate driving circuit provide an input signal to the first transistor of the nth stage of gate driving circuit. Optionally, the first input terminal I1 and the second input terminal I2 of the nth stage of gate driving circuit can both be electrically connected to the current stage of carry signal output terminal OC of the (n−i) stage of gate driving circuit; i is a positive integer.

The pull-up node control circuit 12 includes a third transistor M3, a fourth transistor M4, a fifth transistor M5 and a sixth transistor M6;

The gate electrode of the third transistor M3 is electrically connected to the reset terminal R0, the first electrode of the third transistor M3 is electrically connected to the pull-up node PU, and the second electrode of the third transistor M3 is electrically connected to the second low voltage line LVSS;

The gate electrode of the fourth transistor M4 is electrically connected to the start signal line STV2, the first electrode of the fourth transistor is electrically connected to the pull-up node PU, and the second electrode of the fourth transistor M4 is electrically connected to the second low voltage line LVSS;

The gate electrode of the fifth transistor M5 is electrically connected to the first pull-down node PD1, the first electrode of the fifth transistor M5 is electrically connected to the pull-up node PU, and the second electrode of the fifth transistor M5 is electrically connected to the second low voltage line LVSS;

The gate electrode of the sixth transistor M6 is electrically connected to the second pull-down node PD2, the first electrode of the sixth transistor M6 is electrically connected to the pull-up node PU, and the second electrode of the sixth transistor M6 is electrically connected to the second low voltage line LVSS;

The first pull-down node control circuit includes a seventh transistor M7, an eighth transistor M8, a ninth transistor M9, a tenth transistor M10, and an eleventh transistor M11;

The gate electrode of the seventh transistor M7 and the first electrode of the seventh transistor M7 are both electrically connected to the first control voltage line VDDO, and the second electrode of the seventh transistor M7 is electrically connected to the first pull-down control node PD_CN1;

The gate electrode of the eighth transistor M8 is electrically connected to the pull-up node PU, the first electrode of the eighth transistor M8 is electrically connected to the first pull-down control node PD_CN1, and the second electrode of the eighth transistor M8 is electrically connected to the second low voltage line LVSS;

The gate electrode of the ninth transistor M9 is electrically connected to the first pull-down control node PD_CN1, the first electrode of the ninth transistor M9 is electrically connected to the first control voltage line VDDO, the second electrode of the ninth transistor M9 is electrically connected to the first pull-down node PD1;

The gate electrode of the tenth transistor M10 is electrically connected to the pull-up node PU, the first electrode of the tenth transistor M10 is electrically connected to the first pull-down node PD1, and the second electrode of the tenth transistor M10 is electrically connected to the second low voltage line LVSS;

The gate electrode of the eleventh transistor M11 is electrically connected to the first input terminal I1, the first electrode of the eleventh transistor M11 is electrically connected to the first pull-down node PD1, and the second electrode of the eleventh transistor M11 is electrically connected to the second low voltage line LVSS;

The second pull-down node control circuit includes a twelfth transistor M12, a thirteenth transistor M13, a fourteenth transistor M14, a fifteenth transistor M15, and a sixteenth transistor M16;

The gate electrode of the twelfth transistor M12 and the first electrode of the twelfth transistor M12 are both electrically connected to the second control voltage line VDDE, and the second electrode of the twelfth transistor M12 is connected to the second pull-down control node PD_CN2;

The gate electrode of the thirteenth transistor M13 is electrically connected to the pull-up node PU, and the first electrode of the thirteenth transistor M13 is electrically connected to the second pull-down control node PD_CN2, the second electrode of the thirteenth transistor M13 is electrically connected to the second low voltage line LVSS;

The gate electrode of the fourteenth transistor M14 is electrically connected to the second pull-down control node PD_CN2, and the first electrode of the fourteenth transistor M14 is electrically connected to the second control voltage line VDDE, the second electrode of the fourteenth transistor M14 is electrically connected to the second pull-down node PD2;

The gate electrode of the fifteenth transistor M15 is electrically connected to the pull-up node PU, the first electrode of the fifteenth transistor M15 is electrically connected to the second pull-down node PD2, the second electrode of the fifteenth transistor M15 is electrically connected to the second low voltage line LVSS;

The gate electrode of the sixteenth transistor M16 is electrically connected to the first input terminal I1, the first electrode of the sixteenth transistor M16 is electrically connected to the second pull-down node PD2, and the second electrode of the sixteenth transistor M16 is electrically connected to the second low voltage line LVSS;

The reset circuit 15 includes a seventeenth transistor M17, an eighteenth transistor M18, a nineteenth transistor M19 and a twentieth transistor M20;

The gate electrode of the seventeenth transistor M17 is electrically connected to the first pull-down node PD1, and the first electrode of the seventeenth transistor M17 is electrically connected to the current stage of driving signal output terminal GO, the second electrode of the seventeenth transistor M17 is electrically connected to the first low voltage line;

The gate electrode of the eighteenth transistor M18 is electrically connected to the first pull-down node PD1, and the first electrode of the eighteenth transistor M18 is electrically connected to the current stage of carry signal output terminal OC, the second electrode of the eighteenth transistor M18 is electrically connected to the second low voltage line LVSS;

The gate electrode of the nineteenth transistor M19 is electrically connected to the second pull-down node PD2, and the first electrode of the nineteenth transistor M19 is electrically connected to the current stage of driving signal output terminal GO, the second electrode of the nineteenth transistor M19 is electrically connected to the first low voltage line VSS;

The gate electrode of the twentieth transistor M20 is electrically connected to the second pull-down node PD2, and the first electrode of the twentieth transistor M20 is electrically connected to the current stage of carry signal output terminal OC, the second electrode of the twentieth transistor M20 is electrically connected to the second low voltage line LVSS;

The second driving circuit portion 140 includes a twenty-first transistor M21, a twenty-second transistor M22 and a first capacitor C1;

The gate electrode of the twenty-first transistor M21 is electrically connected to the pull-up node PU, the first electrode of the twenty-first transistor M21 is electrically connected to the output clock signal terminal CLK, and the second electrode of the twenty-first transistor M21 is electrically connected to the current stage of driving signal output terminal GO;

The gate electrode of the twenty-second transistor M22 is electrically connected to the pull-up node PU, and the first electrode of the twenty-second transistor M22 is electrically connected to the output clock signal terminal CLK, the second electrode of twenty-second transistor M22 is electrically connected to the current stage of carry signal output terminal GO;

The first electrode plate of the first capacitor C1 is electrically connected to the pull-up node PU, and the second electrode plate of the first capacitor C1 is electrically connected to the current stage of driving signal output terminal GO.

In at least one embodiment of the driving circuit shown in FIG. 51, the first input terminal I1 is electrically connected to the adjacent previous stage of carry signal output terminal, and the second input terminal I2 is electrically connected to the adjacent previous stage of driving signal output terminal, but it is not limited to this.

In at least one embodiment of the driving circuit shown in FIG. 51, the eleventh transistor M11 and the sixteenth transistor M16 used for total reset may not be provided.

In at least one embodiment of the driving circuit shown in FIG. 51, only one pull-down node may be used, that is, the second pull-down node control circuit may not be provided; and when only the first pull-down node PU1 is provided, M6, M16, M19 and M20 whose gate electrodes are electrically connected to the second pull-down node PD2 may not be provided.

Optionally, the second driving circuit portion also includes a second transistor;

a gate electrode of the second transistor is electrically connected to the reset control terminal, a first electrode of the second transistor is electrically connected to the current stage of driving signal output terminal, and a second electrode of the second transistor is electrically connected to the first voltage line.

In at least one embodiment of the present disclosure, a groove is provided between the first electrode of the twenty-first transistor and the second electrode of the twenty-first transistor, so that the first electrode of the twenty-first transistor is not connected to the second electrodes of the twenty-first transistor;

The first electrode of the twenty-first transistor and the second electrode of the twenty-first transistor are both formed on the first metal layer.

The display substrate according to at least one embodiment of the present disclosure includes a base substrate and a driving module arranged on the base substrate; the driving module includes N cascaded driving circuits; the driving circuit includes an input terminal; N is a positive integer;

The input terminal of the previous a stages of driving circuits included in the driving module is electrically connected to the start voltage line; a is a positive integer;

The input terminal of the nth stage of driving circuit included in the driving module is electrically connected to the output terminal of the (n–m)th stage of driving circuit included in the driving module through an input cascade line; n and m are positive integers, and m is less than n;

The driving module also includes at least one connection line, the connection line extends along the first direction;

There is an overlapping area between the orthographic projection of the connection line on the base substrate and the orthographic projection of the start voltage line on the base substrate; there is an overlap area between the orthographic projection of the connection line on the base substrate and the orthographic projection of the input cascade line on the base substrate;

The connection line is electrically connected to the input cascade line.

In at least one embodiment of the present disclosure, the display substrate may not include a control switch, and there is an overlapping area between the orthographic projection of the connection line on the base substrate and the orthographic projection of the start voltage line on the base substrate; there is an overlapping area between the orthographic projection of the connection line on the base substrate and the orthographic projection of the input cascade line on the base substrate; the connection line is electrically connected to the input cascade line.

When it is necessary to cut off the first c stages of driving circuits included in the driving module (c is a positive integer), the connection line corresponding to the (c+1)th stage of driving circuit and the start voltage line are electrically connected through welding or tungsten powder, so that the start voltage line is electrically connected to the input cascade line.

Figure 52:
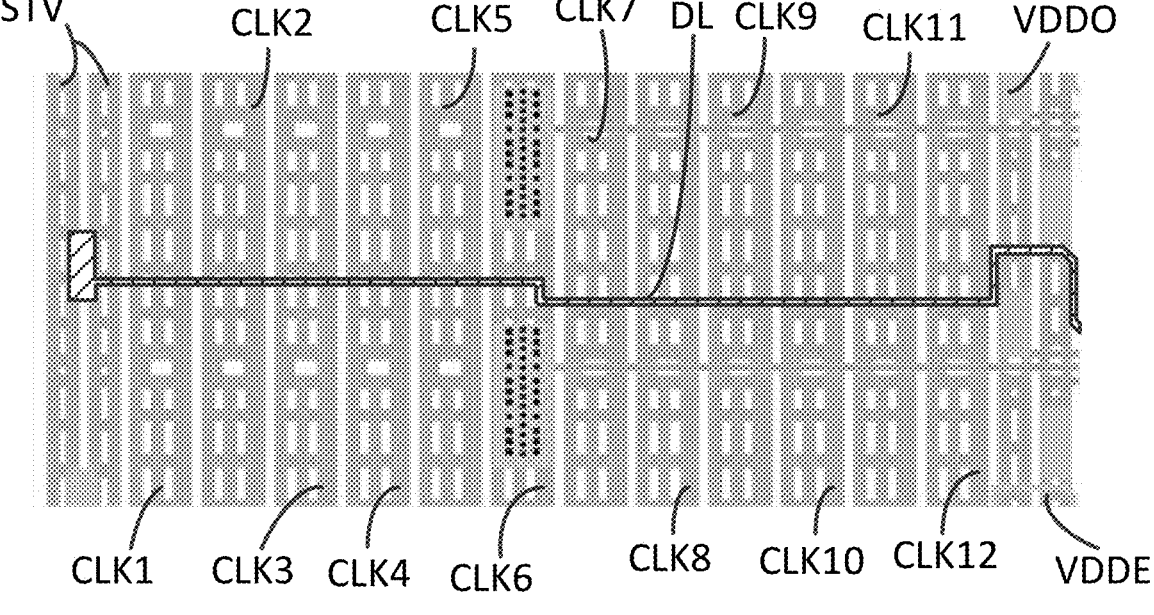
FIG. 52 is a layout diagram of each clock signal line of the driving module included in the display substrate when the display substrate does not include a control switch.

When the display substrate does not include a control switch, the layout diagram of each clock signal line of the driving module included in the display substrate may be as shown in FIG. 52.

Figure 53:
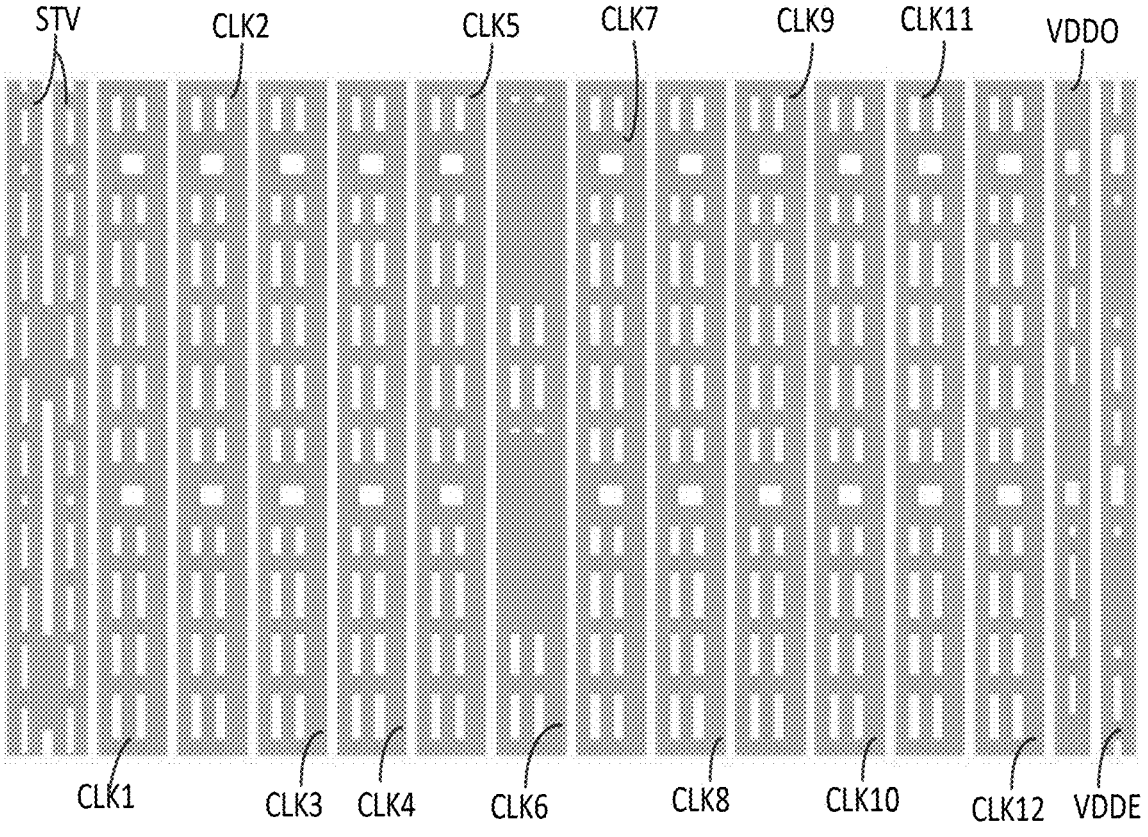
FIG. 53 is a layout diagram of the gate metal layer in FIG. 52.
Figure 54:
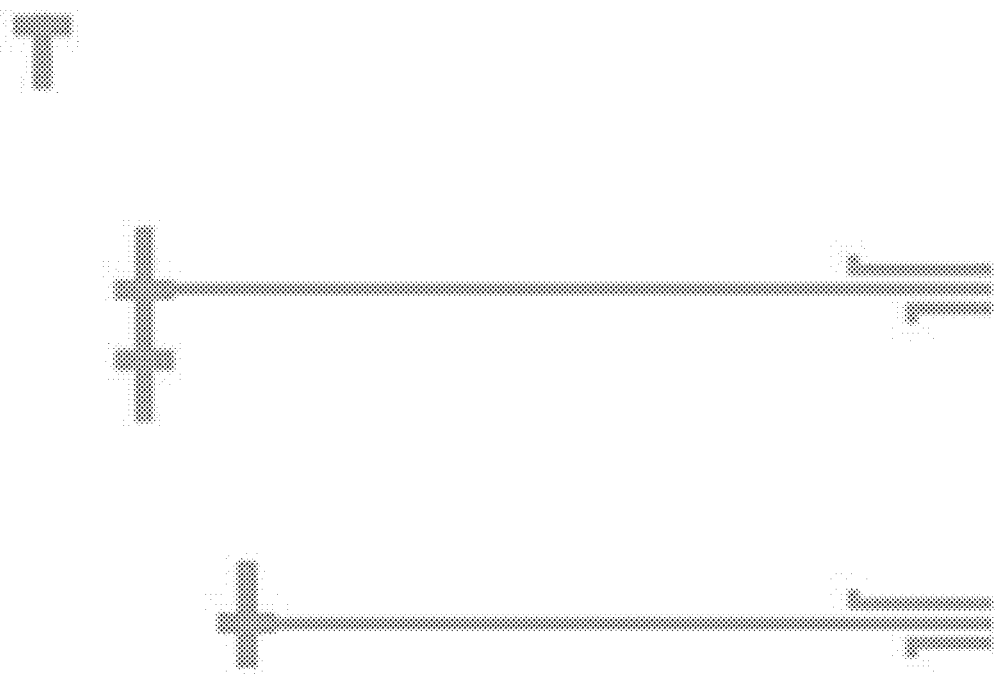
FIG. 54 is a layout diagram of the source-drain metal layers of FIG. 52.
Figure 55:
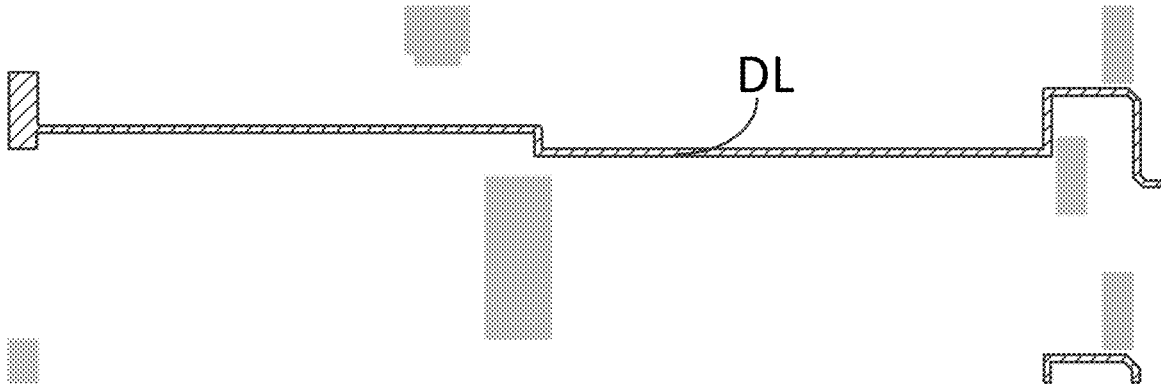
FIG. 55 is a layout diagram of the electrode layer in FIG. 52.

FIG. 53 is a layout diagram of the gate metal layer in FIG. 52, FIG. 54 is a layout diagram of the source-drain metal layers in FIG. 52, and FIG. 55 is a layout diagram of the electrode layer in FIG. 52.

In FIG. 52, the line labeled STV is the start voltage line, the line labeled CLK1 is the first clock signal line, the line labeled CLK2 is the second clock signal line, the line labeled CLK3 is the third clock signal line, and the line labeled CLK4 is the fourth clock signal line, the line labeled CLK5 is the fifth clock signal line, the line labeled CLK6 is the sixth clock signal line, the line labeled CLK7 is the seventh clock signal line, and the line labeled CLK8 is the eighth clock signal lines, the one labeled CLK9 is the ninth clock signal line, the one labeled CLK10 is the tenth clock signal line, the one labeled CLK11 is the eleventh clock signal line, the one labeled CLK12 is the twelfth clock signal line;

The one labeled VDDO is the first control voltage line, and the one labeled VDDE is the second control voltage line;

The one labeled DL is the connection line.

As shown in FIG. 52, the orthographic projection of the start voltage line STV on the base substrate partially overlaps the orthographic projection of the connection line DL on the base substrate.

When the display substrate does not include a control switch, the layout diagram of each clock signal line of the driving module included in the display substrate may be as shown in FIG. 52.

Figure 62:
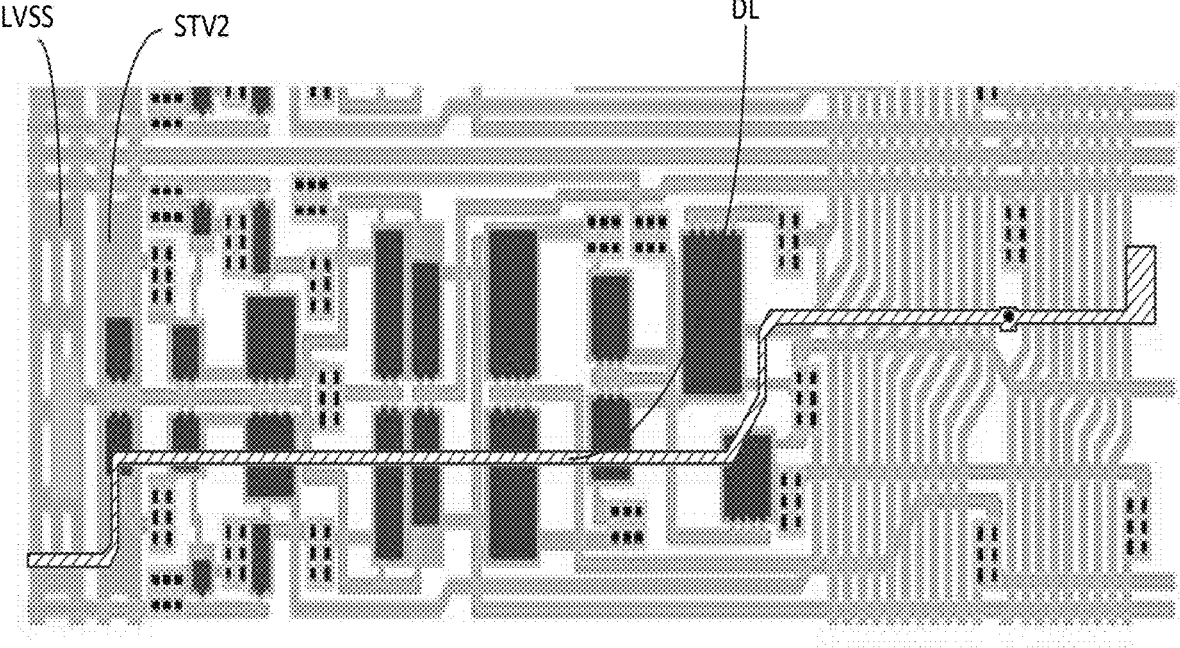
FIG. 62 is a layout diagram of the first driving circuit portion and the line collection portion of the driving module included in the display substrate when the display substrate does not include a control switch.

When the display substrate does not include a control switch, the layout diagram of the first driving circuit portion and the line collection portion of the driving module included in the display substrate is as shown in FIG. 62.

In FIG. 62, the one labeled DL is the connection line, the one labeled LI is the input cascade line, the one labeled STV2 is the start signal line, and the one labeled LVSS is the second low voltage line.

Figure 63:
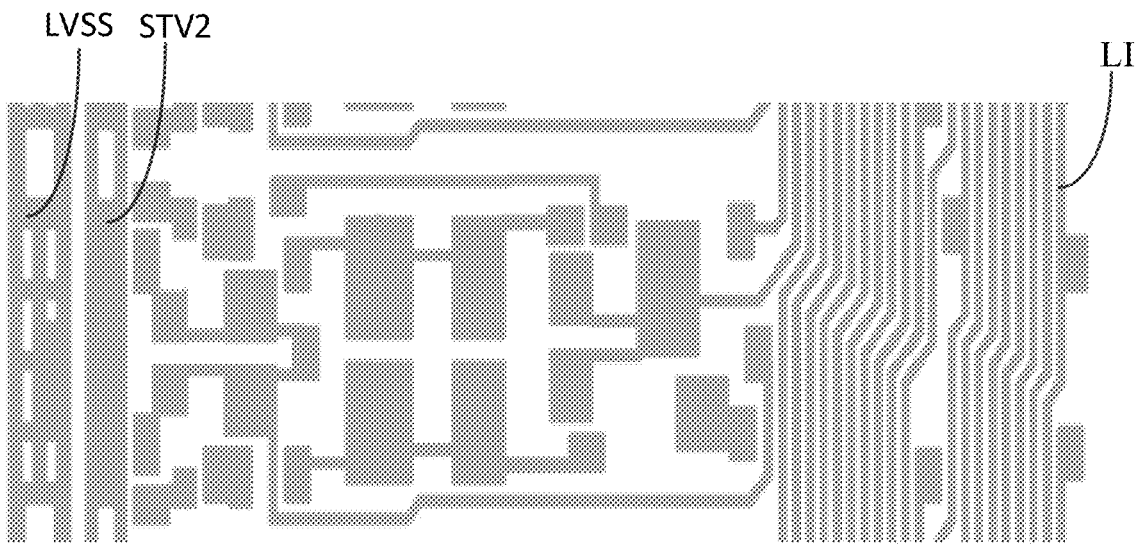
FIG. 63 is a layout diagram of the gate metal layer in FIG. 62.
Figure 64:
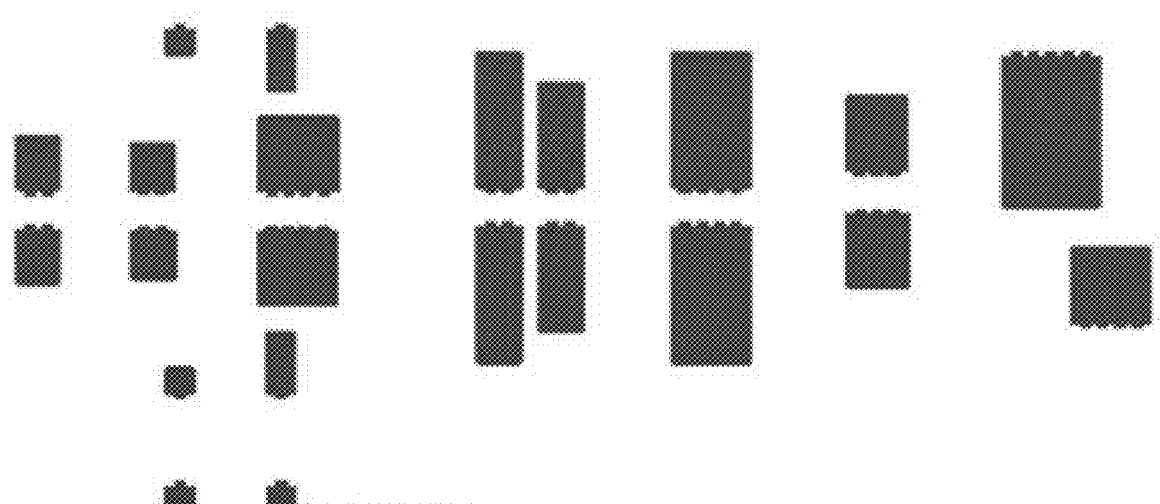
FIG. 64 is a layout diagram of the active layer in FIG. 62.
Figure 65:
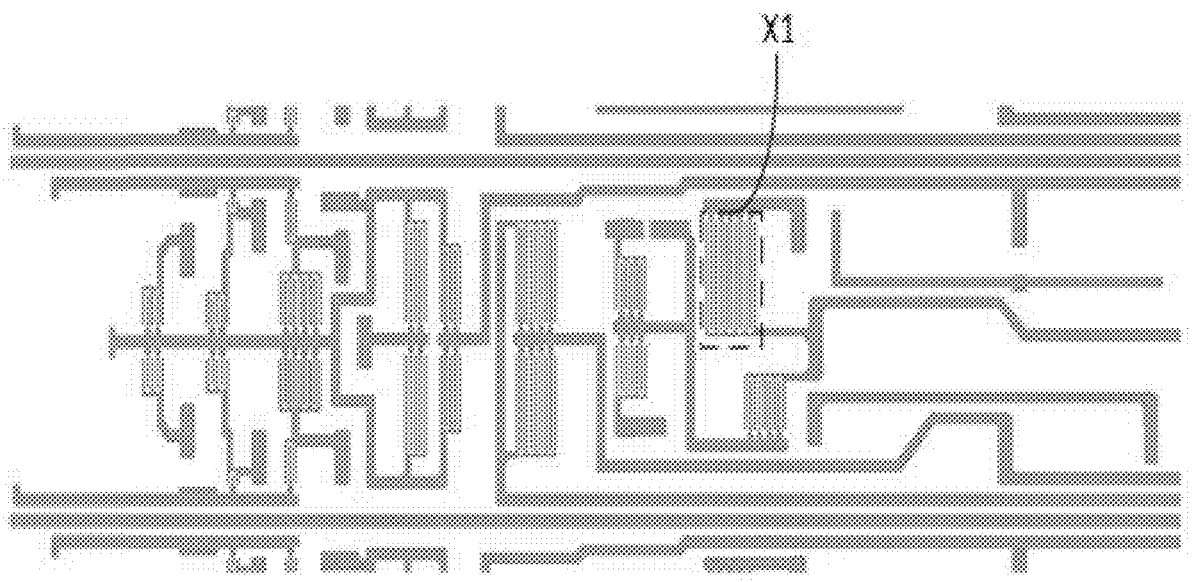
FIG. 65 is a layout diagram of the source-drain metal layers in FIG. 62.
Figure 66:
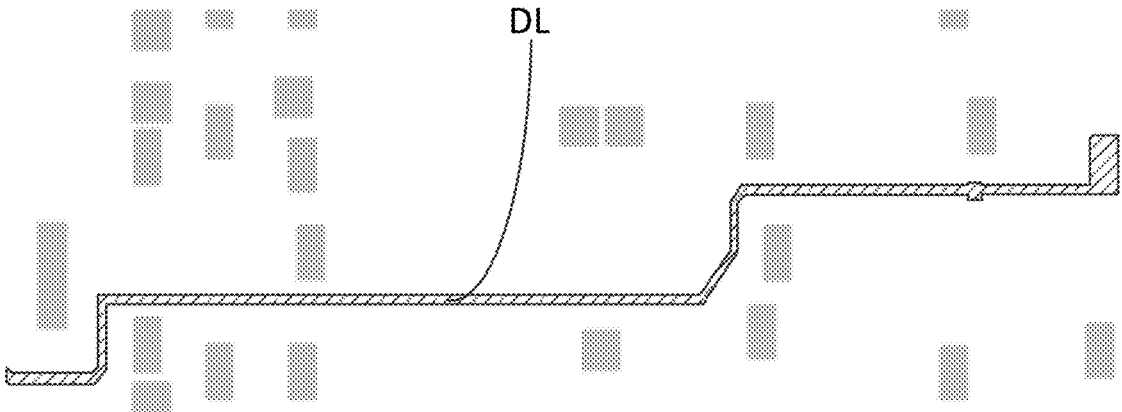
FIG. 66 is a layout diagram of the electrode layer in FIG. 62.

FIG. 63 is a layout diagram of the gate metal layer in FIG. 62. FIG. 64 is a layout diagram of the active layer in FIG. 62. FIG. 65 is a layout diagram of the source-drain metal layer in FIG. 62. FIG. 66 is a layout diagram of the electrode layer in FIG. 62.

In FIG. 65, the one labeled X1 is the electrode portion of M1.

As shown in FIG. 62, the orthographic projection of the connection line DL on the base substrate overlaps the orthographic projection of the input cascade line LI on the base substrate.

In specific implementation, when the start voltage line STV in FIG. 52 needs to be electrically connected to the input cascade line LI in FIG. 62, welding or tungsten powder can be used to electrically connect the start voltage line STV to the connection line DL, and electrically connect the connection line DL and the input cascade line LI.

Figure 56:
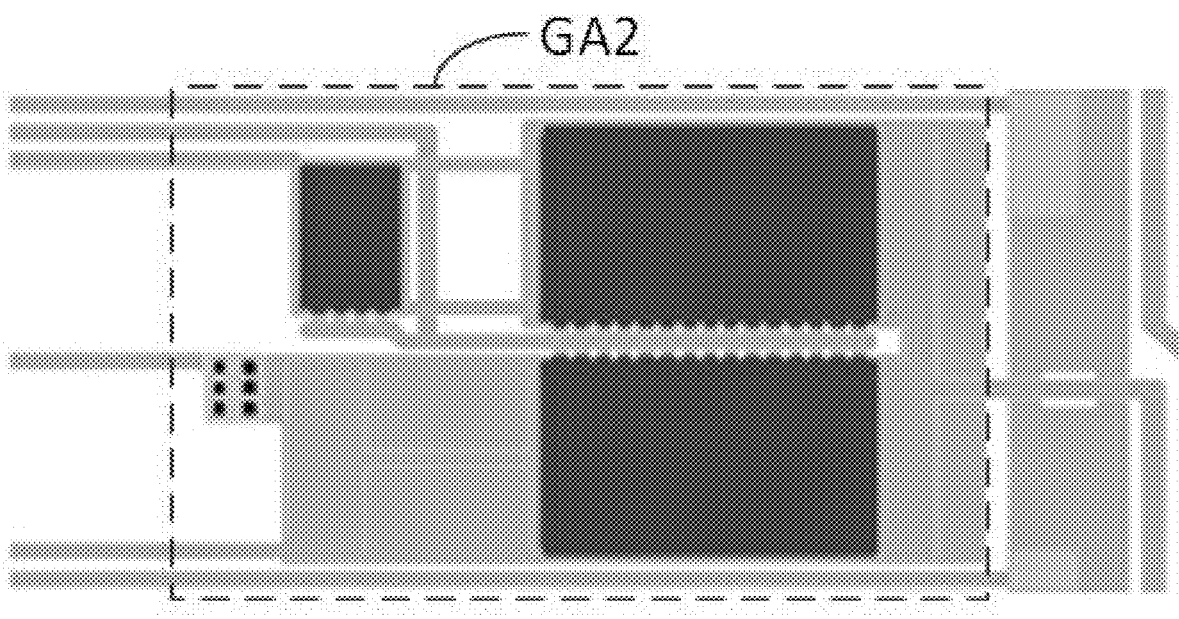
FIGS. 56 and 57 are layout diagrams of the second driving circuit portion of the driving module included in the display substrate when the display substrate does not include a control switch.
Figure 57:
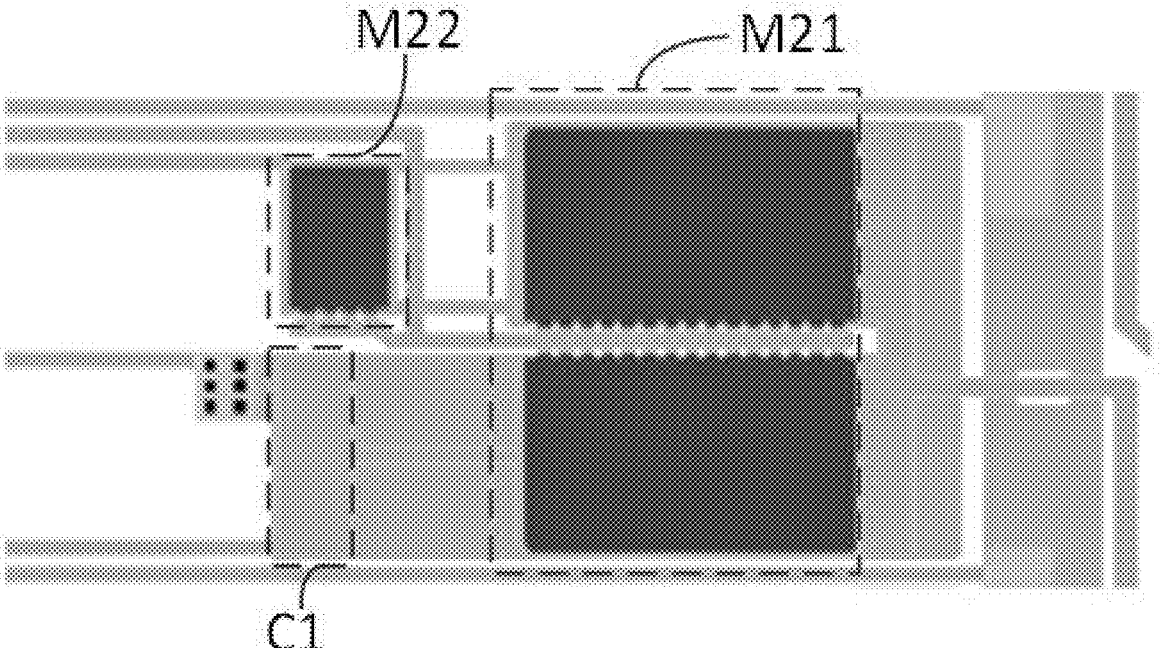

When the display substrate does not include a control switch, the second driving circuit portion of the driving module included in the display substrate is as shown in FIGS. 56 and 57.

In FIG. 56, the one labeled GA2 is the second driving circuit portion.

In FIG. 57, the one labeled M21 is the twenty-first transistor, the one labeled M22 is the twenty-second transistor, and the one labeled C1 is the first capacitor.

Figure 58:
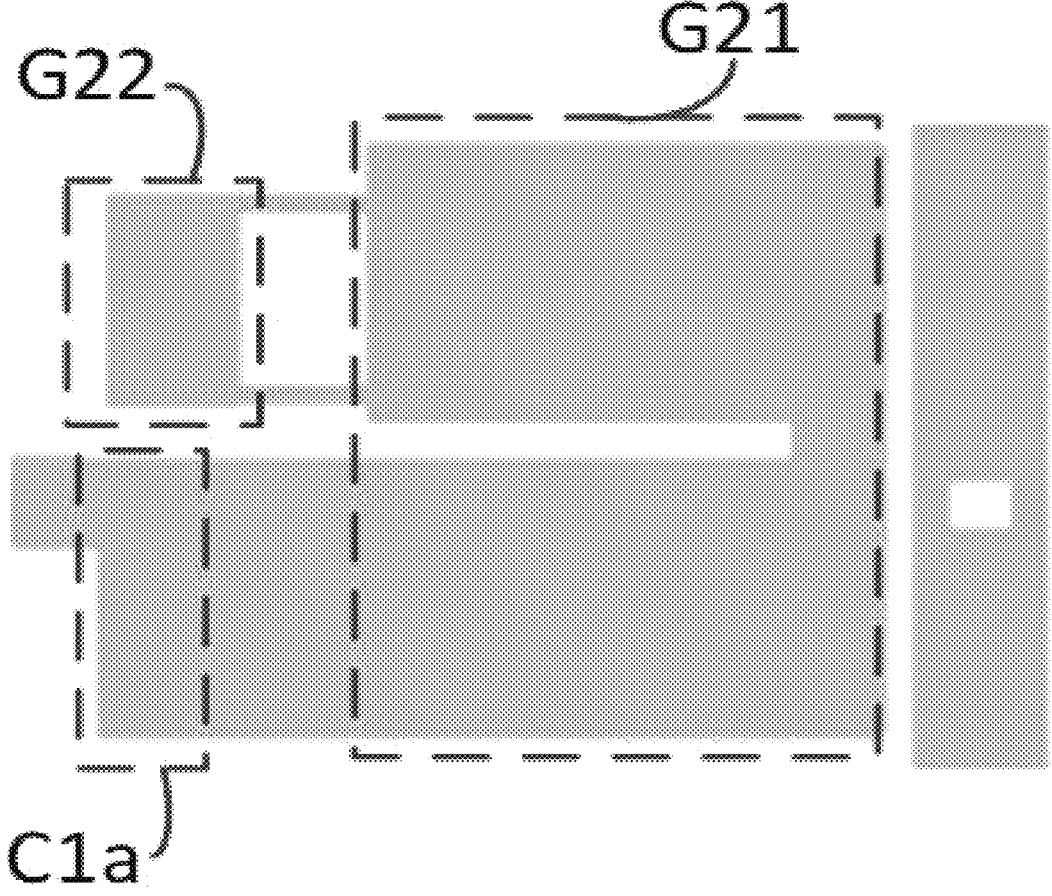
FIG. 58 is a layout diagram of the gate metal layer in FIG. 57.
Figure 59:
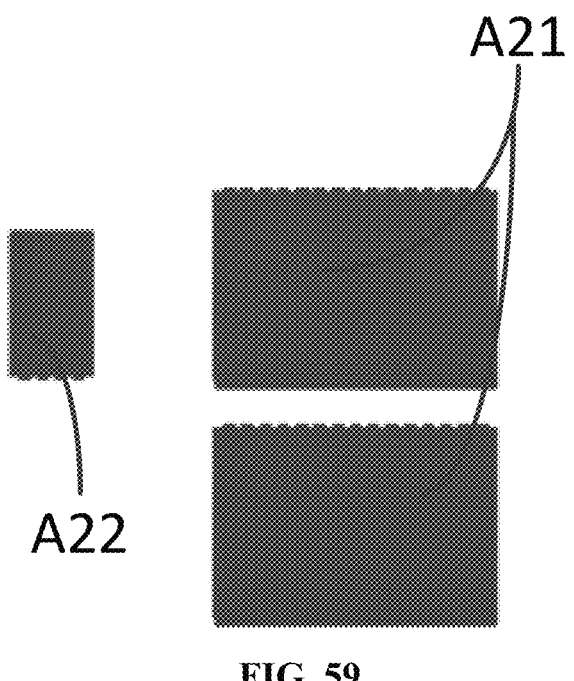
FIG. 59 is a layout diagram of the active layer in FIG. 57.
Figure 60:
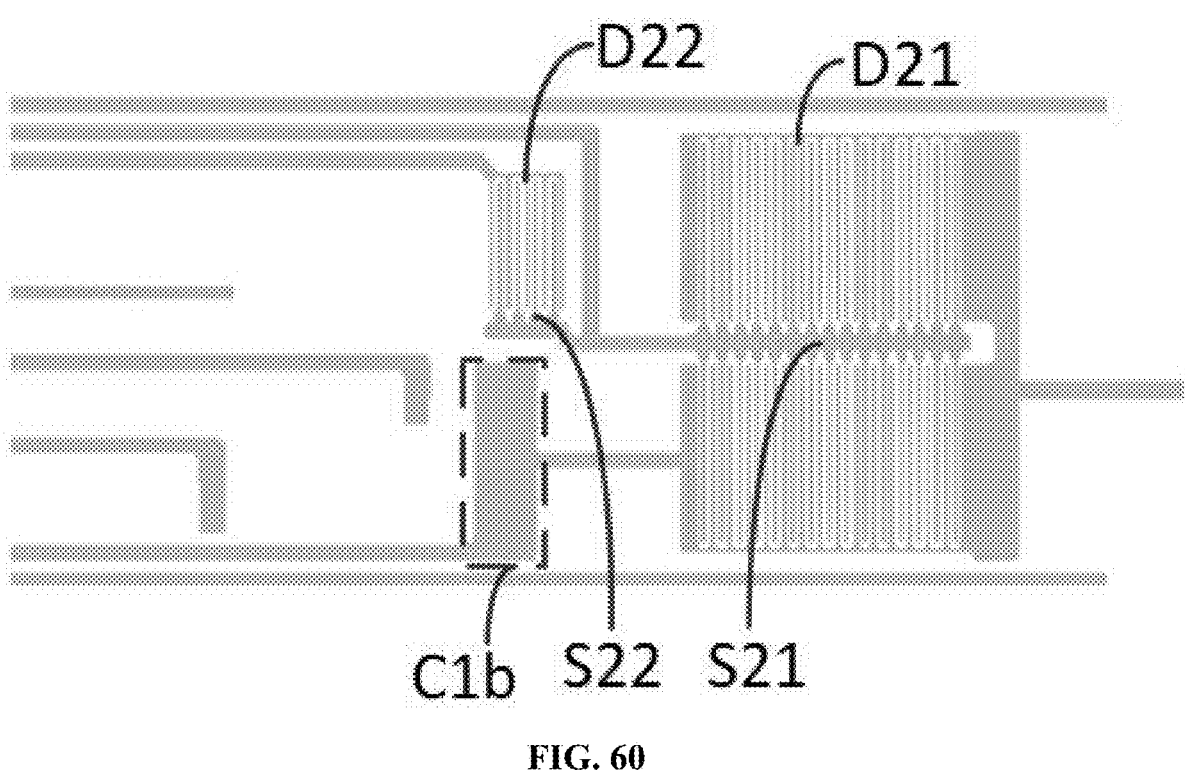
FIG. 60 is a layout diagram of the source-drain metal layers in FIG. 57.
Figure 61:
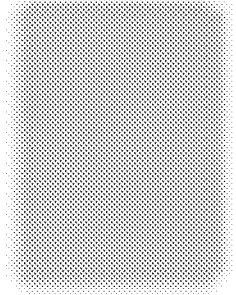
FIG. 61 is a layout diagram of the electrode layer in FIG. 57.

FIG. 58 is a layout diagram of the gate metal layer in FIG. 57, FIG. 59 is a layout diagram of the active layer in FIG. 57, FIG. 60 is a layout diagram of the source-drain metal layer in FIG. 57, FIG. 61 is a layout diagram of the electrode layer in FIG. 57.

The repair method described in the embodiment of the present disclosure is applied to the above-mentioned display substrate; the repair method includes:

When the previous c stages of driving circuits included in the driving module in the display substrate are cut off, controlling, by the control switch, to connect the connection line and the input cascade line;

The input cascade line is electrically connected to the input terminal of the (c+k)th stage of driving circuit; both c and k are positive integers.

In specific implementation, when the first c stages of driving circuits included in the driving module are cut off, the control switch controls to connect the connection line and the input cascade line, so that the start voltage line is connected to the input terminal of the (c+k)th stage of driving circuit.

In at least one embodiment of the present disclosure, the control switch includes a control line and a control module, the control line includes a first control line and a second control line, and the control module includes at least one control sub-module, so the control sub-module includes a first control circuit and a second control circuit;

The repair methods include:

When the first c stages of driving circuits included in the driving module in the display substrate are cut off, the connection line close to the (c+p)th stage of driving circuit being used to transmit the start voltage signal; disconnecting the first control line between the first control circuit corresponding to the (c+p)th stage of driving circuit from the first control circuit corresponding to the (c+p+1)th stage of driving circuit; disconnecting the second control line between the second control circuit corresponding to the (c+p)th stage of driving circuit from the second control circuit corresponding to the (c+p+1)th stage of driving circuit;

p is a positive integer greater than or equal to 1.

In at least one embodiment of the present disclosure, the control switch includes a control line and a control module, the control line includes a second control line, the control module includes at least one control sub-module, and the control sub-module includes a second control circuit;

The repair method includes: when the first c stages of driving circuits included in the driving module in the display substrate are cut off, the connection line close to the (c+p)th stage of driving circuit being used to transmit the start voltage signal; disconnecting the second control line between the second control circuit corresponding to the (c+p)th stage of driving circuit and the second control circuit corresponding to the (c+p+1) stage of driving circuit;

p is a positive integer greater than or equal to 1.

In at least one embodiment of the present disclosure, the control switch includes a control line and a control module, the control line includes a first control line, the control module includes at least one control sub-module, and the control sub-module includes a first control circuit;

The repair method includes: when the first c stages of driving circuits included in the driving module in the display substrate are cut off, the connection line close to the (c+p)th stage of driving circuit being used to transmit the start voltage signal; disconnecting the first control line between the first control circuit corresponding to the (c+p)th stage of driving circuit and the first control circuit corresponding to the (c+p+1)th stage of driving circuit;

p is a positive integer greater than or equal to 1.

The display device according to the embodiment of the present disclosure includes the above-mentioned display substrate.

The above descriptions are implementations of the present disclosure. It should be pointed out that those skilled in the art can make some improvements and modifications without departing from the principle of the present disclosure. These improvements and modifications shall also fall within the scope of the present disclosure.

What is claimed is:

1. A display substrate, comprising a base substrate and a driving module arranged on the base substrate; wherein the driving module includes a control switch and N cascaded driving circuits; each of the N cascaded driving circuits includes an input terminal; N is a positive integer;

input terminals of first k stages of driving circuits included in the driving module is electrically connected to a start voltage line; k is a positive integer;

an input terminal of an nth stage of driving circuit included in the driving module is electrically connected to an output terminal of an (n−m)th stage of driving circuit included in the driving module through an input cascade line; n and m are positive integers, and m is less than n;

the driving module further includes at least one connection line, the connection line extends along a first direction;

there is an overlapping area between an orthographic projection of the connection line on the base substrate and an orthographic projection of the start voltage line on the base substrate; and/or there is an overlapping area between the orthographic projection of the connection line on the base substrate and an orthographic projection of the input cascade line on the base substrate;

the control switch is electrically connected to the connection line.

2. The display substrate according to claim 1, wherein at least part of the connection line and the start voltage line are located on different layers, and at least part of the connection line and the input cascade line are located on different layers.

3. The display substrate according to claim 1, wherein the connection line is provided between two adjacent driving circuits of the N cascaded driving circuits; or the connection line penetrates at least part of at least one driving circuit of the N cascaded driving circuits.

4. The display substrate according to claim 1, wherein the driving module includes a plurality of clock signal lines, the N cascaded driving circuits and a line collection portion; each of the N cascaded driving circuits includes a first driving circuit portion and a second driving circuit portion;

the plurality of clock signal lines, the first driving circuit portion, the line collection portion and the second driving circuit portion are arranged in sequence along a direction close to a display area;

the input cascade line is provided in the line collection portion;

each of the N cascaded driving circuits includes the first driving circuit portion and the second driving circuit portion.

5. The display substrate according to claim 4, wherein the control switch includes a control line and a control module;

the control module is electrically connected to the control line, the start voltage line, the connection line and the line collection portion respectively, and is configured to control to connect or disconnect the connection line and the line collection portion under the control of a control signal provided by the control line;

there is an overlapping area between the orthographic projection of the connection line on the base substrate and the orthographic projection of the line collection portion on the base substrate.

6. The display substrate according to claim 5, wherein the control module is electrically connected to the input cascade line in the line collection portion; the control module includes at least one control sub-module;

a control sub-module corresponding to the nth stage of driving circuit included in the driving module is electrically connected to an input terminal of the (n+j)th stage of driving circuit through the input cascade line; j is a positive integer.

7. The display substrate according to claim 6, wherein the control line includes a first control line and a second control line, and the control sub-module includes a first control circuit and a second control circuit;

the first control circuit is electrically connected to the first control line, the start voltage line and the connection line respectively, and is configured to control to connect or disconnect the start voltage line and the connection line under the control of a first control signal provided by the first control line;

the second control circuit is electrically connected to the second control line, the connection line and the input cascade line respectively, and is configured to control to connect or disconnect the connection line and the input cascade line under the control of a second control signal provided by the second control line.

8. The display substrate according to claim 7, wherein the driving module includes a plurality of connection lines; each connection line of the plurality of connection lines is provided between two adjacent stages;

a first terminal of the connection line is electrically connected to the first control circuit, and a second terminal of the connection line is electrically connected to the second control circuit; the first terminal and the second terminal are opposite terminals.

9. The display substrate according to claim 8, wherein the first control circuit includes a first control transistor, and the second control circuit includes a second control transistor;

a gate electrode of the first control transistor is electrically connected to a first electrode of the first control transistor, the gate electrode of the first control transistor is electrically connected to the first control line, and the first electrode of the first control transistor is electrically connected to the first terminal of the connection line, and a second electrode of the first control transistor is electrically connected to the start voltage line;

a gate electrode of the second control transistor is electrically connected to the second control line, a first electrode of the second control transistor is electrically connected to the second terminal of the connection line, and a second electrode of the second control transistor is electrically connected to the input cascade line.

10. The display substrate according to claim 7, wherein the first control circuit includes a first control transistor, and the second control circuit includes a second control transistor;

a gate electrode of the first control transistor is electrically connected to the first control line, a first electrode of the first control transistor is electrically connected to a first terminal of the connection line, and a second electrode of the first control transistor is electrically connected to the start voltage line;

a gate electrode of the second control transistor is electrically connected to the second control line, a first electrode of the second control transistor is electrically connected to a second terminal of the connection line, and a second electrode of the second control transistor is electrically connected to the input cascade line.

11. The display substrate according to claim 6, wherein the control line includes a second control line, and the control sub-module includes a first control circuit and a second control circuit;

the connection line is electrically connected to the start voltage line;

the second control circuit is electrically connected to the second control line, the connection line and the input cascade line respectively, and is configured to control to connect or disconnect the connection line and the input cascade line under the control of a second control signal provided by the second control line, wherein the driving module includes a plurality of connection lines; each connection line of the plurality of connection lines is provided between two adjacent stages;

a first terminal of each connection line of the plurality of connection lines is electrically connected to the start voltage line, and a second terminal of each connection line of the plurality of connection lines is electrically connected to the second control circuit; the first terminal and the second terminal are opposite terminals, wherein the first control circuit includes a first control transistor, and the second control circuit includes a second control transistor;

a gate electrode of the second control transistor is electrically connected to the second control line, a first electrode of the second control transistor is electrically connected to the second terminal of the connection line, and a second electrode of the second control transistor is electrically connected to the input cascade line.

12. The display substrate according to claim 6, wherein the control line includes a first control line, and the control sub-module includes a first control circuit;

the first control circuit is electrically connected to the first control line, the start voltage line and the connection line respectively, and is configured to control to connect or disconnect the connection line and the start voltage line under the control of a first control signal provided by the first control line;

the connection line is electrically connected to the input cascade line, the driving module includes a plurality of connection lines; each connection line of the plurality of connection lines is provided between two adjacent stages;

a first terminal of each connection line of the plurality of connection lines is electrically connected to the first control circuit, and a second terminal of each connection line of the plurality of connection lines is electrically connected to the input cascade line; the first terminal and the second terminal are opposite terminals, the first control circuit includes a first control transistor;

a gate electrode of the first control transistor is electrically connected to the first control line, a first electrode of the first control transistor is electrically connected to the start voltage line, and a second electrode of the first control transistor is electrically connected to the first terminal of the connection line.

13. The display substrate according to claim 4, wherein the connection line included in the driving module penetrates the clock signal line included in the driving circuit, the first driving circuit portion and the line collection portion in a direction from away from the display area to close to the display area.

14. The display substrate according to claim 4, wherein the display substrate includes a first metal layer and an electrode layer sequentially arranged in a direction away from the base substrate;

the connection line includes a first line portion formed on the electrode layer and a second line portion formed on the first metal layer; the first line portion and the second line portion are electrically connected;

at least part of the first line portion is provided in a clock signal line area, the first driving circuit portion and the line collection portion; the clock signal line area is an area where the plurality of clock signal lines are provided;

at least part of the second line portion is provided on the line collection portion.

15. The display substrate according to claim 1, wherein at least one driving circuit of the N cascaded driving circuits includes an input circuit; the input circuit includes a control terminal, a first terminal and a second terminal;

the control terminal of the input circuit is electrically connected to an input terminal of a corresponding driving circuit of the N cascaded driving circuits, and the second terminal of the input circuit is electrically connected to a pull-up node;

the input circuit is configured to control a potential of the pull-up node under the control of an input signal provided by the input terminal, wherein the input circuit includes a first transistor;

a gate electrode of the first transistor is electrically connected to a first input terminal, a first electrode of the first transistor is electrically connected to a second input terminal, and a second electrode of the first transistor is electrically connected to the pull-up node;

the first input terminal and the second input terminal are electrically connected or not electrically connected, the gate electrode of the first transistor is formed on a second metal layer, and the first electrode of the first transistor is formed on a first metal layer;

the gate electrode of the first transistor is electrically connected to a first connection line portion formed on the second metal layer;

the first electrode of the first transistor is electrically connected to a second connection line portion formed in the second metal layer through a via hole;

at least one connection line of the driving module includes a third connection line portion formed on an electrode layer and a fourth connection line portion formed on the first metal layer; the third connection line portion and the fourth connection line portion are electrically connected;

there is an overlapping area between an orthographic projection of the third connection line portion on the base substrate and an orthographic projection of the first connection line portion on the base substrate; there is an overlapping area between an orthographic projection of the fourth connection line portion on the base substrate and an orthographic projection of the second connection line portion on the base substrate, wherein the display substrate further comprises a fifth connection line portion and a sixth connection line portion;

the fifth connection line portion is formed on the electrode layer, and the fifth connection line portion is connected to the third connection line portion;

the sixth connection line portion is formed on the first metal layer, and the sixth connection line portion is connected to the fourth connection line portion;

the fifth connection line portion and the sixth connection line portion are electrically connected.

16. The display substrate according to claim 1, wherein at least one driving circuit of the N cascaded driving circuits includes a first driving circuit portion; the first driving circuit portion includes an input circuit, a pull-up node control circuit, a first pull-down node control circuit, a second pull-down node control circuit and a reset circuit;

the input circuit is configured to control a potential of a pull-up node under the control of an input signal provided by an input terminal of a corresponding driving circuit of the N cascaded driving circuits;

the pull-up node control circuit is configured to control the potential of the pull-up node;

the first pull-down node control circuit is configured to control a potential of a first pull-down node;

the second pull-down node control circuit is configured to control a potential of a second pull-down node;

the reset circuit is configured to reset a driving signal provided by a driving signal output terminal of a current stage under the control of the potential of the first pull-down node and the potential of the second pull-down node.

17. A manufacturing method, applied to the display substrate according to claim 1, comprising:

when previous c stages of driving circuits included in the driving module in the display substrate are cut off, controlling, by the control switch, to connect the connection line and the input cascade line;

wherein the input cascade line is electrically connected to an input terminal of a (c+k)th stage of driving circuit; both c and k are positive integers.

18. The manufacturing method according to claim 17, wherein the control switch includes a control module and a control line;

the control line includes a first control line and the second control line, the control module includes at least one control sub-module, the control sub-module includes a first control circuit and a second control circuit;

the repairing method includes:

when the first c stages of driving circuits included in the driving module in the display substrate are cut off, a connection line close to the (c+p)th stage of driving circuit being used to transmit the start voltage signal; disconnecting a first control line between a first control circuit corresponding to a (c+p)th stage of driving circuit from a first control circuit corresponding to a (c+p+1)th stage of driving circuit; disconnecting the second control line between the second control circuit corresponding to the (c+p)th stage of driving circuit from the second control circuit corresponding to the (c+p+1)th stage of driving circuit;

p is a positive integer greater than or equal to 1;

or the control switch includes a control module and a control line; the control line includes a second control line, and the control module includes at least one control sub-module, the control sub-module includes a second control circuit;

the repair method includes: when the first c stages of driving circuits included in the driving module in the display substrate are cut off, the connection line close to the (c+p)th stage of driving circuit being used to transmit the start voltage signal; disconnecting the second control line between the second control circuit corresponding to the (c+p)th stage of driving circuit and the second control circuit corresponding to the (c+p+1)th stage of driving circuit;

p is a positive integer greater than or equal to 1;

or the control switch includes a control module and a control line; the control line includes a first control line, and the control module includes at least one control sub-module, the control sub-module includes a first control circuit;

the repair method includes: when the first c stages of driving circuits included in the driving module in the display substrate are cut off, the connection line close to the (c+p)th stage of driving circuit being used to transmit the start voltage signal; disconnecting the first control line between the first control circuit corresponding to the (c+p)th stage of driving circuit and the first control circuit corresponding to the (c+p+1)th stage of driving circuit;

p is a positive integer greater than or equal to 1.

19. A display device, comprising the display substrate according to claim 1.

20. A display substrate, comprising a base substrate and a driving module arranged on the base substrate; wherein the driving module includes N cascaded driving circuits; each of the N cascaded driving circuits includes an input terminal; N is a positive integer;

input terminals of first k stages of driving circuits included in the driving module are electrically connected to a start voltage line; k is a positive integer;

an input terminal of an nth stage of driving circuit included in the driving module is electrically connected to an output terminal of the (n–m)th stage of driving circuit included in the driving module through an input cascade line; n and m are positive integers, and m is less than n;

the driving module also includes at least one connection line, the connection line extends along a first direction;

there is an overlapping area between an orthographic projection of the connection line on the base substrate and an orthographic projection of the start voltage line on the base substrate; and/or there is an overlap area between the orthographic projection of the connection line on the base substrate and an orthographic projection of the input cascade line on the base substrate.

* * * * *